US011942152B2

(12) United States Patent
Okajima et al.

(10) Patent No.: US 11,942,152 B2
(45) Date of Patent: Mar. 26, 2024

(54) FUZZY STRING SEARCH CIRCUIT

(71) Applicant: Yoshinori Okajima, Tokyo (JP)

(72) Inventors: Yoshinori Okajima, Tokyo (JP); Mariko Okajima, Tokyo (JP)

(73) Assignee: Yoshinori Okajima, Tokyo (JP)

( * ) Notice: Subject to any disclaimer, the term of this patent is extended or adjusted under 35 U.S.C. 154(b) by 0 days.

(21) Appl. No.: 17/958,898

(22) Filed: Oct. 3, 2022

(65) Prior Publication Data

US 2023/0073272 A1 Mar. 9, 2023

Related U.S. Application Data

(63) Continuation of application No. PCT/JP2020/015100, filed on Apr. 1, 2020.

(51) Int. Cl.
*G11C 15/04* (2006.01)
*G11C 7/10* (2006.01)
*G11C 7/22* (2006.01)

(52) U.S. Cl.
CPC ............ *G11C 15/04* (2013.01); *G11C 7/1063* (2013.01); *G11C 7/1069* (2013.01); *G11C 7/22* (2013.01)

(58) Field of Classification Search
CPC ..... G11C 15/04; G11C 7/1063; G11C 7/1069; G11C 7/22; G11C 13/0002; G11C 15/046; G11C 11/54; G11C 16/0416; G06N 3/063
See application file for complete search history.

(56) References Cited

U.S. PATENT DOCUMENTS

| 4,956,564 A | 9/1990 | Holler et al. |
| 5,131,073 A * | 7/1992 | Furuta ................... G06N 3/063 706/42 |
| 5,167,006 A | 11/1992 | Furuta et al. |

(Continued)

FOREIGN PATENT DOCUMENTS

| JP | H03-46195 | 2/1991 |
| JP | 103-256184 | 11/1991 |

(Continued)

OTHER PUBLICATIONS

WIPO, International Search Report in corresponding PCT application PCT/JP2020/015100, dated Jun. 23, 2020.

(Continued)

*Primary Examiner* — Ajay Ojha
(74) *Attorney, Agent, or Firm* — Ryan Alley IP

(57) ABSTRACT

There are increasing needs of searching on which data in a storage circuit is most similar to input information from the outside. Expectations for storage circuits having such memory techniques are high, and to enable a computer to handle information from the outside more flexibly is considered an essential technique. To achieve such techniques, a storage circuit needs to have a function of measuring a degree of similarity between stored data and input data. In an approximate-search-circuit, a memory matrix of a conventional storage circuit is caused to function as a data conversion circuit for calculating the inner-product distance between stored data and input data, by inputting the input data to the memory matrix in the form of a time series of pulse-signals, and the location of stored data with the highest inner-product is output from a circuit that calculates the inner-product in real time.

19 Claims, 30 Drawing Sheets

MATCHING-DEGREE-DETERMINATION-CIRCUIT #1,
ACCORDING TO FIRST EMBODIMENT

(56) References Cited

U.S. PATENT DOCUMENTS

| | | | |
|---|---|---|---|
| 5,256,911 A * | 10/1993 | Holler | G06N 3/063 |
| | | | 706/37 |
| 5,588,090 A * | 12/1996 | Furuta | G06N 3/049 |
| | | | 706/35 |
| 8,937,828 B2 | 1/2015 | Mattausch et al. | |
| 8,947,901 B2 | 2/2015 | Kishida | |
| 9,171,248 B2 | 10/2015 | Heliot et al. | |
| 10,192,162 B2 | 1/2019 | Thorson et al. | |
| 11,308,383 B2 | 4/2022 | Bayat et al. | |
| 2019/0318226 A1 | 10/2019 | Yang et al. | |

FOREIGN PATENT DOCUMENTS

| | | | |
|---|---|---|---|
| JP | H03-283193 | 12/1991 | |
| JP | H04-549 | 1/1992 | |
| JP | H04-336657 | 11/1992 | |
| JP | H05-81229 | 4/1993 | |
| JP | 2002-500790 | 1/2002 | |
| JP | 2014-504401 | 2/2014 | |
| JP | 5480986 | 4/2014 | |
| JP | 5800422 | 10/2015 | |
| JP | 5893465 | 3/2016 | |
| JP | 2019-517138 | 6/2019 | |
| JP | 2019-185784 | 10/2019 | |
| JP | 2020-017281 | 1/2020 | |
| WO | 98/54653 | 12/1998 | |
| WO | WO-9854653 A2 * | 12/1998 | G06N 3/063 |

OTHER PUBLICATIONS

WIPO, Translation of Written Opinion in corresponding PCT application PCT/JP2020/015100, dated Jun. 23, 2020.

Pagiamtzis et al., "Content-addressable memory (CAM) circuits and architectures: A tutorial and survey," IEEE J. Solid-State Circuits, vol. 41, No. 3, Mar. 2006, pp. 712727.

Mochizuki et al., "PATON: A dynamic neural network model of context dependent memory access," Japan Neural Network Society Journal vol. 3, No. 3 (1996), 81-89.

* cited by examiner

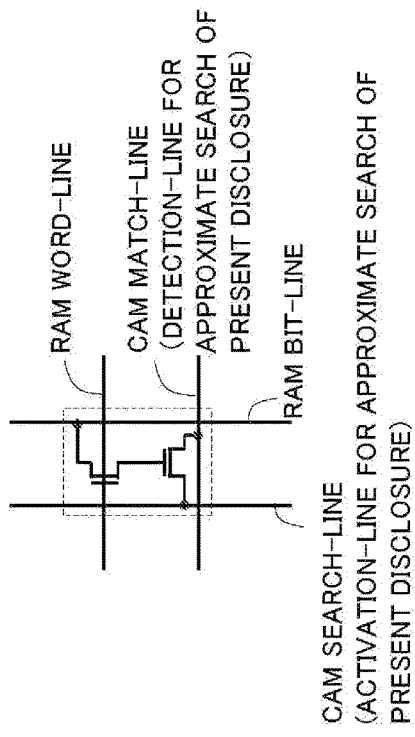
FIG. 1A; CAM-CELL USING SRAM (Related Art)
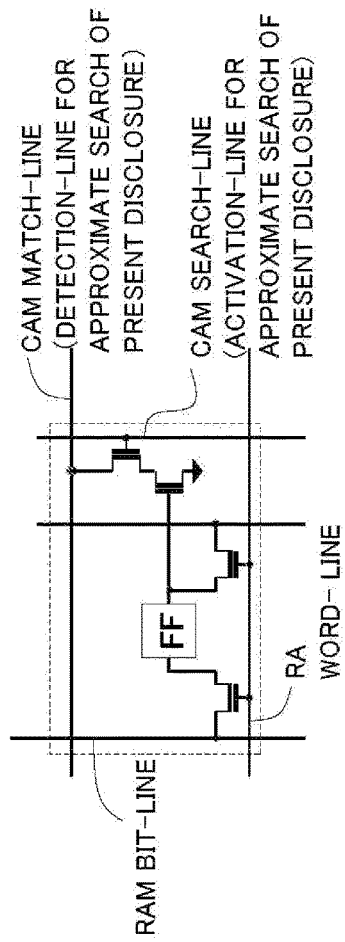
FIG. 1B; CAM-CELL USING 2T-DRAM (Related Art)
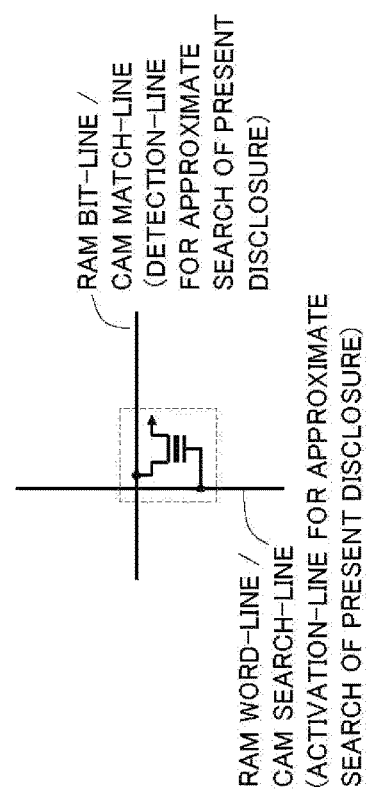
FIG. 1C; MEMORY-CELL USING VARIABLE RESISTANCE ELEMENT (Related Art)
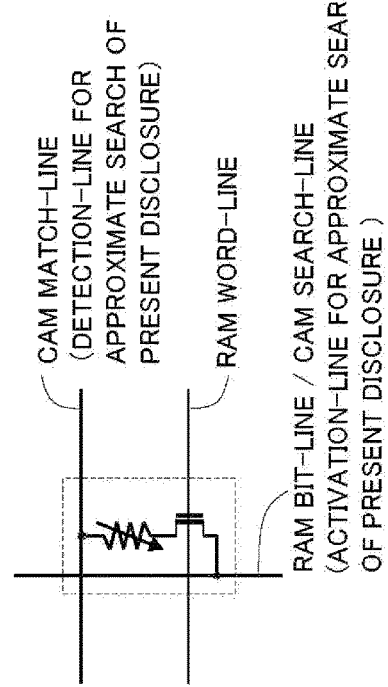
FIG. 1D; MEMORY-CELL USING Flash EEPROM-CELL (Related Art)

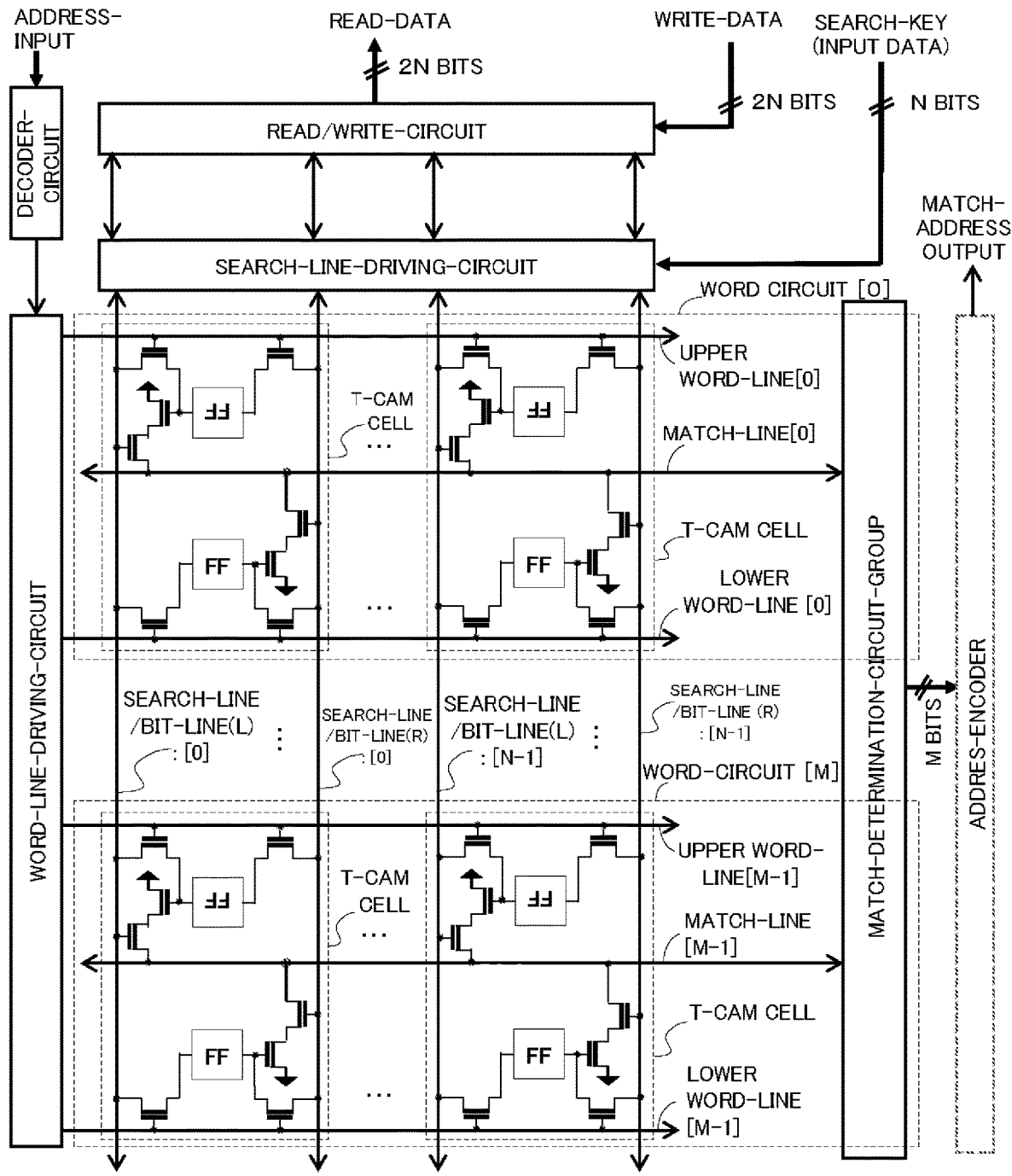
FIG. 2; CONVENTIONAL CAM CIRCUIT, Ternary-CAM (Related Art)

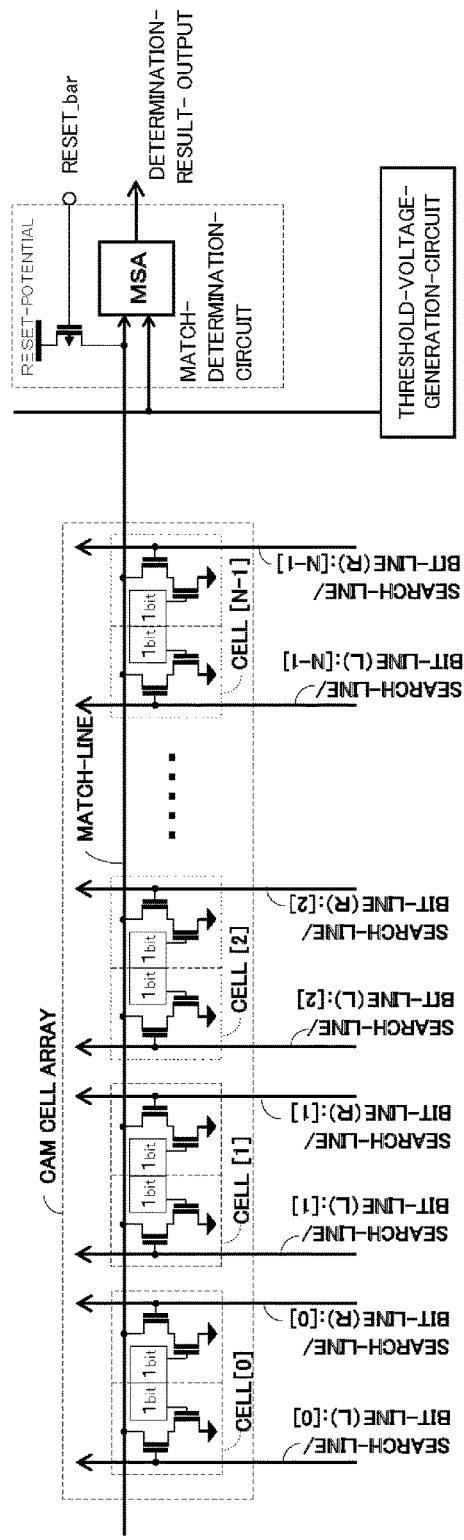
FIG. 3A: CONFIGURATION OF WORD-CIRCUIT (Related Art)
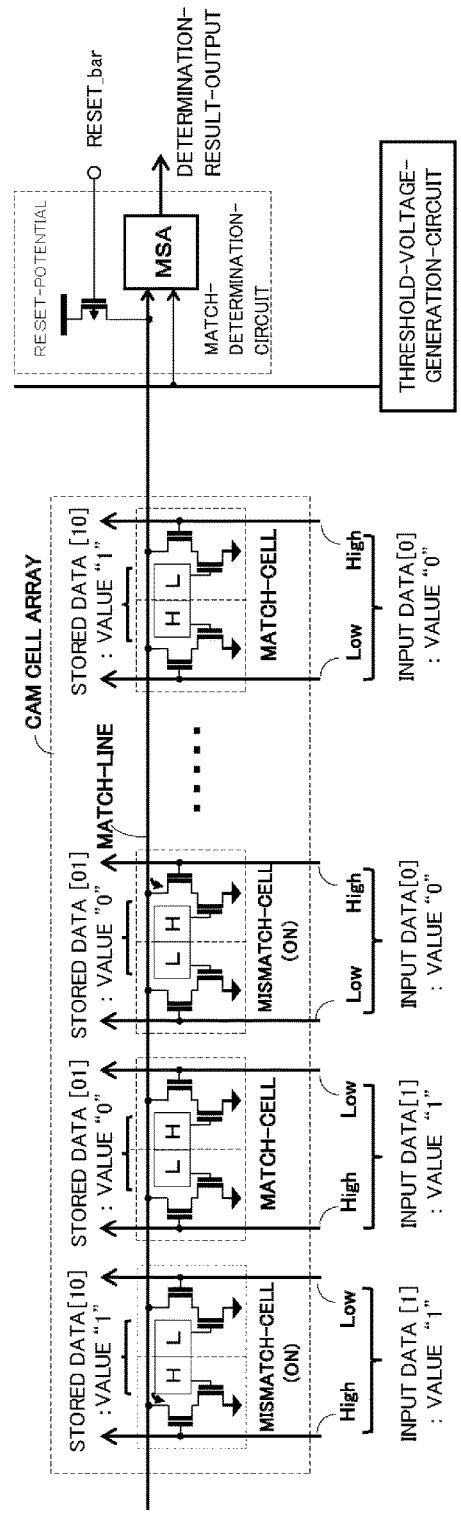
FIG. 3B: SEARCH OPERATION OF WORD-CIRCUIT (Related Art)

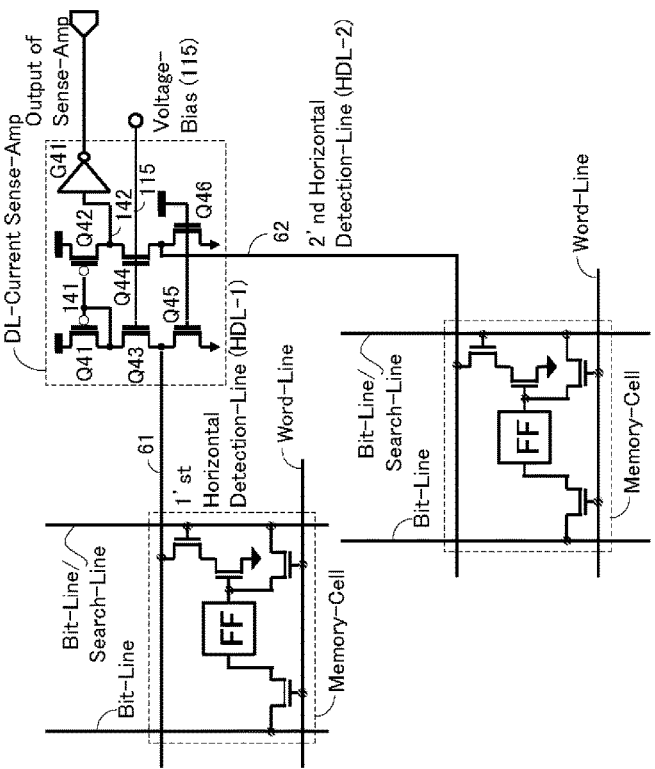
FIG. 4B EXAMPLE OF CONFIGURATION OF READ-CIRCUIT FOR Static CAM CELLS
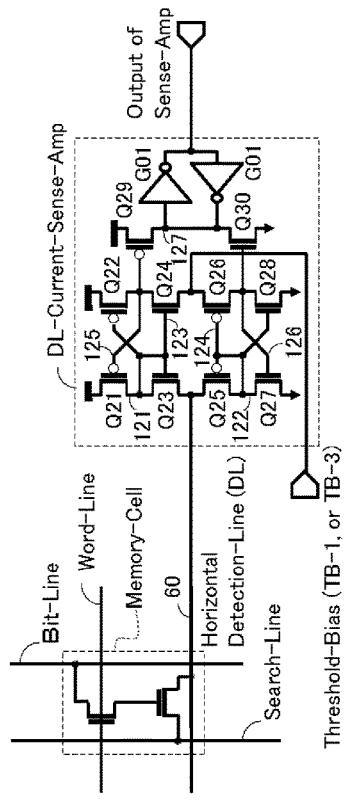
FIG. 4A; EXAMPLE OF CONFIGURATION OF READ-CIRCUIT FOR 2T-DRAM CELLS
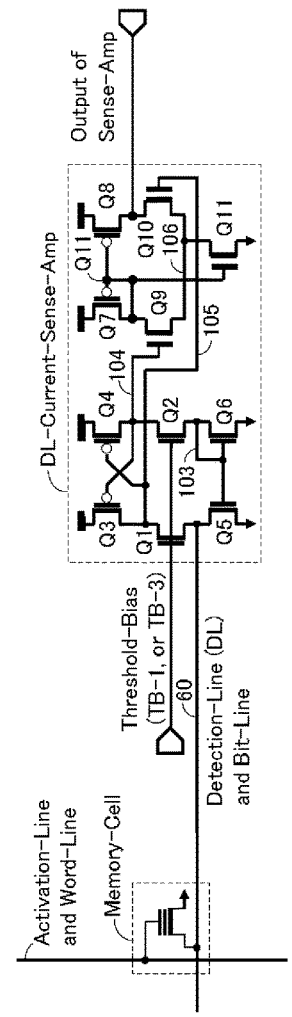
FIG. 4C; EXAMPLE OF CONFIGURATION OF READ-CIRCUIT UFOR Flash EEPROM CELLS

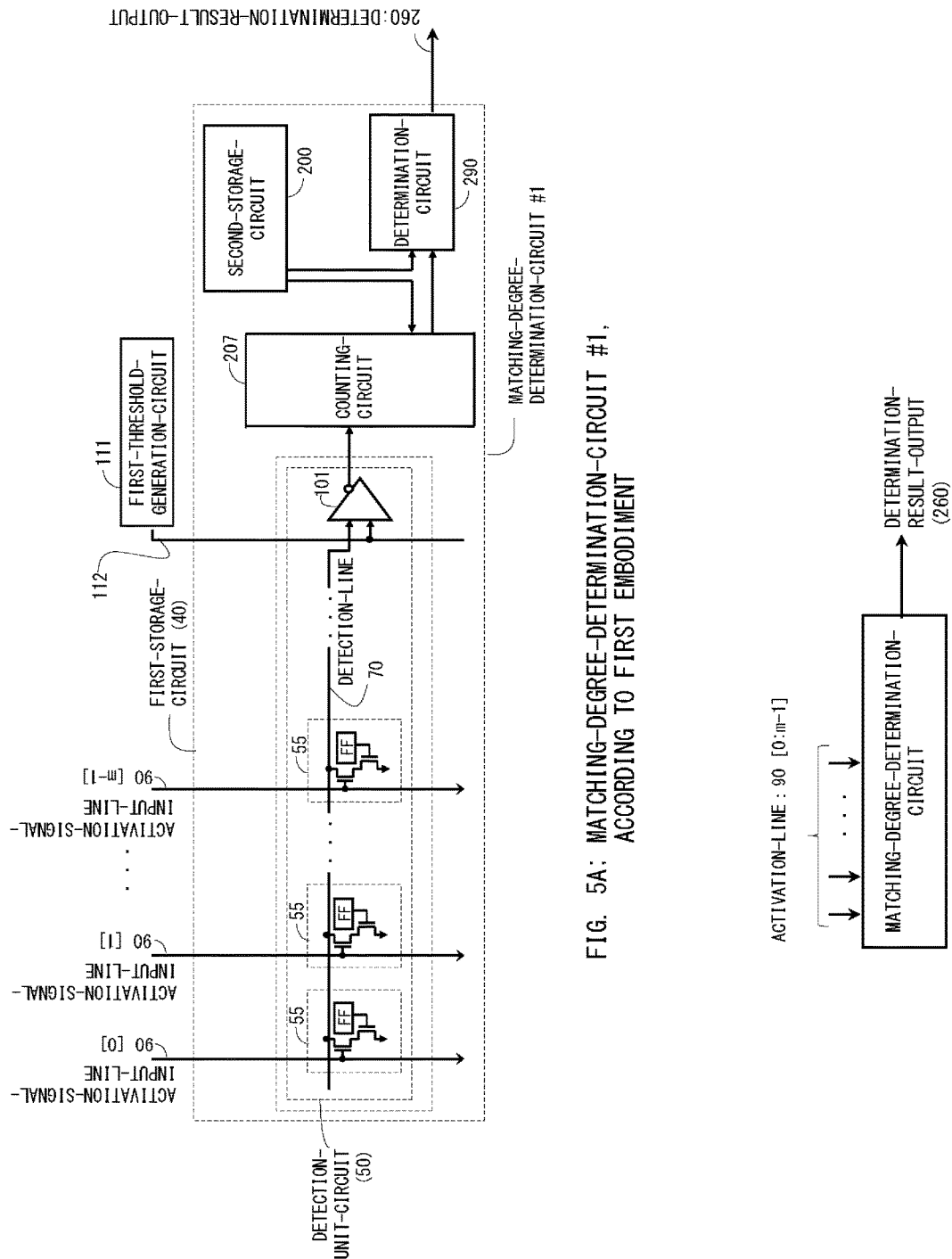
FIG. 5A: MATCHING-DEGREE-DETERMINATION-CIRCUIT #1, ACCORDING TO FIRST EMBODIMENT
FIG. 5B INPUT AND OUTPUT MODEL OF MATCHING-DEGREE-DETERMINATION-CIRCUIT

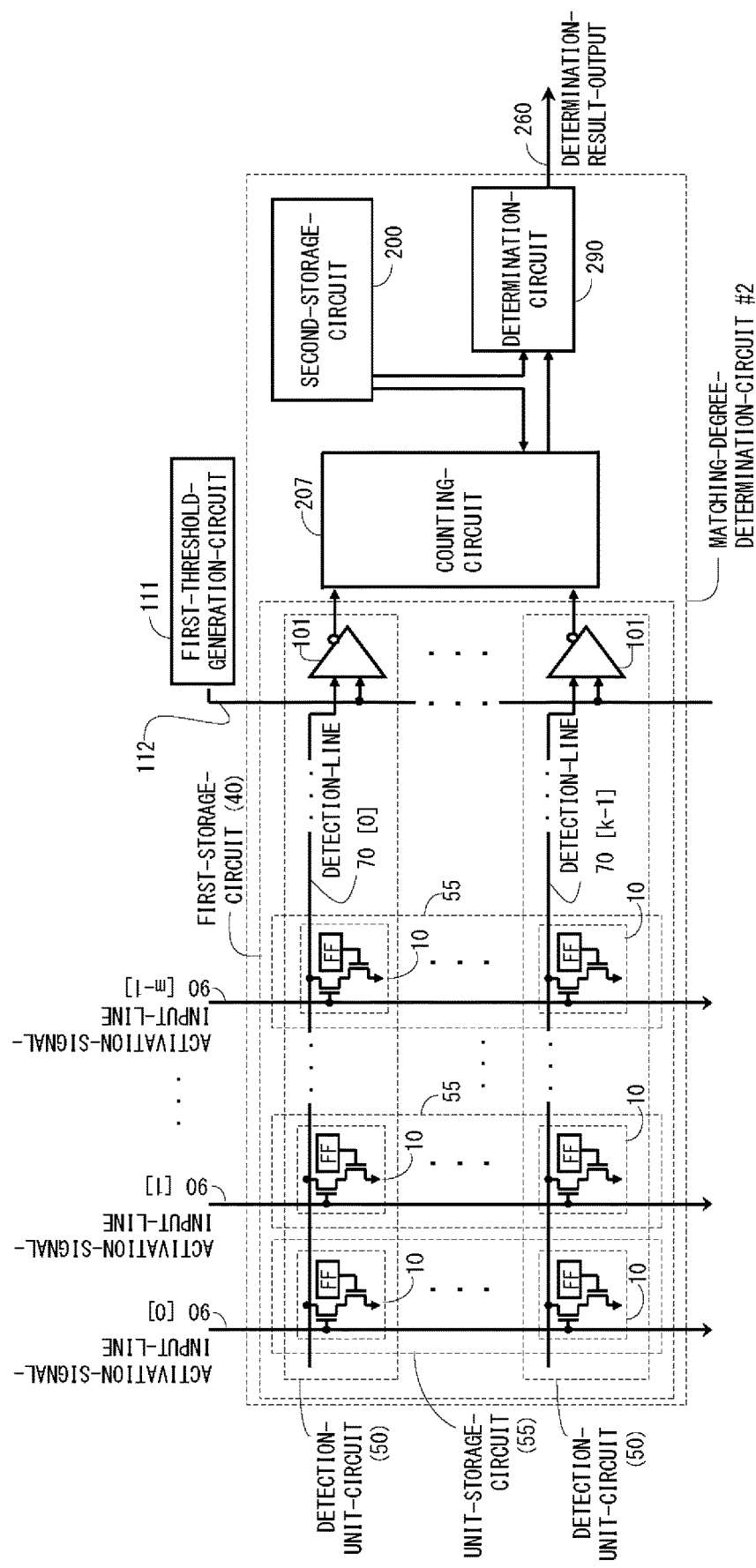
FIG. 6: MATCHING-DEGREE-DETERMINATION-CIRCUIT #2, ACCORDING TO SECOND EMBODIMENT

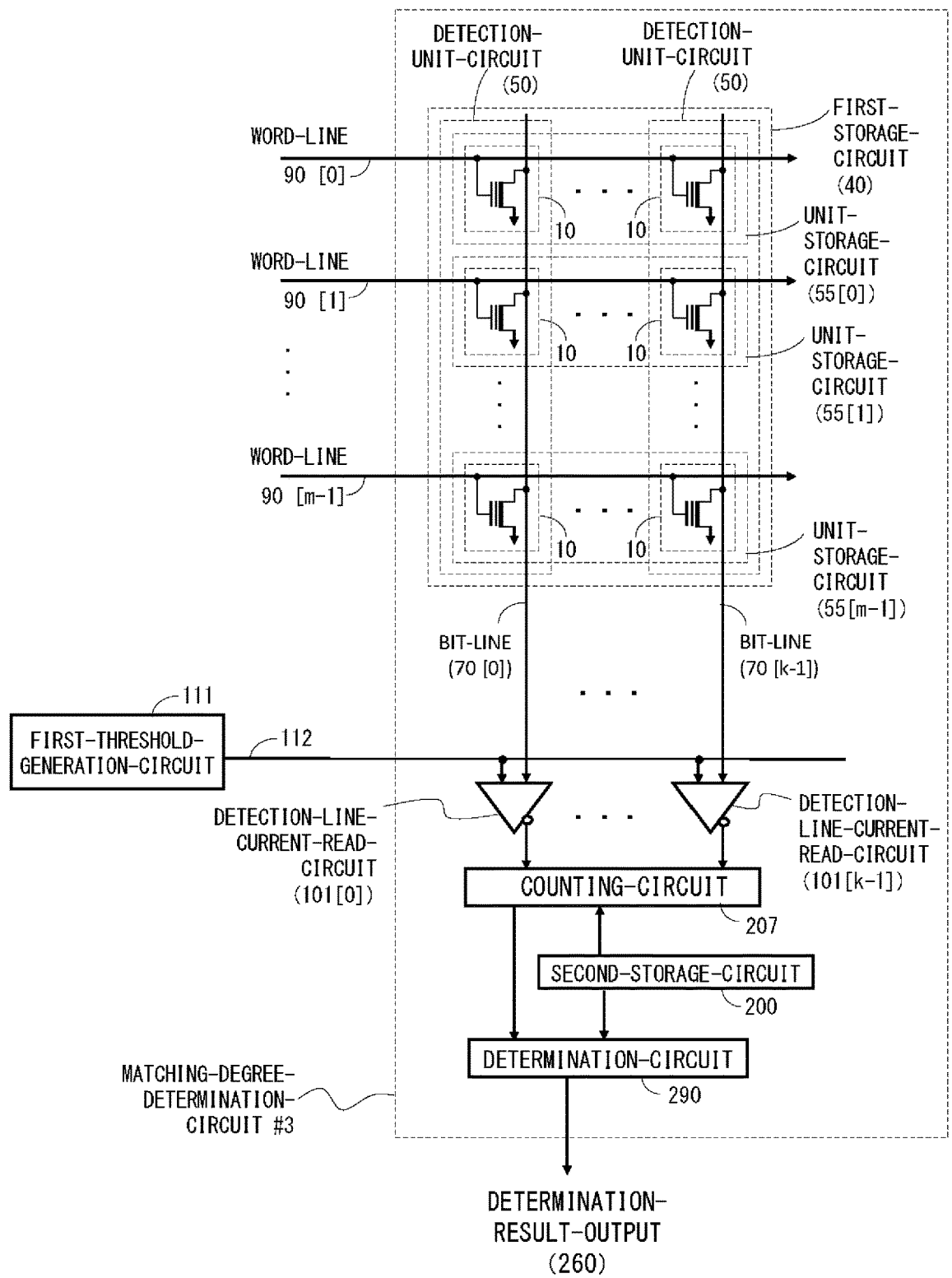
FIG. 7: MATCHING-DEGREE-DETERMINATION-CIRCUIT #3, ACCORDING TO THIRD EMBODIMENT

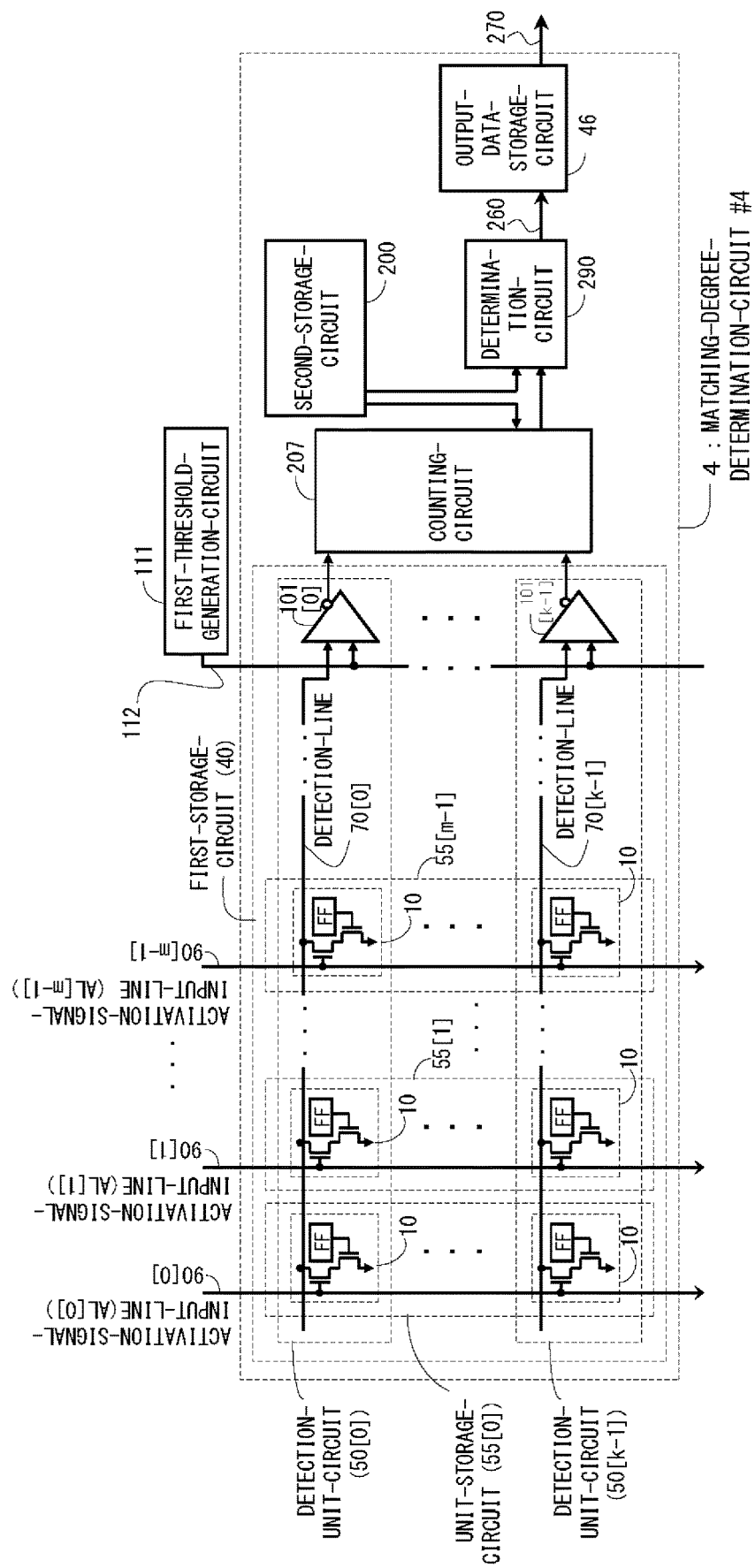
FIG. 8: MATCHING-DEGREE-DETERMINATION-CIRCUIT #4, ACCORDING TO FOURTH EMBODIMENT

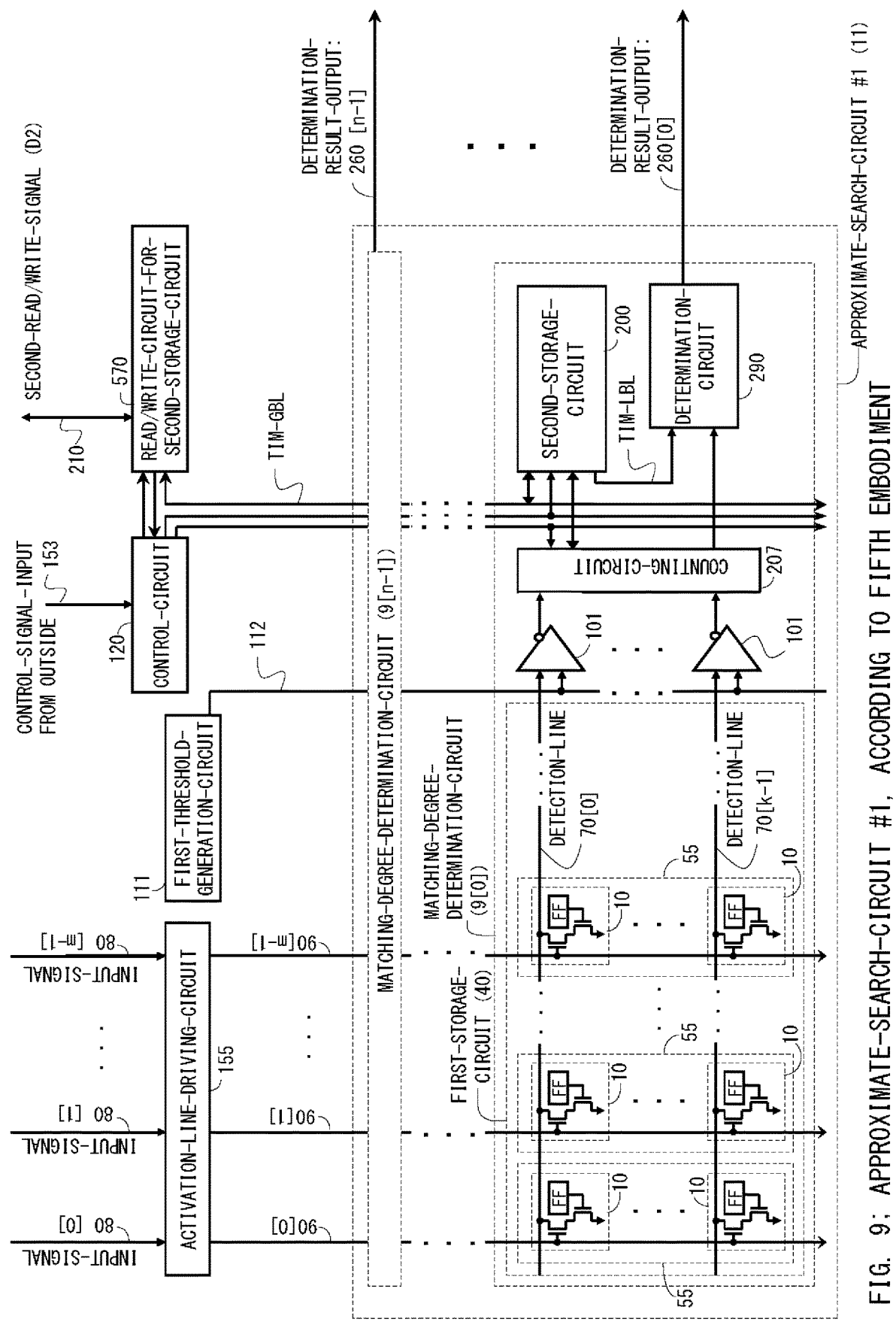
FIG. 9; APPROXIMATE-SEARCH-CIRCUIT #1, ACCORDING TO FIFTH EMBODIMENT

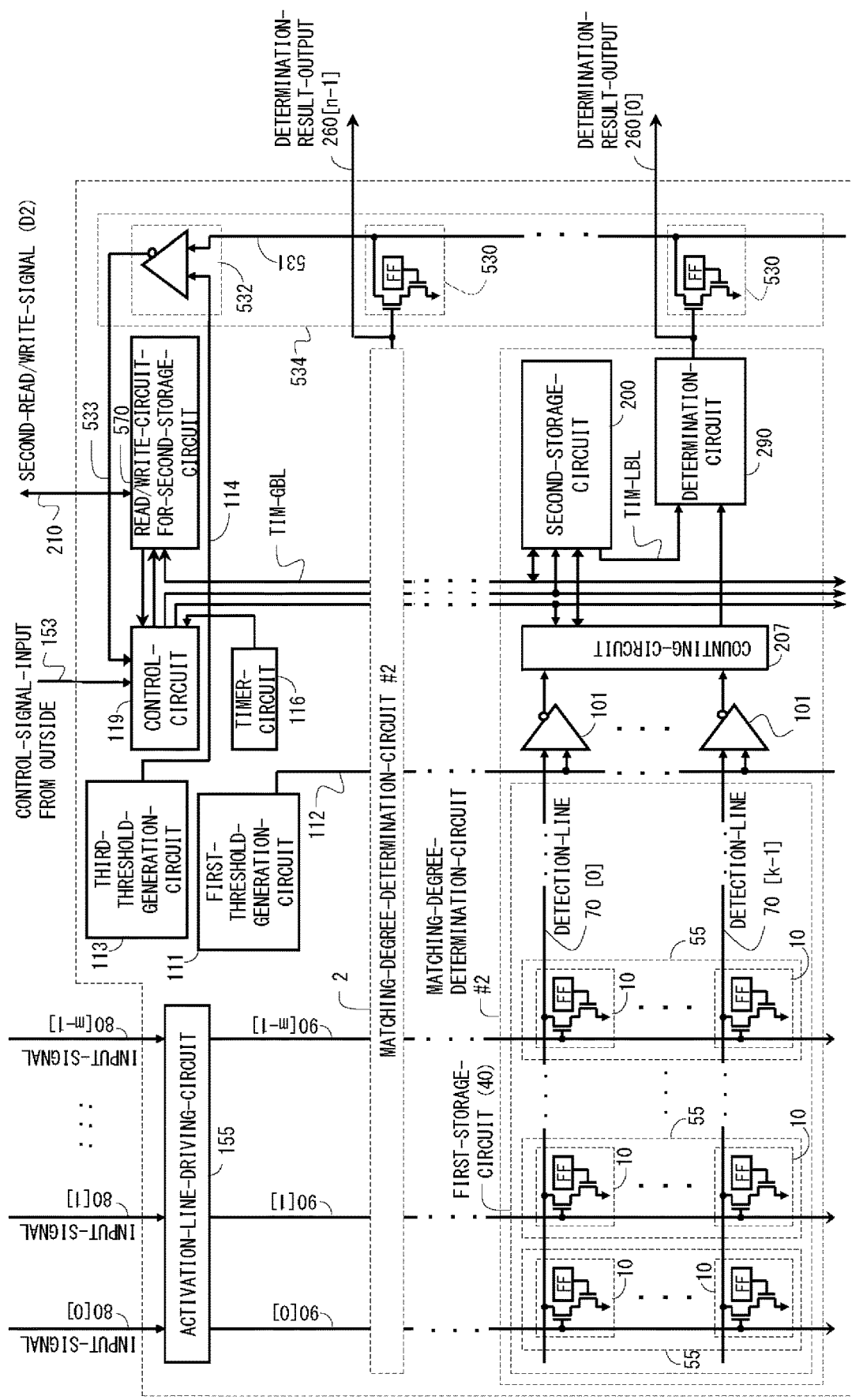
FIG. 10: APPROXIMATE-SEARCH-CIRCUIT #2, ACCORDING TO SIXTH EMBODIMENT

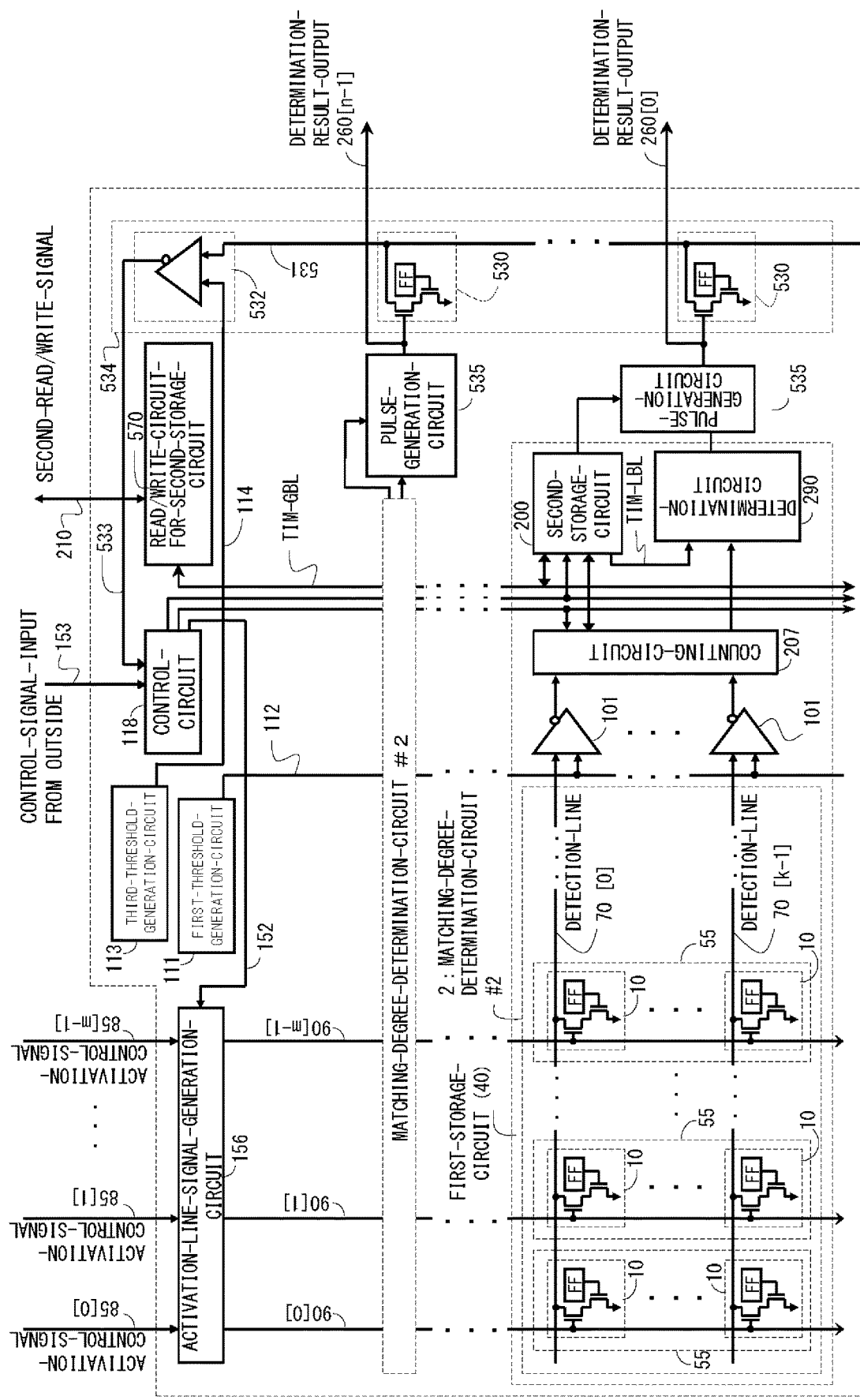
FIG. 11: APPROXIMATE-SEARCH-CIRCUIT #3, ACCORDING TO SEVENTH EMBODIMENT

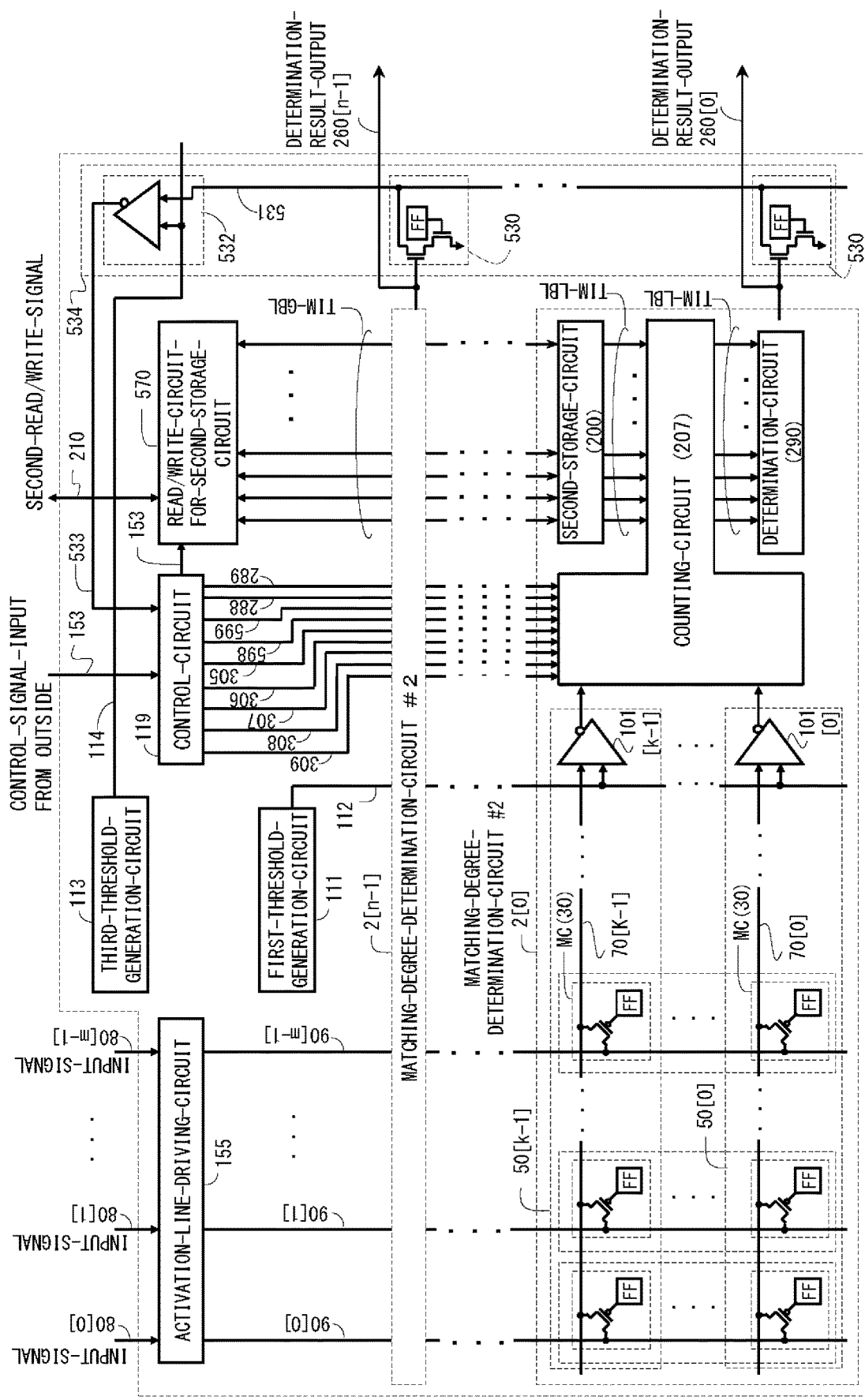
FIG. 12: APPROXIMATE-SEARCH-CIRCUIT #4, ACCORDING TO EIGHTH EMBODIMENT

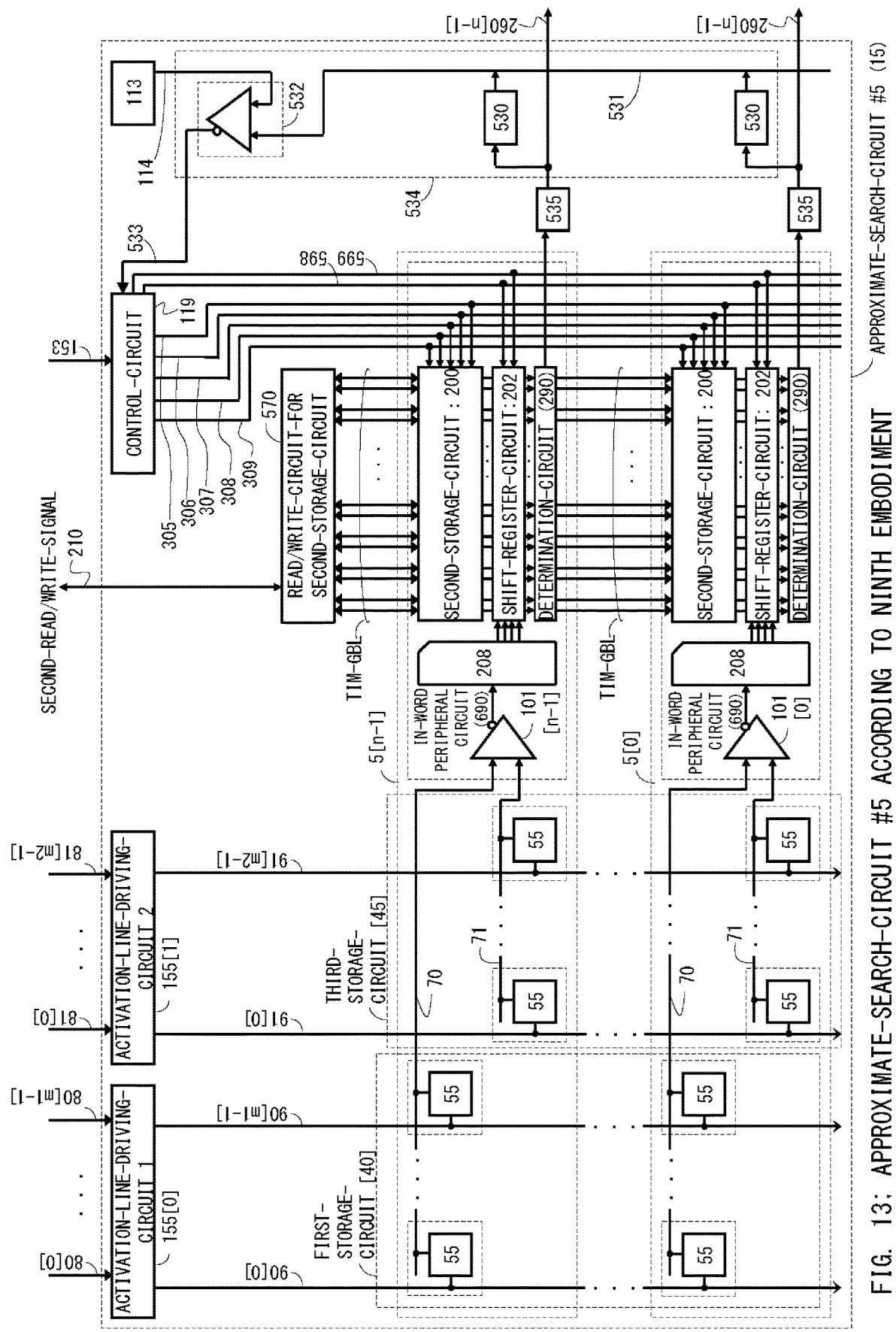
FIG. 13: APPROXIMATE-SEARCH-CIRCUIT #5 ACCORDING TO NINTH EMBODIMENT

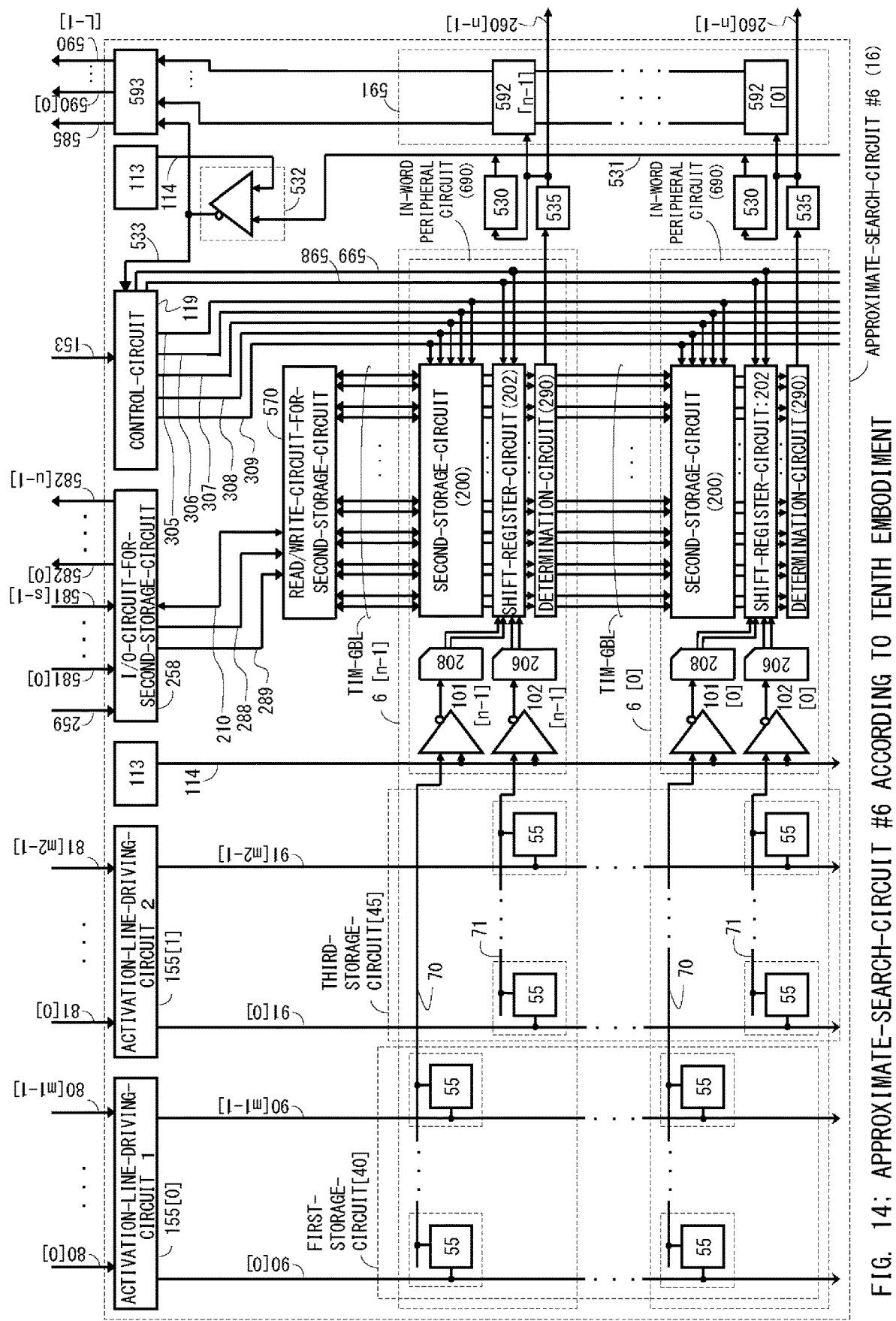
FIG. 14: APPROXIMATE-SEARCH-CIRCUIT #6 ACCORDING TO TENTH EMBODIMENT

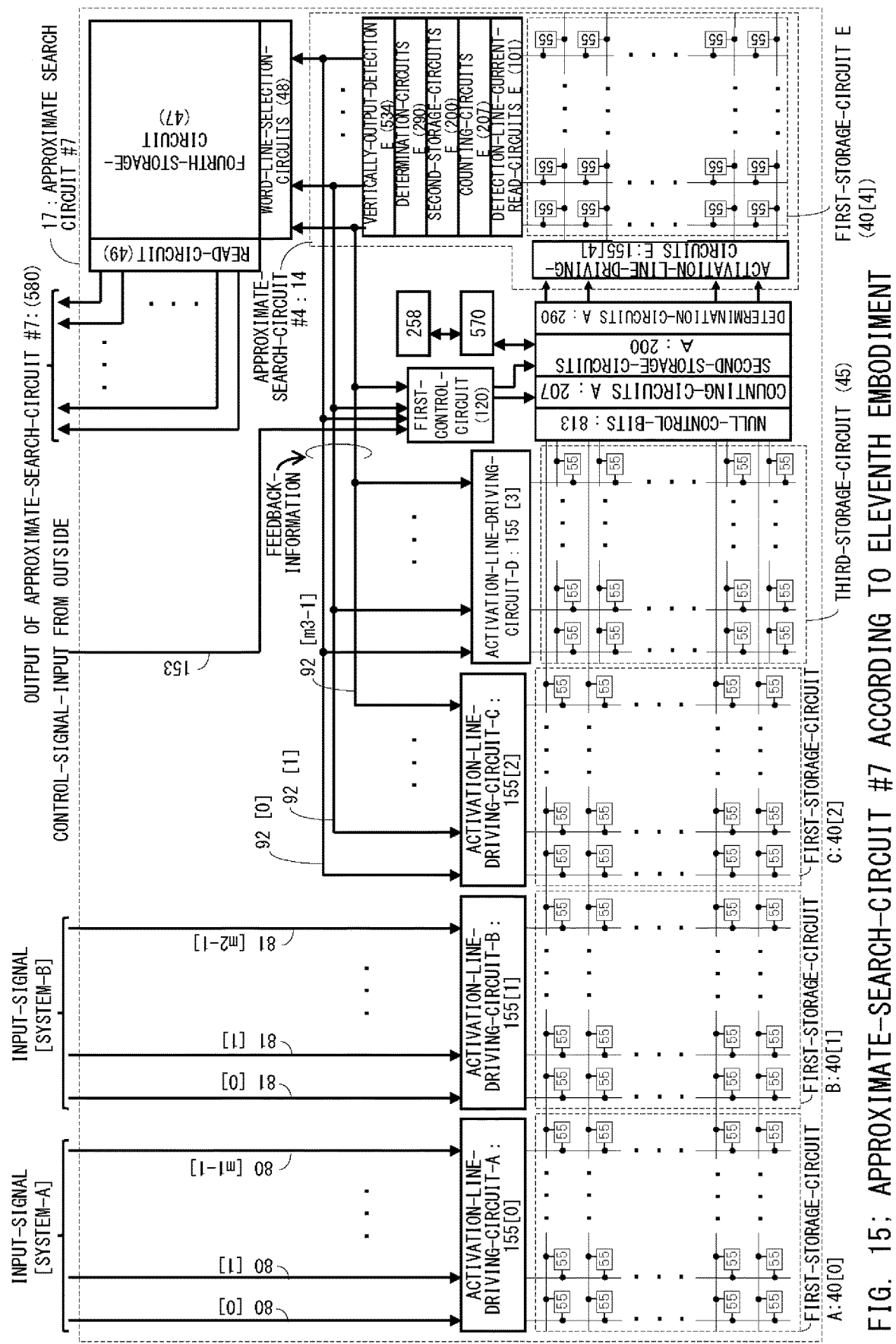
FIG. 15: APPROXIMATE-SEARCH-CIRCUIT #7 ACCORDING TO ELEVENTH EMBODIMENT

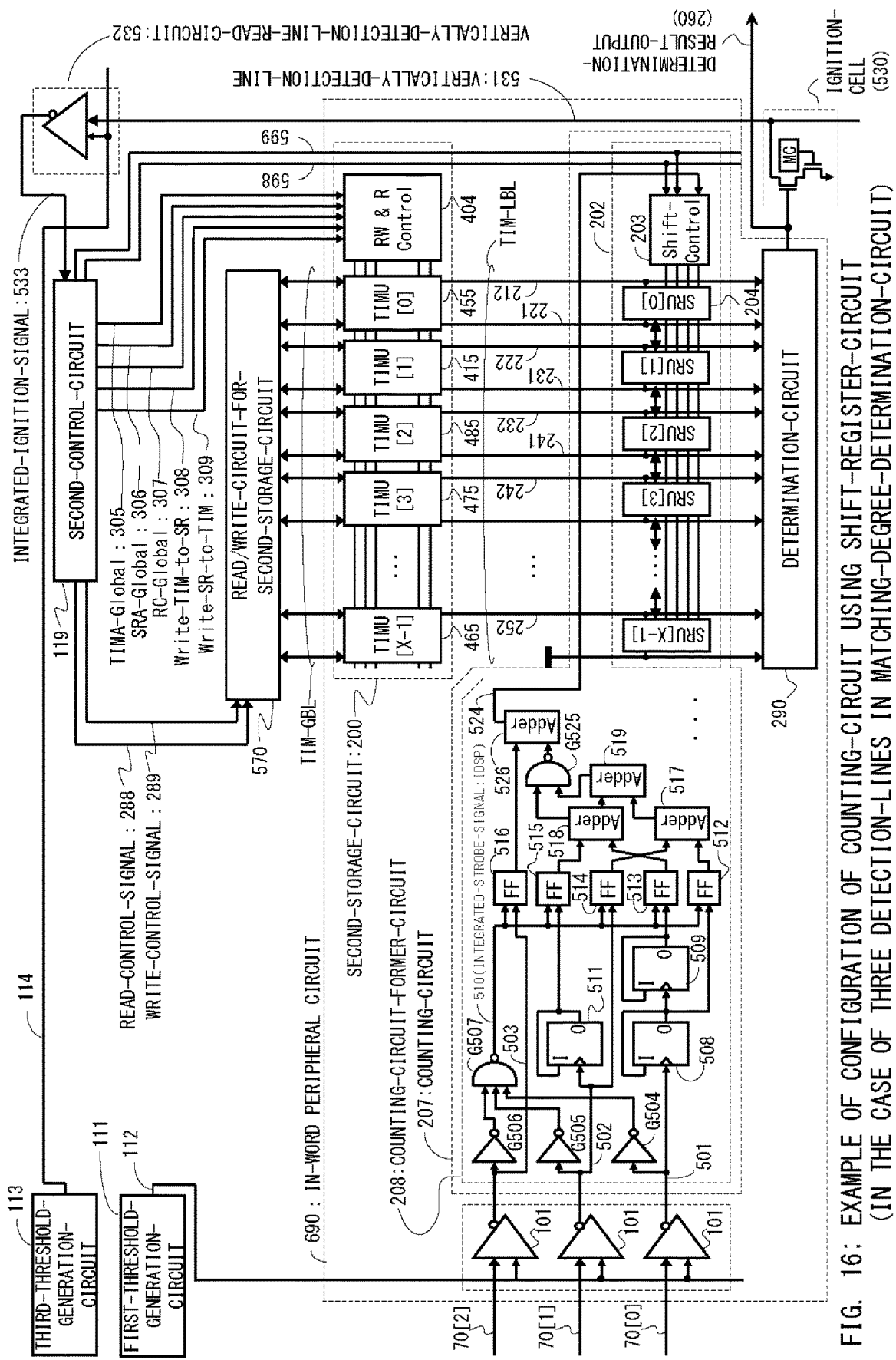
FIG. 16; EXAMPLE OF CONFIGURATION OF COUNTING-CIRCUIT USING SHIFT-REGISTER-CIRCUIT (IN THE CASE OF THREE DETECTION-LINES IN MATCHING-DEGREE-DETERMINATION-CIRCUIT)

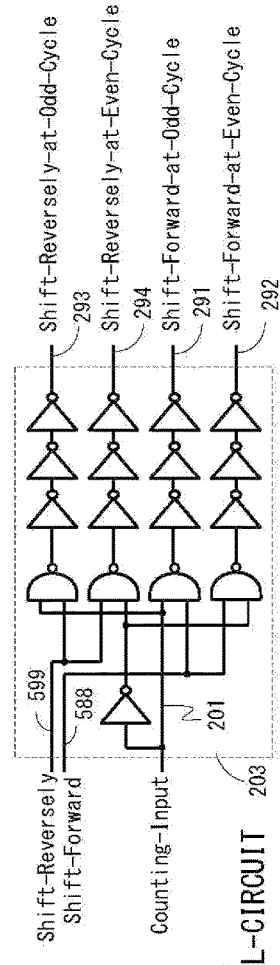
FIG. 17A EXAMPLE OF CONFIGURATION OF SHIFT-REGISTER-CONTROL-CIRCUIT
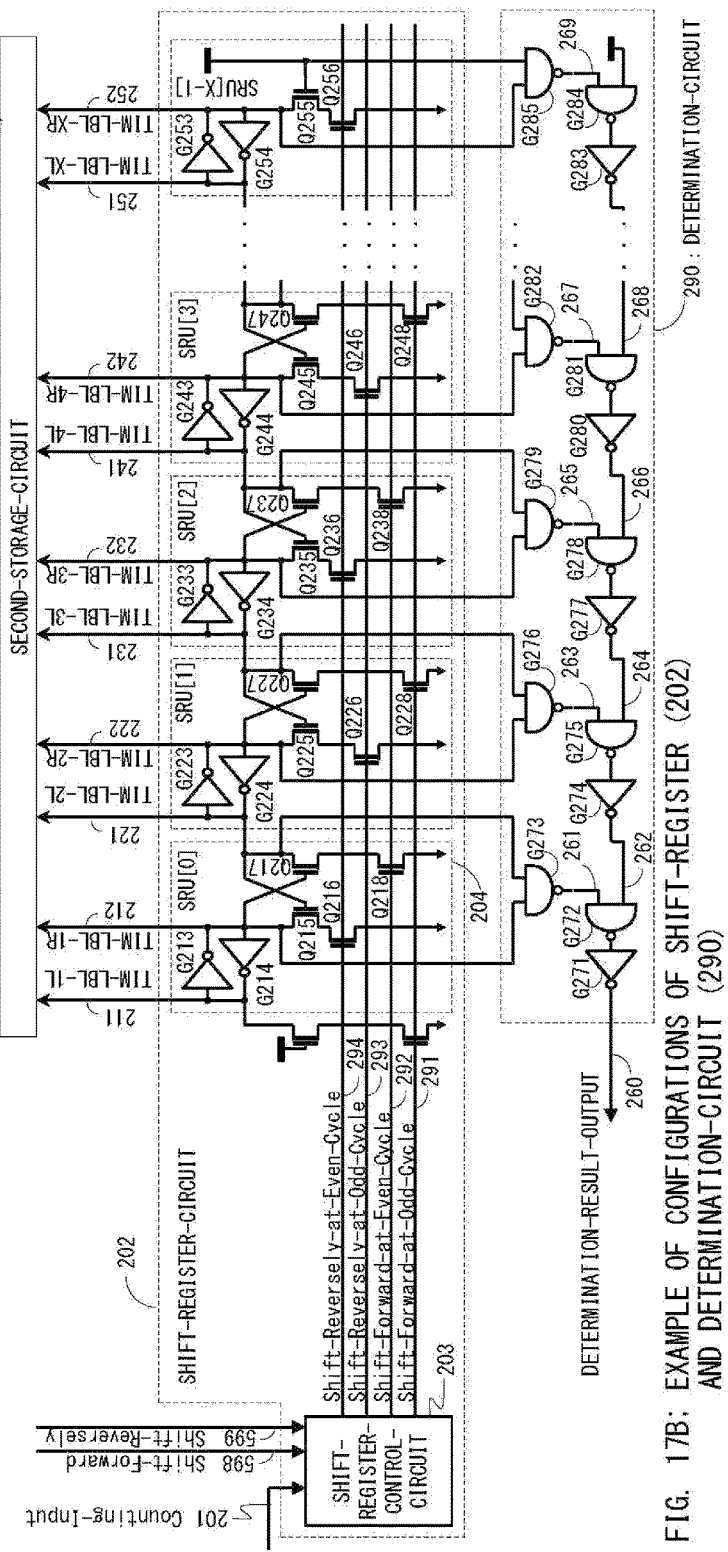
FIG. 17B: EXAMPLE OF CONFIGURATIONS OF SHIFT-REGISTER (202) AND DETERMINATION-CIRCUIT (290)

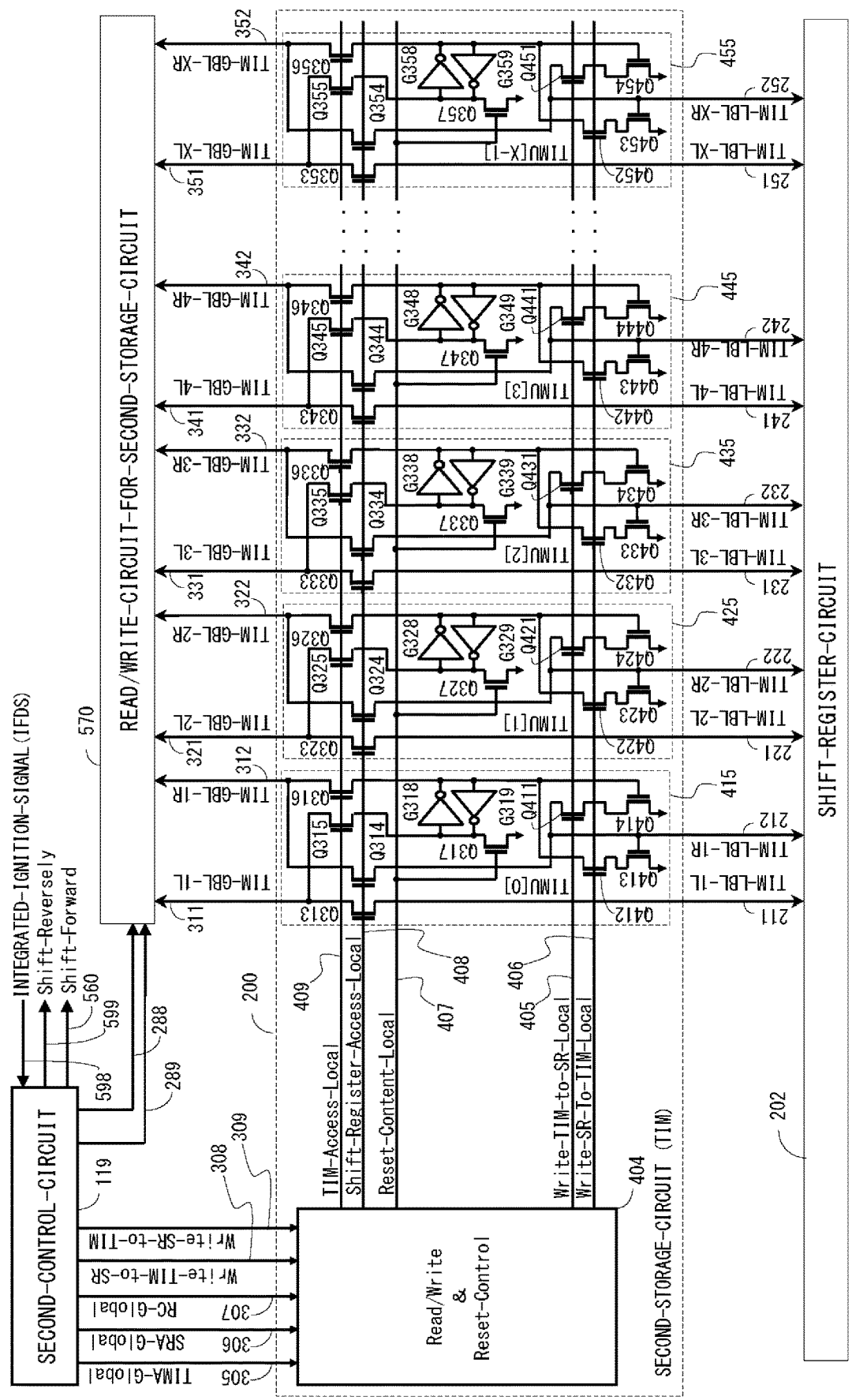
FIG. 18: EXAMPLE OF CONFIGURATION OF SECOND-STORAGE-CIRCUIT

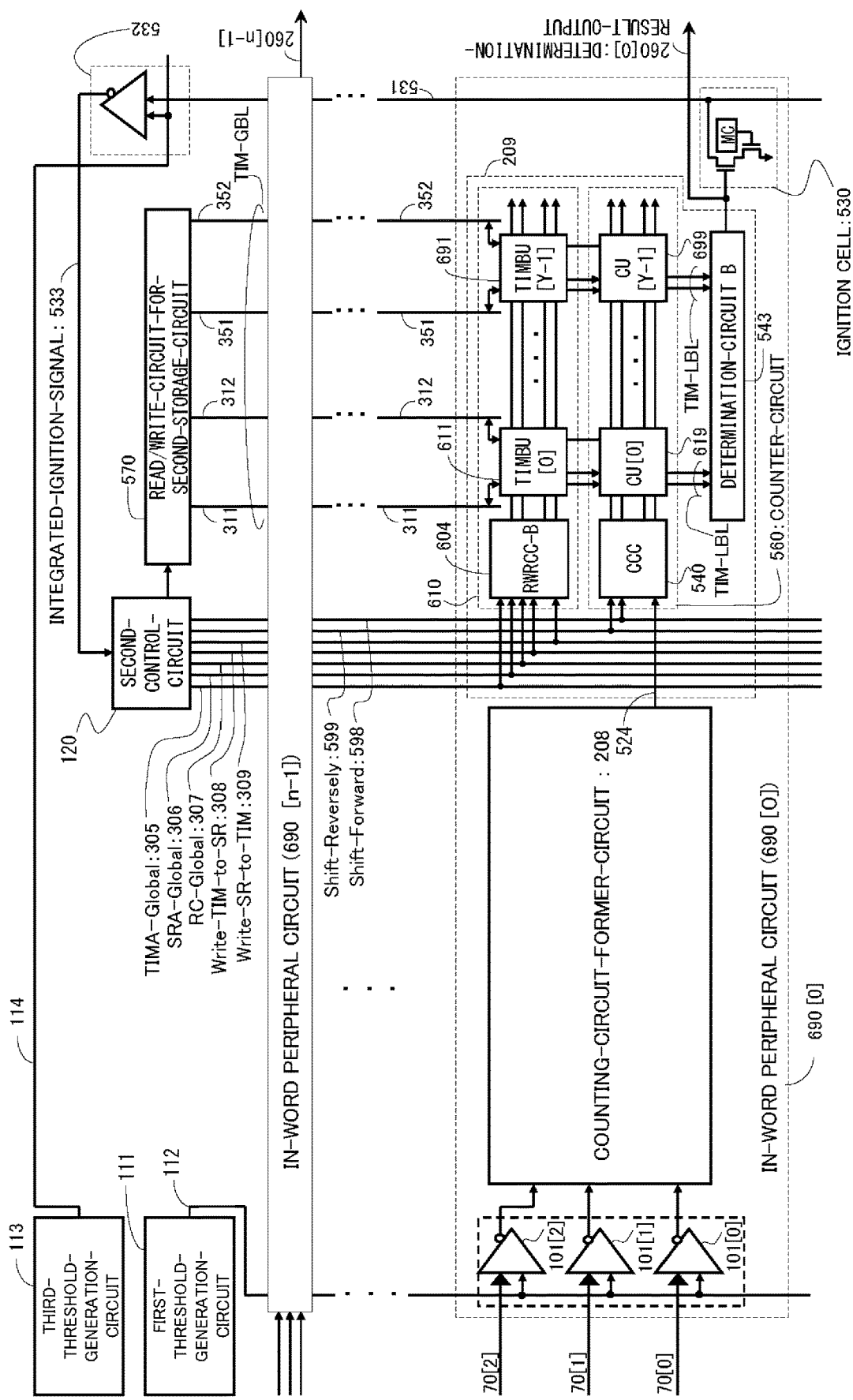
FIG. 19; EXAMPLE OF CONFIGURATION OF COUNTING-CIRCUIT USING COUNTER-CIRCUITS (K = 3)

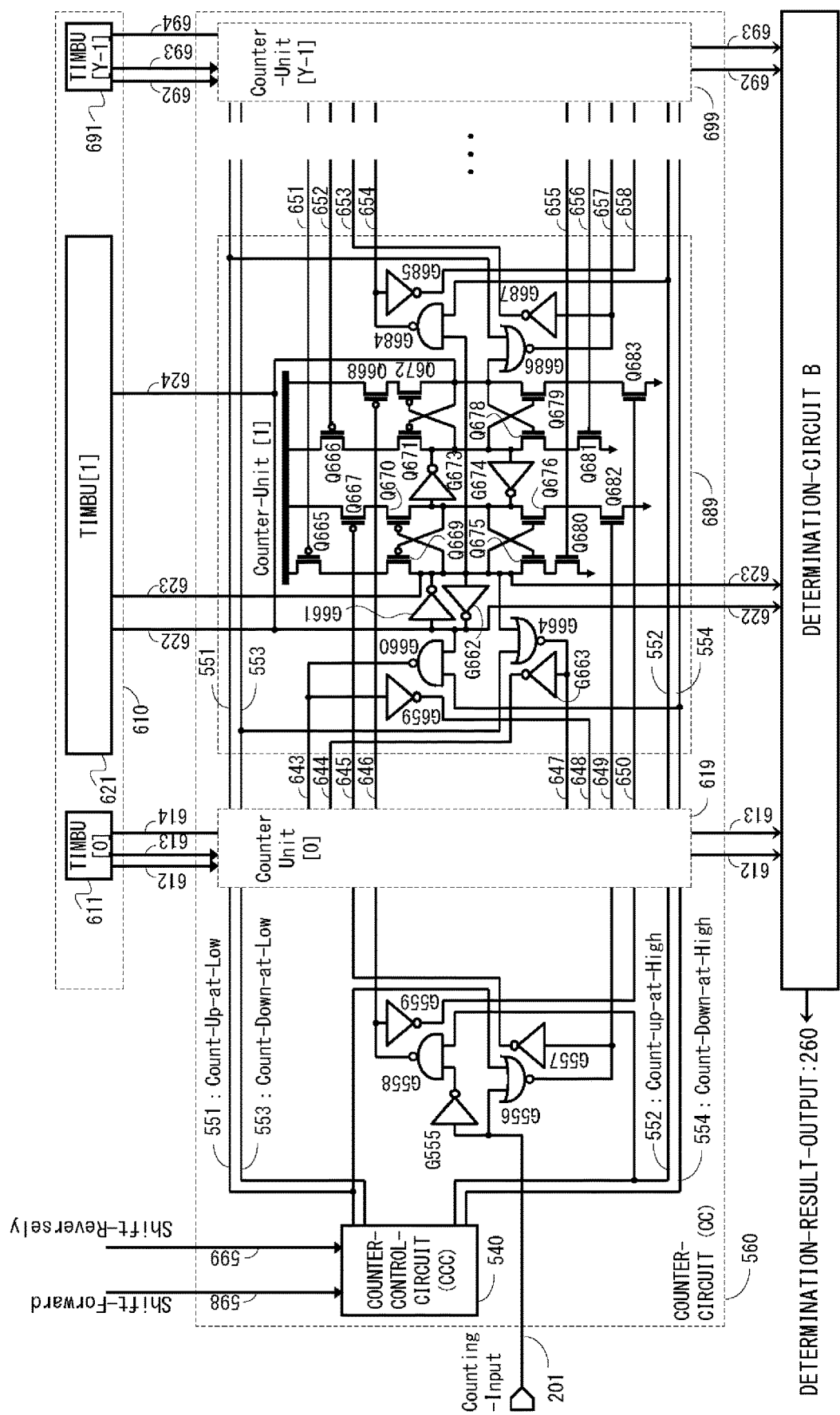
FIG. 20: EXAMPLE OF CONFIGURATION OF COUNTER-CIRCUIT

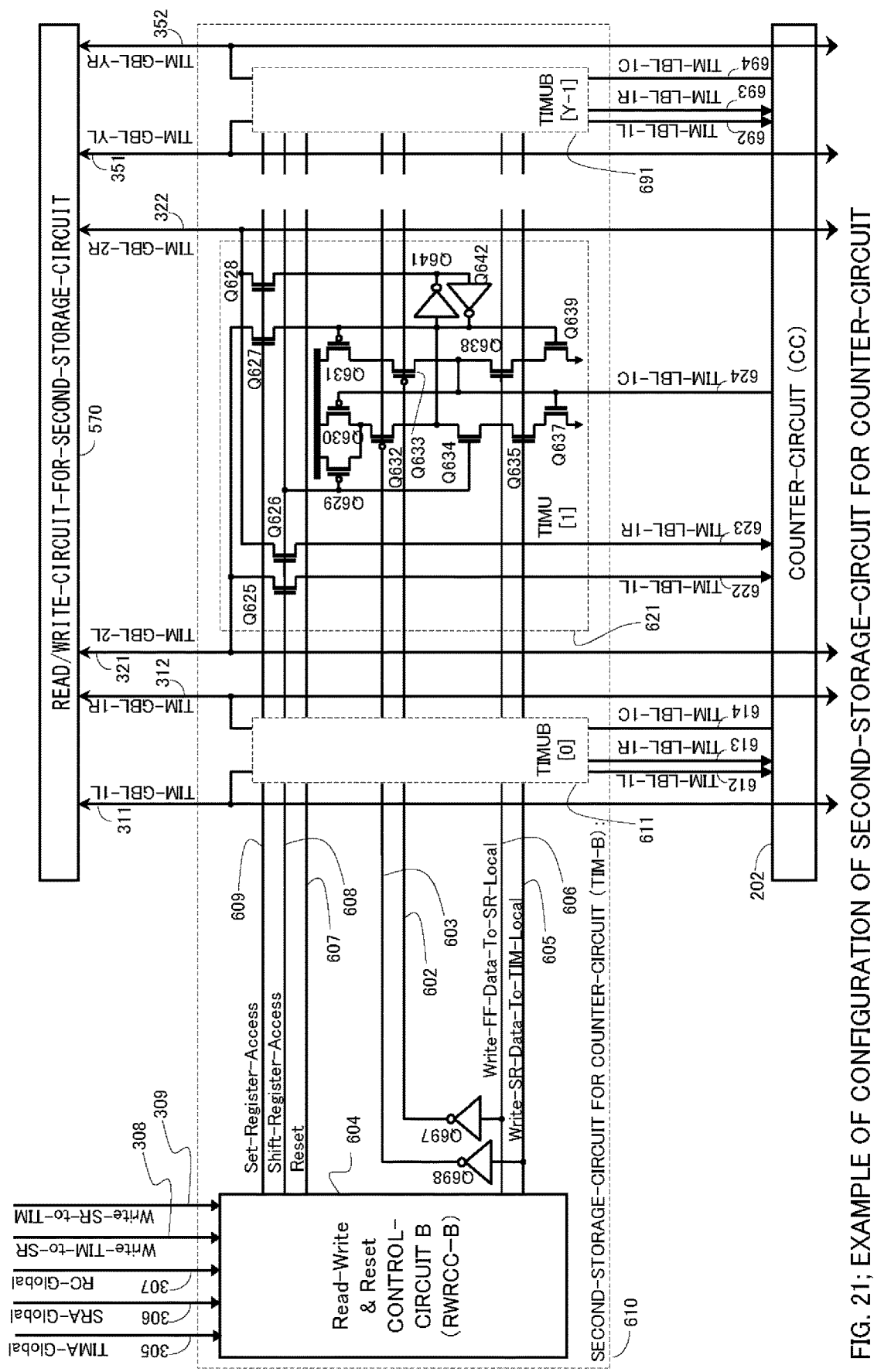
FIG. 21; EXAMPLE OF CONFIGURATION OF SECOND-STORAGE-CIRCUIT FOR COUNTER-CIRCUIT

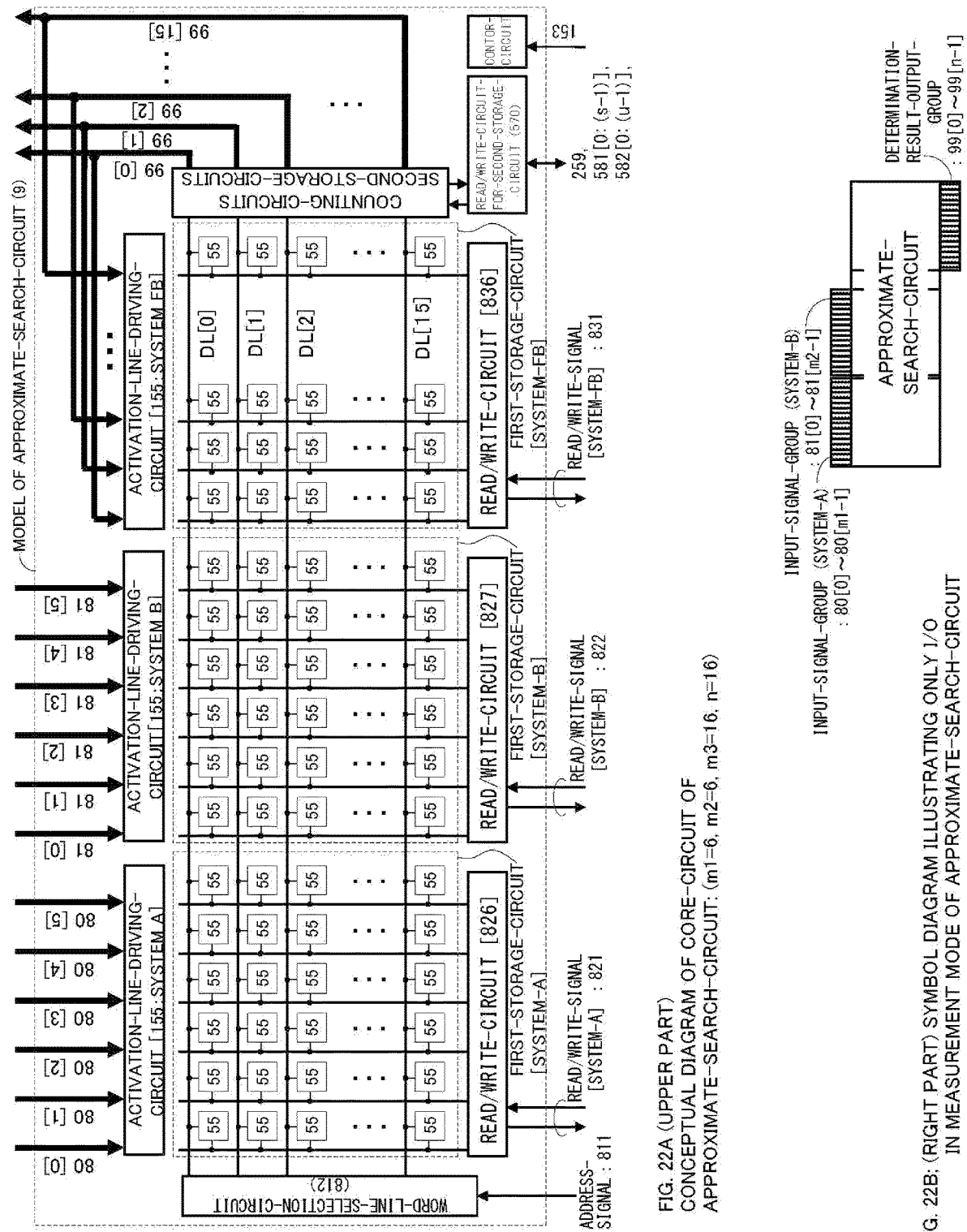
FIG. 22A (UPPER PART) CONCEPTUAL DIAGRAM OF CORE-CIRCUIT OF APPROXIMATE-SEARCH-CIRCUIT. (m1=6, m2=6, m3=16, n=16)
FIG. 22B; (RIGHT PART) SYMBOL DIAGRAM ILLUSTRATING ONLY I/O IN MEASUREMENT MODE OF APPROXIMATE-SEARCH-CIRCUIT

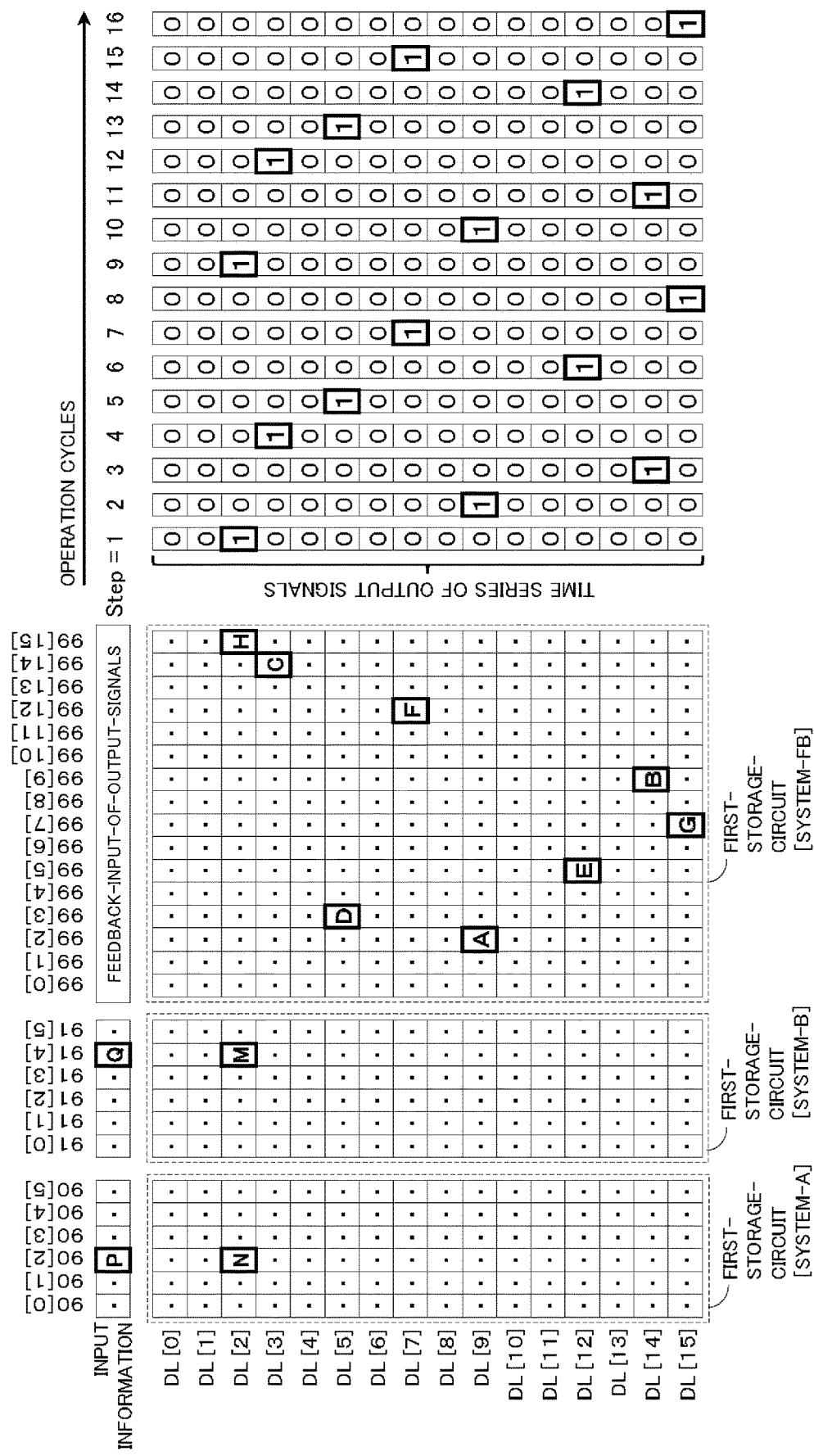
FIG. 23: FIRST DESCRIPTION ABOUT GENERATION OF TIME-SERIES-SIGNALS IN APPROXIMATE-SEARCH-CIRCUIT

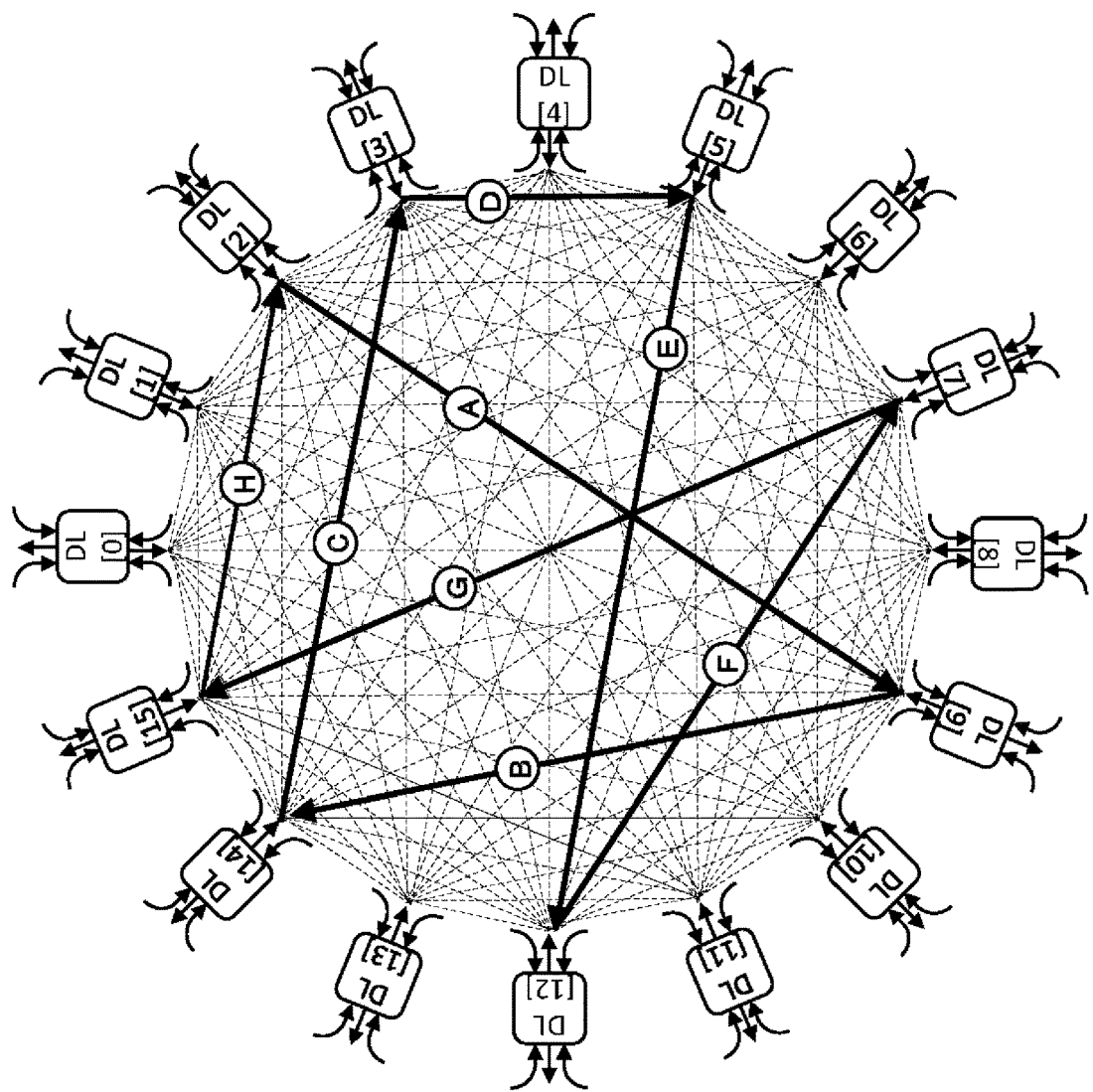
FIG. 24: SECOND DESCRIPTION OF GENERATION OF TIME-SERIES-SIGNALS IN APPROXIMATE-SEARCH-CIRCUIT ( NETWORK REPRESENTATION FOR FIRST-STORAGE-CIRCUIT OF SYSTEM-FB )

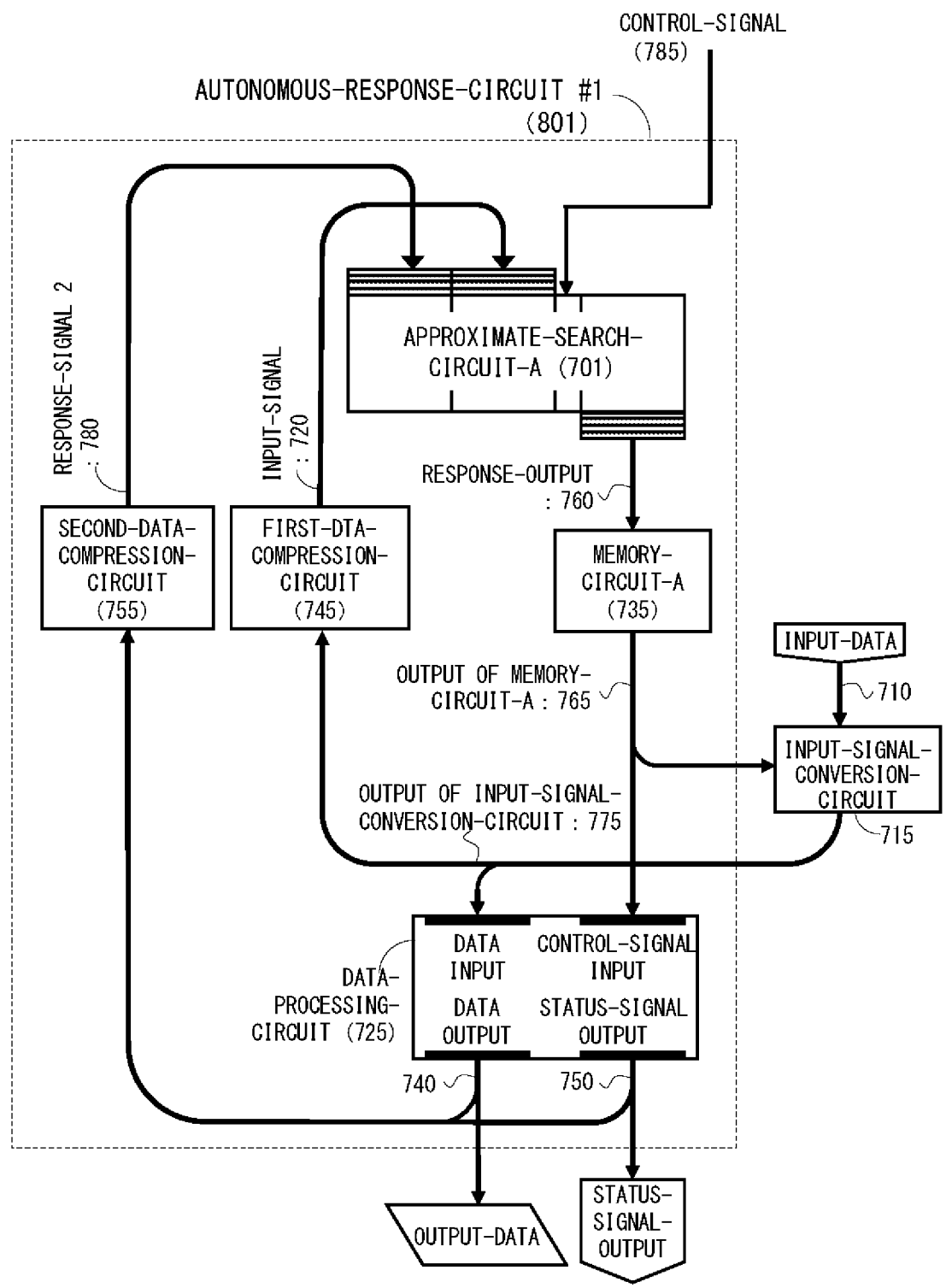
FIG. 25: AUTONOMOUS-RESPONSE-CIRCUIT #1, ACCORDING TO TWELFTH EMBODIMENT

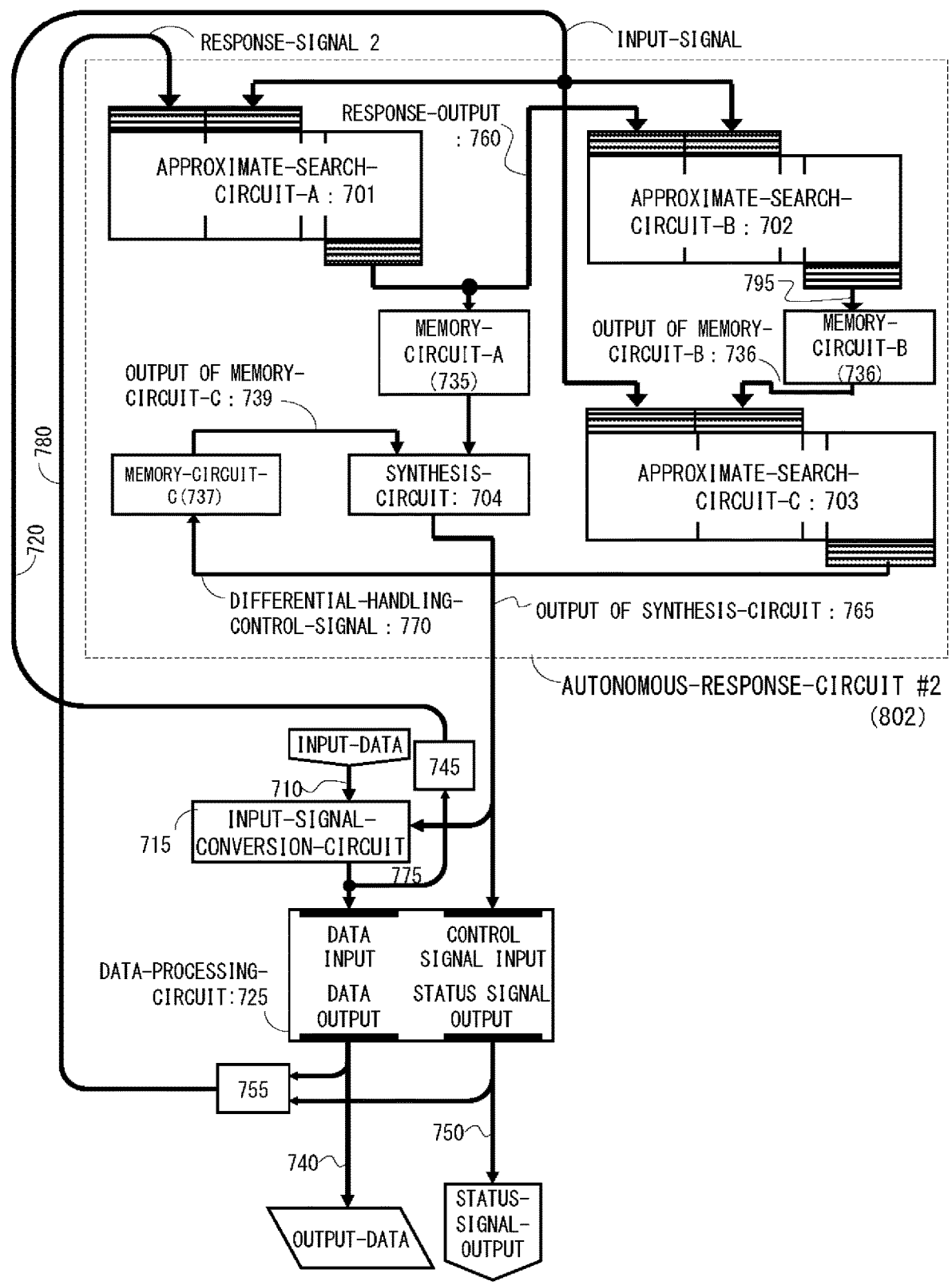
FIG. 26; AUTONOMOUS-RESPONSE-CIRCUIT #2, ACCORDING TO THIRTEENTH EMBODIMENT

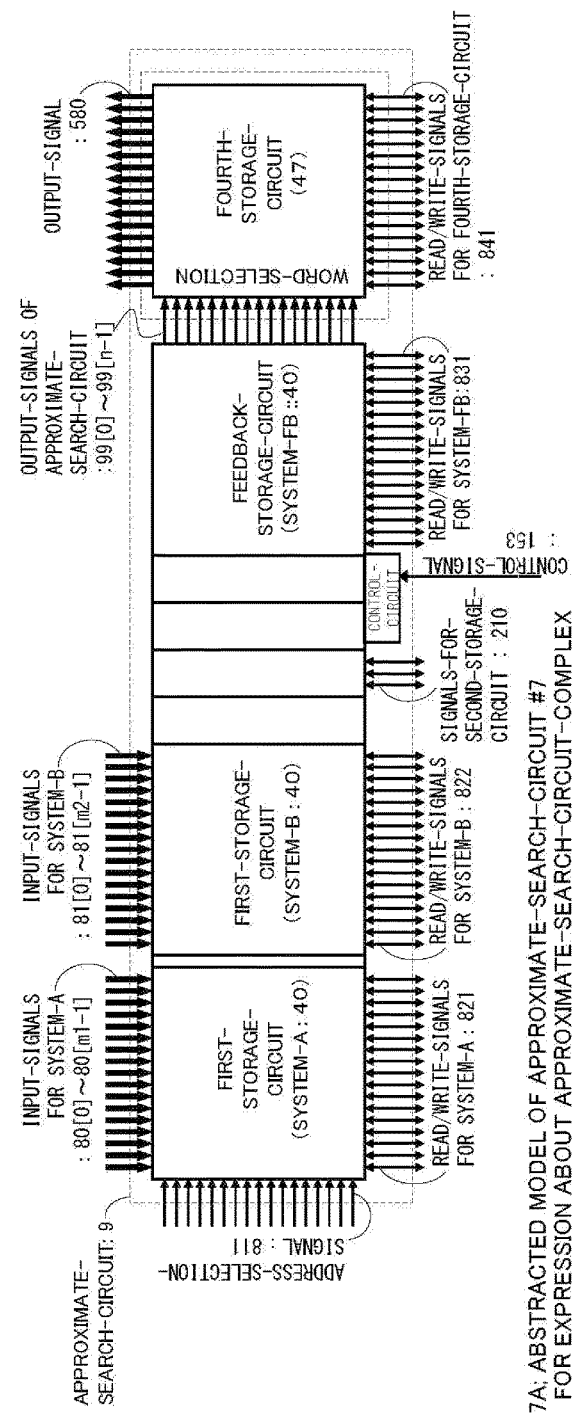
FIG. 27A; ABSTRACTED MODEL OF APPROXIMATE-SEARCH-CIRCUIT #7 FOR EXPRESSION ABOUT APPROXIMATE-SEARCH-CIRCUIT-COMPLEX
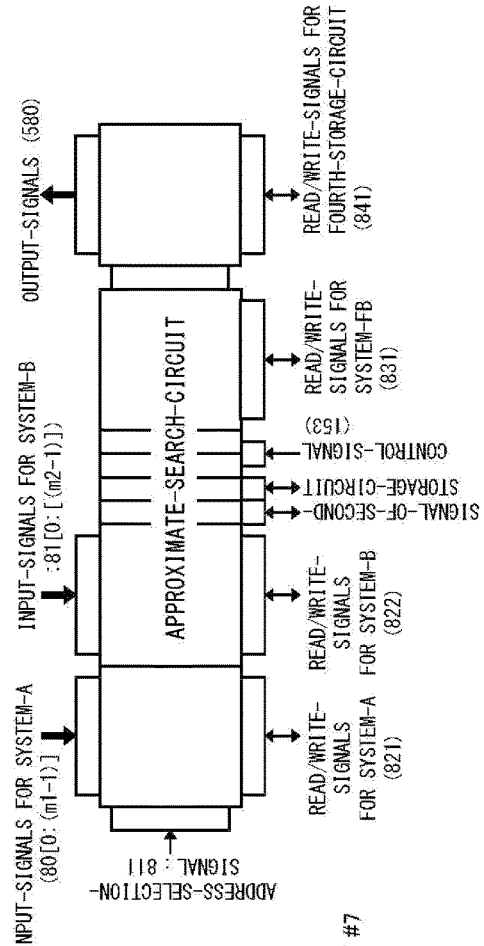
FIG. 27B; SYMBOL DIAGRAM FOR APPROXIMATE-SEARCH-CIRCUIT #7

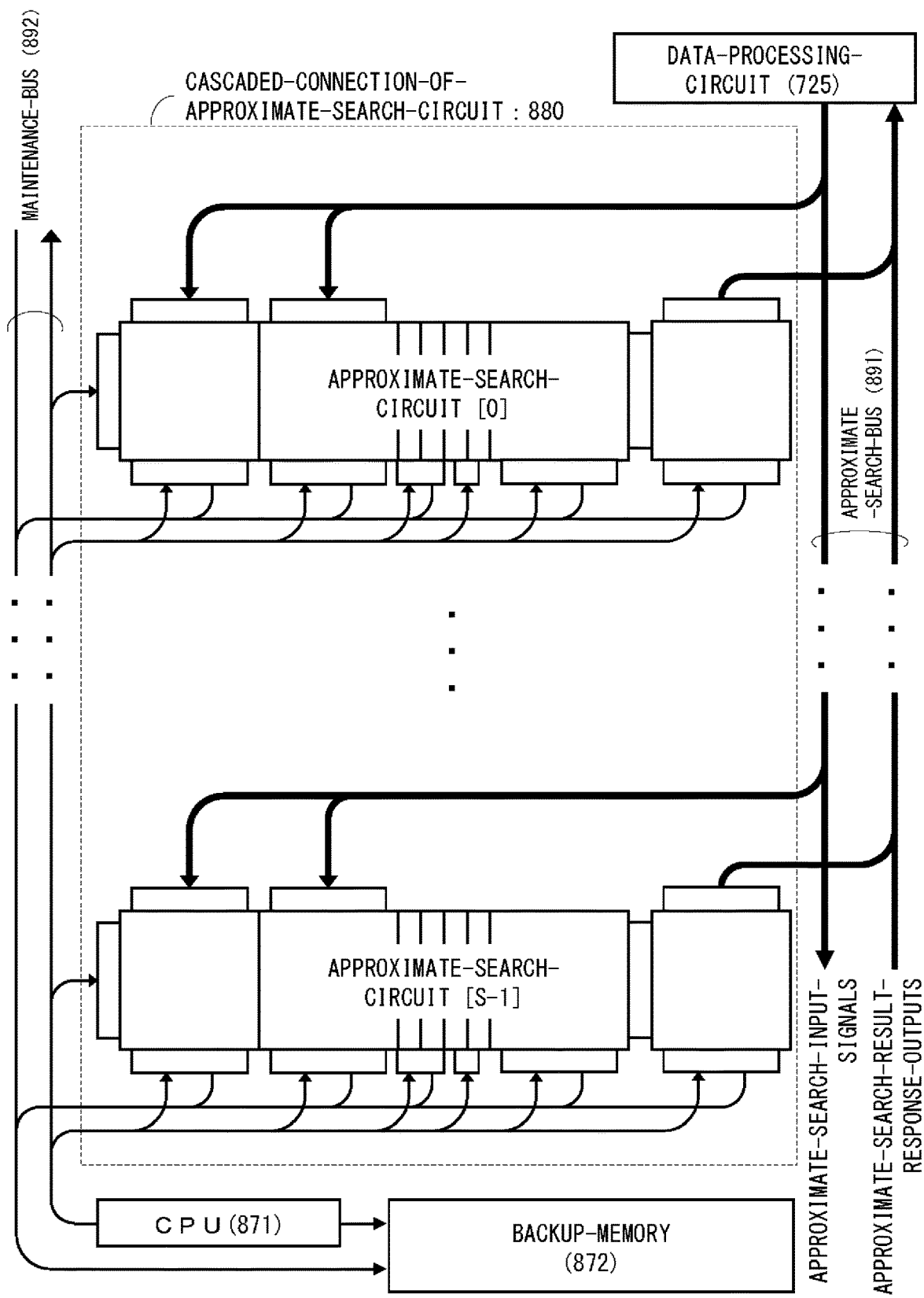
FIG. 28; AUTONOMOUS-RESPONSE-CIRCUIT #3, ACCORDING TO FOURTEENTH EMBODIMENT

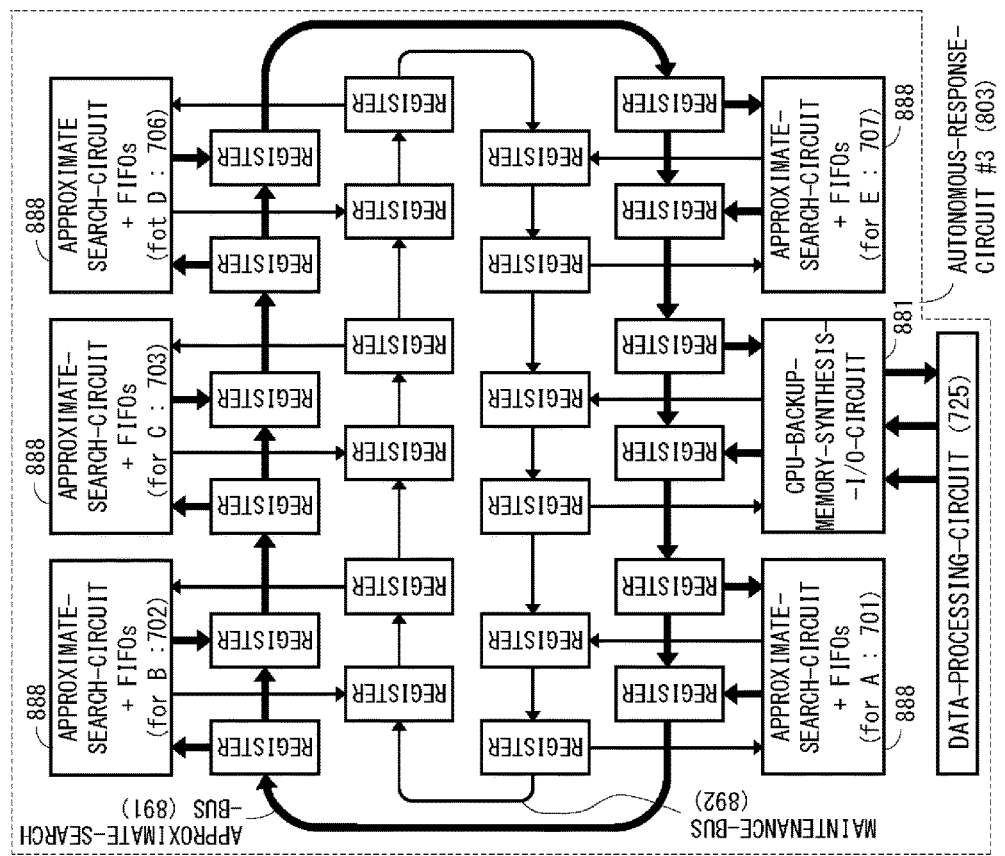
FIG. 29B: AUTONOMOUS-RESPONSE-CIRCUIT #3, ACCORDING TO A FOURTEENTH EMBODYMENT
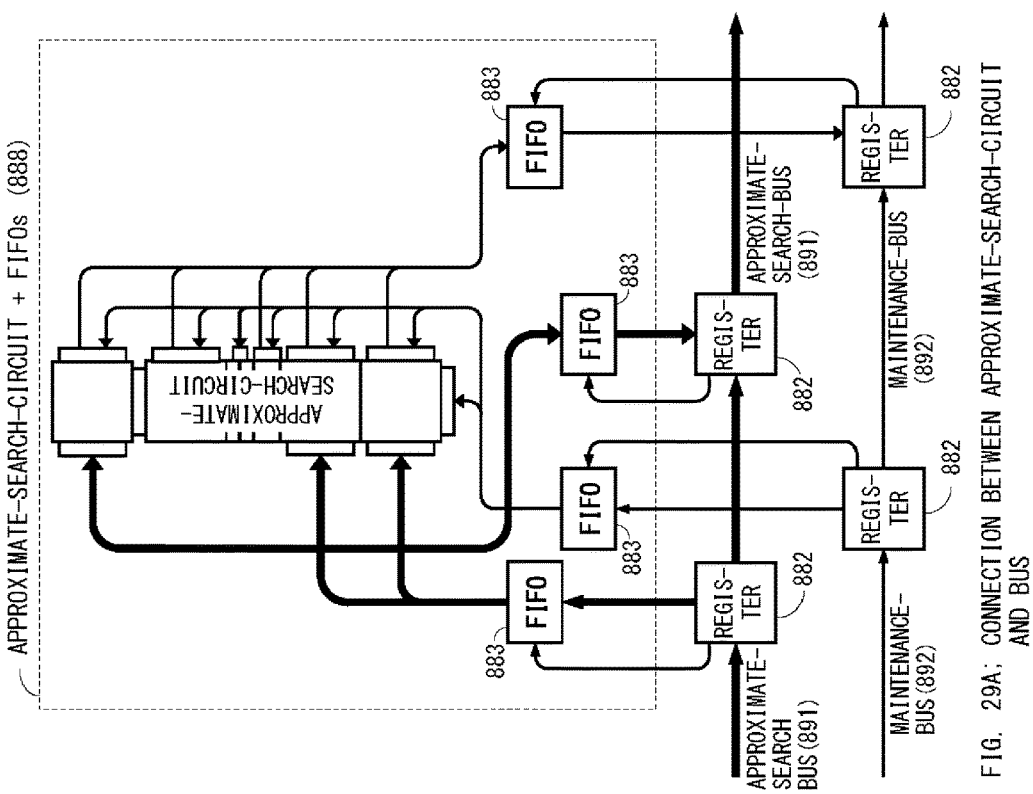
FIG. 29A: CONNECTION BETWEEN APPROXIMATE-SEARCH-CIRCUIT AND BUS

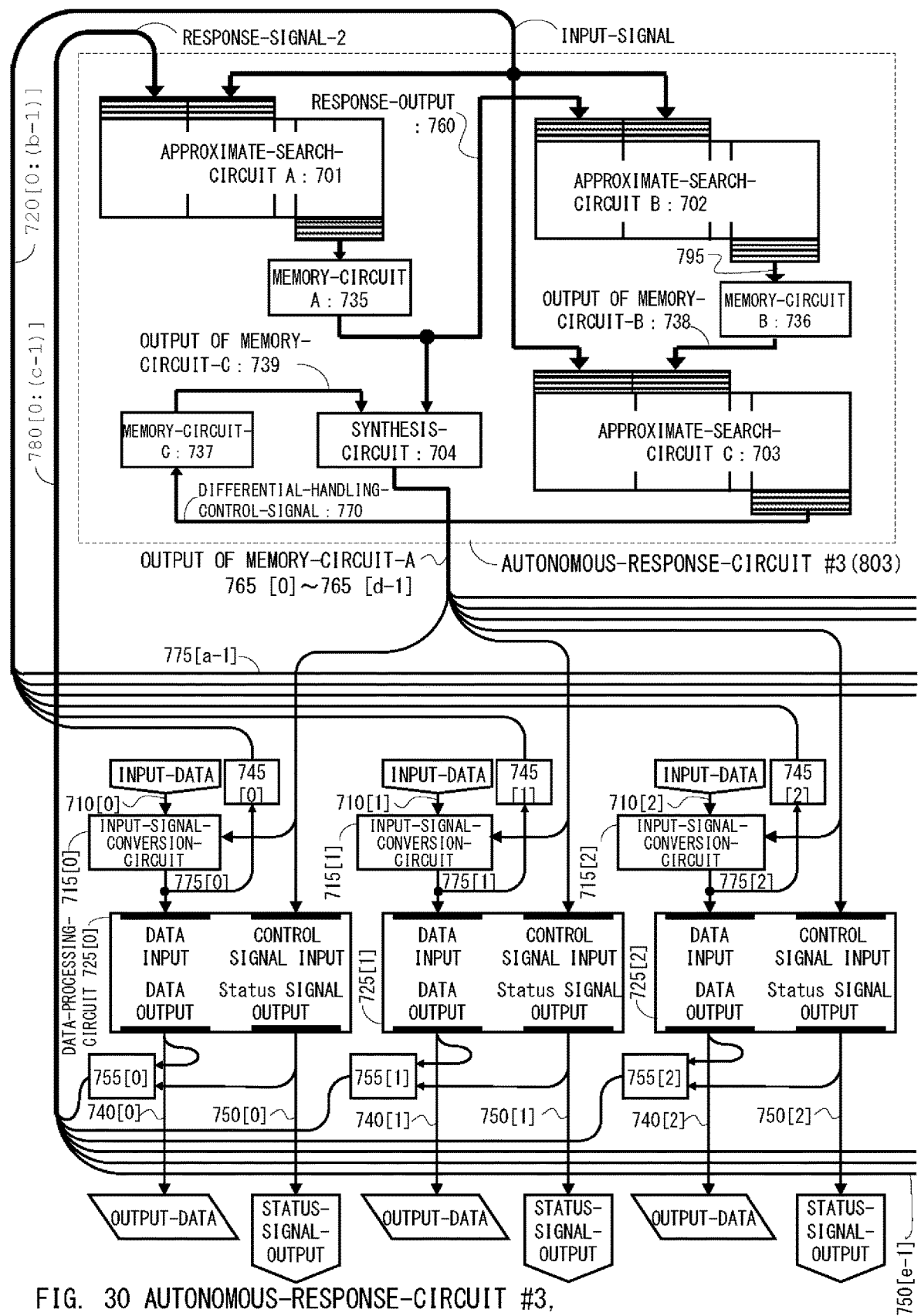
FIG. 30 AUTONOMOUS-RESPONSE-CIRCUIT #3, ACCORDING TO FIFTEENTH EMBODIMENT

FUZZY STRING SEARCH CIRCUIT

RELATED APPLICATIONS

This application claims the benefit under 35 U.S.C. § 120, and is a continuation, of co-pending International Application PCT/JP2020/015100, filed Apr. 1, 2020 and designating the US. This International Application is incorporated by reference herein in its entirety.

FIELD

The embodiments discussed herein relate to an architecture for a circuit that carries out an approximate search on an entire local memory circuit to determine, based on external information, which of the information stored in the memory circuit is optimal content and then makes an autonomous response according to the determination result.

BACKGROUND

Conventional Content Addressable Memory, so called CAM, techniques will be outlined with reference to FIGS. 1A to 1D, 2, 3A and 3B. The conventional CAM techniques are characterized by performing a search operation, in addition to memory read and/or memory write operations. For CAM cells, various types are known as illustrated in FIGS. 1A to 1D.

Data to be searched is stored in the memory circuits (or memory elements) of the CAM in advance to the search operations. Input data, that is called a search key for a search, is given to the memory circuits of the CAM through so called Search-Lines (or search/bit common lines).

The CAM cell using a SRAM Cell (FIG. 1A) store a data in a flip-flop (FF). The CAM cell using a 2T DRAM Cell (FIG. 1B) store a data in the parasitic capacitance of the floating node in the cell. The CAM cell using a variable resistance element (FIG. 1C) store a data in the variable resistance element in the cell. And, the CAM cell using a flash EEPROM cell (FIG. 1D) store a data in the floating gate in the cell.

The cells of all the above types have elements each of which conducts current from a Match-Line to a certain line according to the stored data and the potential of the Search-Line coupled thereto.

In the CAM cell using a SRAM Cell (FIG. 1A), ON/OFF state of a serially-connected transistors part is controlled by the stored data in the FF and the given voltage potential of the Search-Line. When the serially-connected transistors are both in ON state, a certain amount of current conducts from the Match-Line to the ground.

In the CAM cell using a 2T DRAM Cell (FIG. 1B), the ON State current conducts from the Match-Line to the Search-Line according to the stored data in the parasitic capacitance of the floating node and the given voltage potential of the Search-Line.

In the CAM cell using a variable resistance element (FIG. 1C), the ON State current conducts from the Match-Line to the Search-Line according to the stored data stored in the variable resistance element and the given voltage potential of the Search-Line.

In the CAM cell using a flash EEPROM cell (FIG. 1D), the ON State current conducts from the Match-Line to the ground when the threshold voltage of the EEPROM cell is lower than the given voltage potential of the Search-Line. The threshold voltage of the EEPROM cell is able to be controlled by injecting or erasing electric charges to the floating gate part of the cell in order to store a programmed data in the cell.

The CAM cell using SRAM shown in the FIG. 1A has two vertically running Bit-Lines for Write/Read operations in addition to a Search-Line for Search operations, but sometimes the Search-Line and either of the Bit-Lines may share a common Search/Bit Line in order to reduce the number of vertically running wirings.

In addition to the Binary CAM cells as illustrated in FIGS. 1A to 1D, there are known Ternary-CAM cells each having two storage circuits, or storage elements. The reason why the Ternary type has more storage circuits (storage elements) is because not only a value of "1" and a value of "0", but also a mask state called "Don't Care" is stored as data.

The followings will describe conventional feature of the Ternary type CAM, basing on the SRAM cells (FIG. 1A) as the Ternary-CAM cell.

FIG. 2 is a block diagram of the Ternary type CAM circuit in which the SRAM-based Ternary-CAM cells are arranged in a matrix of M rows by N columns. Only four corner Ternary-CAM cells of the M-by-N matrix are illustrated in the figure.

In a search operation, a search key (input data) presented by 2N bits is supplied to each Ternary-CAM Cell row of the M-by-N Ternary-CAM cell matrix through N pairs of the Search/Bit-Lines. When both voltage potentials of a pair Search/Bit-Lines to a Ternary-CAM Cell are meaning opposite data to two FF data in the unit Ternary-CAM cell, the cell regards the Search/Bit-Line pair is being "Match" with the data stored in the cell, and the Cell does not draw current from the connected Match-Line.

That is because both two series-transistors connection parts in the cell are kept in being turned OFF, i.e., either one of the two-transistors series connection in the cell goes into OFF state and does not generate conduction current from the Match-Line, thus the reverse phases between the stored data and the input data are regarded as being in "Match" state at the part of the cell being connected.

The situation where "Mismatch" is obtained, when either one of the two-transistors series connection in the cell is provided with High and High voltage, being supplied with same phase, at their gate electrodes, then the part goes into ON state, and the Cell draws a certain amount of current from the connected Match-Line; i.e., the voltage potential of the Match-Line is lowered to some extent.

Thus, the two sets of the two-transistors series connection in each cell perform an Exclusive-NOR operation. They do not draw current in the case of "Match," but may draw current in the case of "Mismatch."

A CAM cell includes two FFs in as storage circuits, and therefore a shared Search/Bit-Line pair needs to be operated at least two times in either case of a read operation and a write operation. Both read data and write data consist of 2N bits.

Hereinafter, a group of circuits that includes a row of N Ternary-CAM cells and a corresponding match-determination-circuit is referred to as a word circuit. The word circuit includes one Match-Line and two Word-Lines. In addition, a block of data stored in the N Ternary-CAM cells in a single row and a block of data sent from the Search-Lines or Bit-Lines coupled to these Ternary-CAM cells are referred to as "word."

FIGS. 3A and 3B illustrate the configuration and operation of the word circuit with N cells of the SRAM-based Ternary-CAM which were shown in FIG. 2. The illustration of cells [3] to [N−2] is omitted. In addition, since only search operations will now be described, the illustration of access transistors (transistors that connect an FF in the cell to corresponding Bit-Lines for read/write operations) are omitted as well.

In each cell, a pair of serially-connected transistors parts at both left and right sides does not conduct current in the case where stored data and input data were in "Match" state, but draws a certain amount of current from the connected Match-Line in the case where they were in "Mismatch."

So that, the Match-Line sums up the currents that all the "Mismatch" cells draw, and sends the currents to the connected match-determination-circuit.

Typically, the match-determination-circuit is provided with a transistor for resetting the potential of the Match-Line to a RESET potential before a match determination operation starts and a control signal (RESET_bar) for the resetting control.

In the case where there exists no Mismatch bit in the word circuit, no current is drawn from the Match-Line and thus the potential voltage of the Match-Line does not change, and the Match-Line retains the RESET potential.

In the case where there is at least one "Mismatch" bit in the word circuit, current conducts from the Match-Line to the ground, and thus the potential voltage of the Match-Line drops to an extent according to the current conduction from the Match-Line to the ground.

In order to detect a voltage change indicating the "Mismatch," the word circuit is connected with a threshold voltage generation circuit, which generates an intermediate voltage of the Match-Line between all the cell being in match State and a mismatch-cell existing state in the word circuit in its operation period. (see, for example, PTL 1)

In a conventional technique as illustrated in FIG. 3B, a "Match" state is detected in the word circuit, when all the input data supplied by the Search/Bit-Lines are reverse to each corresponding stored data in the word circuit. When all the cells obtain each local "Match" states, no current is generated and thus no voltage change occurs in the Match-Line. On the other hand, if any one of the cells detect "Mismatch" locally, the Match-Line potential drops and the word circuit outputs the "Mismatch" of the input data from the stored data.

As was illustrated in FIG. 2, the outputs of match-determination-circuits are sent to an address-encoder-circuit, which then generates the physical address of match-determination-circuits that have detected "Match" and outputs them as the "match-address-output."

Such Ternary-CAMs are used for packet data processing in network routers, memory management for parallel computers, and others.

Mathematically, the above processing of the conventional CAM technique is interpreted as detecting a "Match" when the Hamming-Distance between input-data and stored-data is zero.

Please see, for example, the following patent literatures: Japanese Patent No. 5480986; Japanese Patent No. 5893465; Japanese Patent No. 5800422; Japanese National Publication of International Patent Application No. 2019-517138; Japanese National Publication of International Patent Application No. 2014-504401; Japanese Laid-open Patent Publication No. 2020-017281; and Japanese Laid-open Patent Publication No. 2019-185784. Please also see, for example, the following non-patent literatures: K. Pagiamtzis and A. Sheikholeslami, "Content-addressable memory (CAM) circuits and architectures: A tutorial and survey," IEEE J.Solid-State Circuits, vol. 41, no. 3, March 2006, pp. 712727; and Akiko Mochizuki, Takashi Omori, "PATON: A dynamic neural network model of context dependent memory access," Japan Neural Network Society Journal Vol. 3, No. 3 (1996), 81-89.

In such applications as handwriting recognition and the like, it is not realistic to use zero Hamming Distance technique for finding out a solution to recognize input-data. Sometimes, partial mismatches have to be allowed to some extent and approximation would be important, in these cases.

Preparing a lot of rows, or words, of similar data by using "don't care" control of the Ternary-CAM would be a solution for finding "Partial Match" word. However, preparing a lot of similar rows has a great disadvantage in terms of cost, because that increase the circuit size.

So that, searching a most similar candidate or some good candidates from prepared data base would be better than those.

The needs for determination and detection allowing "having a certain degree of matching" are also present in designing neural-network-circuits that imitate the behaviors of neurons.

In general, a neural-network-circuit takes both input-data and comparison-data as multidimensional vectors and measures a degree of matching by computing the inner-product of these vectors. Here, the maximum value of the inner-product is not a fixed value but may depend on the comparison-data. The conventional Ternary-CAM is not able to deal with this.

Those have been a problem of the Ternary-CAM technologies.

In the Ternary-CAM technologies, current flow in a Match-Line is used for recognizing whether there is an existences of "Mismatch" cell in the word circuit. However, in the case that a vast amount of data is stored in a CAM, almost all the word circuits have to be in "Mismatch" state, but usually value of search operation comes from finding "Match". So, increase of power consumption for the vast "Mismatch" words has become another problem of the CAMs.

In addition, in some applications as like handwriting recognitions using the neural-network-circuit, length of the word in the word circuit tends to be long and the number of bits storing "1" tends to be less than that of bits storing "0".

Above situations reason a requirement of a new word circuit architecture which consumes more currents when the number of "Match" cells are increasing. In that architecture, existing "Mismatch" cells should not increase power consumption, and a similar candidate search should not increase the number of word circuits.

Process of search is usually regarded that looking for exact match one from stored data in an integrated circuit of storage devices. In contrast to that, looking for similar one from stored data is called an "approximate search" operation.

SUMMARY

The present disclosure relates to a circuit architecture for achieving an approximate search, and to data-processing-circuits that use the circuit architecture. Based on external information, the data-processing-circuits that use the circuit architecture choose optimal contents and/or optimal programs from locally stored data and make some responses according to the chosen results.

In order to choose optimal contents and/or programs in locally stored information by having external information, the circuit or the device need to have some functions and an architecture for measuring of similarity between the external information and each of the locally stored information. Because, usually, any of the locally stored information does not exactly matches to the input external information.

"A degree of similarity" would be regarded as is having the same meaning as an expression of "a degree of matching". So, in the followings, a circuit technique to evaluate the "a degree of similarity" by using "a degree of matching" is presented.

The present disclosure, which is named matching-degree-determination-circuit #2 being illustrated in FIG. 6, has such input-signals as a group of activation-signal-inputs and an output of a first-threshold-generation-circuit (111), through activation-signal-input-lines (90[0] to 90[m−1]) and through a voltage delivering line (112), respectively. Each numerical value delivered through each of activation-signal-input-lines is represented by pulse-signal counts passing through the line in a predetermined time period. Because each activation-signal-input-line is connected to multiple memory-cells (10), each numerical value delivered through the activation-signal-input-line controls current-pulse generations in each memory-cell with the stored data in the FF of the cell, and draw the conduction current from each connected detection-line (70). Each of detection-lines (70[0] to 70[k−1]) in a matrix forming circuit consisted with the memory-cells is connected to a detection-line-current-read-circuit (101), the output of which is sent to a counting-circuit (207), and the counting-circuit counts the current-pulses that have transmitted by the memory-cells and passed through the detection-lines.

The number of pulse-signals counted by the counting-circuit (207) in a predetermined time period becomes an approximate value to the inner-product of input information transmitted from the group of the activation-signal-input-lines (90) and the group of the stored data value in the memory-cells (10), and therefore this counting is considered as measuring a degree of similarity between two information group. Such a circuit to perform this operation, i.e., a matching-degree-determination-circuit will be basic forms of the following disclosures.

For determining whether the degree of similarity is enough or not, a determination-circuit (290) compares a delivered numerical value from the second-storage-circuit (200) with the counted pulse-count in the counting-circuit (207), and when determining that the counted pulse-count exceeds the value from the second-storage-circuit, the determination-circuit regards that the similarity is enough and put out the results from the output-terminal (260).

On such basis of the matching-degree determination-circuit as illustrated in FIG. 6, an approximate-search-circuit is configured, that carries out a search by evaluating a degree of similarity between each group of locally stored information and a group of external input-signals. In general, the higher a degree of similarity generates the earlier similar enough signal from the output terminal (260). Therefore, the matching-degree-determination-circuit that puts out the earliest signal is regarded as the highest matched one in the whole.

Further, using a circuit that includes the former disclosed approximate-search-circuit function, autonomous-response-circuits are configured, which determines, based on external information, which content of locally stored information is optimal or which response program is optimal, and according to the determination result, that activates the subprogram to make following responses.

The basic configuration of an autonomous-response-circuit (801) according to the present disclosure is illustrated in FIG. 25.

The autonomous-response-circuit includes an approximate-search-circuit (701), a memory-circuit (735), and data-compression-circuits (745 and 755) in addition to a typical data-processing-circuit (725), in order to determine, based on external input information, which content in locally stored information is optimal or which response program is optimal, and according to the determination result, that activate the program to makes following responses.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 1A to 1D illustrate examples of conventional content addressable memory cells;

FIG. 2 illustrates a conventional content addressable memory circuit (Ternary-CAM);

FIGS. 3A and 3B illustrate a configuration and operation of a word circuit of a conventional Ternary-CAM;

FIGS. 4A to 4C illustrate examples of the configurations of read circuits;

FIG. 5A is a block diagram illustrating the configuration of the matching-degree-determination-circuit #1;

FIG. 5B illustrates inputs to and an output from the matching-degree-determination-circuit of FIG. 5A;

FIG. 6 illustrates a second embodiment;
FIG. 7 illustrates a third embodiment;
FIG. 8 illustrates a fourth embodiment;
FIG. 9 illustrates a fifth embodiment;
FIG. 10 illustrates a sixth embodiment;
FIG. 11 illustrates a seventh embodiment;
FIG. 12 illustrates an eighth embodiment;
FIG. 13 illustrates a ninth embodiment;
FIG. 14 illustrates a tenth embodiment;
FIG. 15 illustrates an eleventh embodiment;
FIG. 16 illustrates an example of the configuration of a counting-circuit using a shift-register-circuit;

FIG. 17A illustrates an example of the configuration of a shift-register-control-circuit, and FIG. 17B illustrates an example of the configurations of a shift register and a determination-circuit;

FIG. 18 illustrates an example of the configuration of a second storage circuit;

FIG. 19 illustrates an example of the configuration of a counting-circuit using a counter-circuit;

FIG. 20 illustrates an example of the configuration of the counter-circuit;

FIG. 21 illustrates an example of the configuration of a second storage circuit for the counter-circuit;

FIGS. 22A and 22B are conceptual diagrams of an approximate-search-circuit, and the symbol diagram;

FIG. 23 is a first view for describing occurrence of a time-series signal by an approximate-search-circuit;

FIG. 24 is a second view for describing occurrence of a time-series signal by an approximate-search-circuit;

FIG. 25 illustrates a twelfth embodiment;
FIG. 26 illustrates a thirteenth embodiment;

FIGS. 27A and 27B illustrates an abstracted model of approximate-search-circuit #7 for expression about approximate-search-circuit-complex, and the symbol diagram;

FIG. 28 illustrates a fourteenth embodiment;

FIGS. 29A and 29B illustrate connections between an approximate-search-circuit and a maintenance-bus; and FIG. 30 illustrates a fifteenth embodiment.

DETAILED DESCRIPTION

Hereinafter, embodiments will be described with reference to the accompanying drawings.

In the description, reference numerals are given to circuit components and are written in parentheses or after colon ":" following the names of the circuit components, as long as a space is available. The same reference numerals are given in both the description and the drawings.

In the case where emphasis is given to that a certain circuit component is provided in plurality, a number of alphanumeric characters or a formula that indicates the number of circuit components is written as a suffix in square brackets, following the name of the circuit component or the reference numeral indicating the circuit component.

In addition, when it seems to cause confusion between the names of circuit components and the text of the description, the names of the circuit components might be written in double quotation marks.

Note that, in the case where the actual number of circuit components is too large for illustration, only a limited number of circuit components, for example, three of them are illustrated in the drawings, and that is described.

In the case where it is obvious that a circuit component is provided in plurality, the indication of the number of circuit components using a number, formula, or another in square brackets is omitted.

In the description relating to a storage circuit, circuit blocks such as a read-circuit, a write-circuit, and a power-supply-circuit, and signal-lines for the circuit blocks are conventionally well-known independently of the present disclosure. Therefore, the notation, representation, and description of them are omitted. And, the illustration and description of bit-lines and word-lines that are coupled to CAM cells and memory-cells may be omitted. Please note that, as to the arrangements and functions of these circuits and wiring, it is premised that the typical forms and modifications of the conventionally well-known techniques for CAMs and memories are applicable in the application of the embodiments.

Conversely, by adding the circuits of the present disclosure other than a memory-matrix to a conventionally well-known memory circuit, such a conventional memory circuit is able to have additional functions of the matching degree determination operations and the approximate search operations.

The expression "approximate search," for which an appropriate term has not yet been established, often appears in the description and drawings. This linguistic expression means an operation of finding such stored data that are in a short distance under a certain definition, and an operation of finding out such targets that have a high degree matching with or similar enough to input data.

In the conventional techniques relating to CAM circuits, the term "search" is also used, but this "search" needs an "exact match," which is different from the "approximate match" shown in the presenting disclosure.

In the case where digital signals are used, the terms like a value of 1, a value of 0, a high-voltage-level, and a low-voltage-level may be used for values stored in a circuit or a voltage level of a signal line. They may differ from a polarity of signal or from a potential level of a digital signal, and the value of 1 does not always mean high-voltage-level.

All modifications with different polarities fall within the scope of the present disclosure even if they are not specifically mentioned.

An embodiment can be modified with different internal configurations and arrangements of component circuits such as CAM-cells, memory-cells, sense-amplifiers, storage-circuits, write-circuits, read-circuits, and control-circuits. These modifications still fall within the scope of the embodiment.

In addition, the terms "signal" and "data" sometimes have different meanings like information in a physical layer and information in a logical layer, but are basically used as having the same meaning in the description and drawings.

In all embodiments of the present disclosure, memory-cells (10) used are such memory cells that each have a function of controlling whether to conduct current to a detection-line or a bit-line according to locally stored data. Such a function is commonly provided in publicly-known memory cells, and the present disclosure is applicable to all types and systems of memory cells.

In all embodiments of the present disclosure, a unit of circuits for enabling a storage circuit to represent a binary numeral is called a unit-storage-circuit (55). Each unit-storage-circuit (55) includes one memory-cell (10) or a plurality of memory-cells (10). The memory-cell (10) in each unit-storage-circuit (55) is connected to an activation-signal-input-line (90) and is able to generate a certain amount of conduction currents to a specific detection-line (70) in response to a signal supplied through the activation-signal-input-line (90).

In the drawings for describing the embodiments of the present disclosure, only example of employing a memory cell technique is illustrated as a representative of other variations.

In the description of the embodiments of the present disclosure, there are many sequentially input-signals such as the input-signals to matching-degree-determination-circuits, approximate-search-circuits, and autonomous-response-circuits. These sequential patterns of pulse-signals present a group of specific numerical values, data, when they are looked at or treated as time-depending pulse patterns in a predetermined time period.

For example, signals which are running through m wirings, named activation-signal-input-lines, 90[0:m−1], provide a meaning of data, when the running pulse signals of each signal line are treated as a time-series pulse pattern. But any pulse-signal or a group of signal levels of the signal lines at any timing (t=t0) does not have meaning.

Meaningful parameters are extracted from the passage of pulse-signals in a predetermined period of time, and these would be the following parameters:

pulse-signal density per predetermined period of time;

timing to change the pulse-signal density from sparse to dense; and timing to change the pulse-signal density from dense to sparse.

Numerical values at a certain timing would be defined and represented by means of these three ways.

If the predetermined period of time, that is a monitoring period of pulse-signals, is excessively short, it is not possible to measure the pulse-signal density nor to detect the timing to change the pulse-signal density. If the predetermined period of time is excessively long, however, there is a risk of averaging the pulse-signal density, too much.

And, the predetermined period of time may depend on the pulse width, so that both the predetermined period of time and the pulse width of the pulse-signals must be regarded as application-dependent parameters.

Therefore, in the following description, an appropriate predetermined period of time will be supposed and be referred to as a predetermined time period.

The pulse width of a pulse is also supposed so as to avoid overlap of pulses in the related signal lines, but is not especially defined here because it depends greatly on a manufacturing technique of the circuit.

EMBODIMENTS

Matching-Degree-Determination-Circuits #1 and #2 According to First and Second Embodiments The following describes a matching-degree-determination-circuit #1 according to a first embodiment and a matching-degree-determination-circuit #2 according to a second embodiment with reference to FIGS. 5A, 5B, and 6.

FIG. 5A is a conceptual block diagram illustrating the configuration of the matching-degree-determination-circuit #1.

FIG. 5B illustrates only inputs to and an output from the matching-degree-determination-circuit, among the interface signal pins that the circuit provides for simplifying the descriptions.

FIG. 6 is a conceptual block diagram illustrating the configuration of the matching-degree-determination-circuit #2.

The matching-degree-determination-circuit #2 of the second embodiment has a first-storage-circuit (40), each of which is consisted of k rows by m columns of memory-cells in matrix and a detection-line-current-read-circuit (101), a counting-circuit (207), a second-storage-circuit (200), and a determination-circuit (290), whereas the matching-degree-determination-circuit #1 of the first embodiment has only one row in the matrix, and this could be regarded as a special case of k=1.

Therefore, the matching-degree-determination-circuit #2 as the second embodiment illustrated in FIG. 6 will be described first.

Such circuits to control read/write operations to the first-storage-circuit (40) and second-storage-circuit (200), and bit-lines and word-lines are well-known and are therefore not illustrated to avoid complexity of the illustration. Conversely, by adding circuits of the present embodiment other than the memory-matrix to a conventionally well-known memory circuit, the memory circuit is able to be provided with such additional functions as are named "matching-degree-determination" and/or "approximate-search" operations.

When a particular memory-cell that is located in the i-th column and the j-th row of the first-storage-circuit (40) is regarded, stored data of the memory-cell is going to be denoted as M[i,j], hereinafter. Note that suffix of "i" is an integer from 0 to (m−1), and that suffix of "j" is an integer from 0 to (k−1).

The matching-degree-determination-circuit #2 is provided with m sets of activation-signal-input-lines, 90[0:(m−1), for receiving m sets of input-signals.

Each of the input-signals, which is running through an activation-signal-input-line, is a sequence of pulse-signals that is a part of data carried as a whole through the activation-signal-input-lines, 90[0:(m−1)], in a predetermined time period. That is, the data transmitted through the i-th activation-signal-input-line, 90[i], in its own particular predetermined time period, is a component of the whole data, 90[0:(m−1)], carried through the activation-signal-input-lines in the predetermined time period. The component data is denoted as S[i].

Therefore, the group of the component data, S[0:(m−1)], which are represented by time-depending pulse-signals running through the activation-signal-input-lines in the particular predetermined-time-period, have an ability to represent a vector at the timing; i.e., each of the components of the vector is S[i].

A particular signal value of the moment at a certain timing (t=t0) is not data but is meaningless.

Data, timings, or information provided by the data and timings are treated and processed as being encoded into time series of pulse-signals in the passage of a predetermined time period by using the following parameters;
 pulse-signal density per a predetermined time period; and
 timing to change the pulse-signal density "from sparse to dense;" or
 timing to change the pulse-signal density "from dense to sparse".

In the first-storage-circuit (40), a memory-cell with data, say M[i,j], controls and converts a sequence of pulse-signals received from the connected activation-signal-input-line, 90[i], and puts out the pulse-signals to the connected detection-line, 70[j], when the stored data in the memory-cell is "1". But, the memory-cell does not put out any pulse-signal when the stored data is "0".

If the number of pulses sent through the activation-signal-input-line in a predetermined time period is regarded as presenting a numerical value, the above-described conversion is a multiplication of the numerical value from the activation-signal-input-line, S[i], with the numerical value stored in the memory-cell, M[i,j].

These mean that the first-storage-circuit, if being provided with a function of summing-up between the multiplied values, may be regarded as having a function of doing an inner-product calculation between a vector from the activation-signal-input-lines, S[i] in which i=0 to (m−1), by a vector, M[90[i,j], in which i=0 to (m−1), for each "j" value.

The summing-up operation is going to be processed by the counting-circuit, here. Because a counting operation has a function to represent an adding operation of integers: counting is a function of adding one to the former value.

To do that, the matching-degree-determination-circuit #2 is further provided with the detection-line-current-read-circuit (101) and the counting-circuit (207), and with a second-storage-circuit (200) and a determination-circuit (290). The detection-line-current-read-circuit (101) amplifies the pulse-signals transmitted through the detection-line (70[j]), and the counting-circuit (207) counts the input pulses one by one in the predetermined time period, and puts out a numerical value presenting the counted pulse-counts, that results in putting out the inner-product value for two vectors, S[i] and M[i,j], for a particular "j" value.

To be exact, pulse-signals generated by the memory-cells in a row of the memory-matrix may overlap during passing through the detection-line in the row, which may decrease the output number of the counting-circuit. Although, the output number at least approximates to the summed-up count of the pulse numbers generated by the memory-cells in the row of the memory-matrix.

The matching-degree-determination-circuit #2 is further provided with a second-storage-circuit (200) and a determination-circuit (290). Being supplied with the outputs of the counting-circuit and the second-storage-circuit, the determination-circuit is able to compare the converted numerical data by the first-storage-circuit and the threshold-value sent from the second-storage-circuit. When the converted numerical data is bigger than the threshold-value, the determination-circuit puts out a signal to an output terminal (260), meaning that the converted numerical data exceeds the threshold-value, i.e., a signal presenting that the input-signals have a high degree of similarity to the data in the first-storage-circuit (40).

The above describes the most basic operation relating to the matching degree determination of so-named matching-degree-determination-circuits.

Operation of Matching-Degree-Determination-Circuit #1

The following describes the operation of the matching-degree-determination-circuit #1 in detail with reference to FIG. 5A.

The m sets of unit-storage-circuits, $55[i]$, where i=0 to (m−1), which share a detection-line of $70[0]$ and a detection-line-current-read-circuit of $101[0]$, form a detection-unit-circuit of $50[0]$. Here, note that the suffix number "0" in these $70[0]$, $101[0]$, $50[0]$ and following $10[i,0]$ and $M[i,0]$ come from the value of "k" owned by the matching-degree-determination-circuit #1.

The unit-storage-circuit, $55[i]$, where i is a representative for all of the integers from 0 to (m−1), consists of a memory-cell (10) in this case, and i-th memory-cell, $10[i,0]$, that has the data of $M[i,0]$, of the unit-storage-circuit, $55[i]$, is connected to an activation-signal-input-line, $90[i]$, to receive data, $S[i]$.

The activation-signals are pulse-signals and are not needed basically to be synchronized at their rising timing or falling timing to any of timing signals.

In addition, the pulse-signals passing through the activation-signal-input-lines (90) convey data that corresponds to the number of pulses, or pulse pattern, in a predetermined time period. Here, the predetermined time period is supposed to have been designed, or chosen previously as a relatively short period of time.

For example, when the number of pulses passing in the predetermined time period is 3 pieces, this is able to be treated as meaning a numeric value of 3. When the number of pulses passing in the predetermined time period is 7 pieces, this would represent a numeric value of 7.

Each of the m pieces of memory-cells controls a current-pulse generation from/to the connected detection-line, $70[0]$, according to the storing data denoted as $M[i,0]$ in this case and input data denoted as $S[i,0]$ of the connected activation-signal-input-line $90[i]$.

For example, a memory-cell holding a data of value "1" generates a current-pulse to the connected detection-line (70) when receiving a pulse-signal from the connected activation-signal-input-line (90). A memory-cell holding a data of value "0" does not generate any current-pulse to the detection-line even if receiving a pulse-signal from an activation-signal-input-line.

So that, the number of current-pulses generated by i-th memory-cell, $10[i,0]$, in the detection-unit-circuit (50) represents the number that is equal to a product of $M[i,0]$ by $S[i]$; i.e., $M[i,0] \times S[i]$.

The generated current-pulses are transmitted and collected through the detection-line, $70[0]$, and then a detection-line-current-read-circuit, $101[0]$, amplifies the pulse-signals and sends them to the counting-circuit (207), in a manner of a sequence of pulses. The maximum number of the total pulse-signals sent to the counting-circuit would be equal to the summation of all the $M[i,0] \times S[i]$ for all the integer i from 0 to (m−1).

To equalize the number of pulses flowing in the detection-line (70) to the pulse-signal counts that are generated by the memory-cell, it is effective to control timing of the pulse-signals which are transmitted through the activation-signal-input-lines to make each of the pulses not being overlapped.

In general, signal strength running through the detection-line (70) is not strong enough for being counted by a digital circuit, so that the matching-degree-determination-circuit #1 is provided with a detection-line-current-read-circuit (101) between the detection-line (70) and the corresponding counting circuit. The detection-line-current-read-circuit has a function of amplifying signal strength in the detection-line with using a threshold voltage (112) delivered by a first-threshold-generation-circuit (111); i.e., the detection-line-current-read-circuit increases each voltage swing of the pulse-signals, and around the peak portion of a pulse, the output voltage would be increased to have such a voltage level indicating a value of "1", but in other parts of the voltage level of them sustains at a level that indicates a value "0".

Then, the counting-circuit at the subsequent stage counts the number of digitalized pulse-signals.

Note that the detection-line-current-read-circuit (101) and the setting of the threshold (112) are needed depending on a circuit scale and a selected type of memory-cells, and are therefore not essential in the present disclosure.

The number of digital pulse-signals is counted per predetermined time period and is therefore a finite value.

In a read operation, some of memory-cells are activated by a word-line and conduct a read-current to each bit-line. This is very well-known operation and may be common for a variety of memories including volatile memories such as SRAM and DRAM, non-volatile memories such as EPROM, EEPROM, and MASK-ROM, new material memories such as FeRAM, ReRAM, PCM, and MRAM, and others.

Most of the cases of new material memories, the activation-signal-input-lines (90) are commonly used in their read/write operations, as their word-lines. Similarly, the detection-lines (70) are used as their bit-lines.

In most memory circuit diagrams, it is common that their word-lines are illustrated as extending to a horizontal direction and their bit-lines to a vertical direction. But, please note that in some of the circuit diagrams referenced in the embodiments of the present disclosures, their memory circuit diagrams are illustrated as being rotated counterclockwise by 90 degrees from the usual illustration.

The embodiments of the present disclosure are able to use a memory-cell of Binary CAM as illustrated in FIG. 5A and a half-cell of Ternary-CAM. In the case of using the memory-cells of such CAMs, the activation-signal-input-lines (90) of FIG. 5A correspond to Search-Lines that transmit data meaning a search-key in searching, and the detection-lines (70) that correspond to Match-Lines.

The drawings illustrating the embodiments of the present disclosure have the same vertical and horizontal arrangement as in a typical circuit diagram for the memory-cells of CAMs, and are not subjected to a counterclockwise rotation by 90 degrees.

(Counting of Degree of Similarity)

The following describes the concept of counting of degree of similarity of the present disclosure in detail.

Here, such a case is supposed that a memory-cell, $10[i,0]$, in a detection-line, $70[0]$, is receiving $S[i]$ pieces of pulse-signals, meaning a data S[i], from a connected activation-signal-input-line, 90[i], in a predetermined time period. The memory-cell is further supposed to have an ability to control whether it generates current to a detection-line, 70[0], or not.

To avoid losing generality, the memory-cell, 10[i,0], is supposed to generates current to the detection-line, 70[0], when the memory-cell stores data that represents value "1", but does not generate when the data is "0". That is because, if the definitions of the stored values are reversed, the description becomes a little complicated.

That may not mean that, the number of current-pulses that pass through the detection-line (70) in the predetermined time period is the same as the total number of the current-pulses which are generated by all the memory-cells sharing the detection-line.

If an activation-signal-input-line transmits a pulse-signal at the same timing as the other activation-signal-input-line does, and if both memory-cells of two activation-signal-input-line happen to store the same data of value "1", two current-pulses have to be generated at the same timing, but both may overlap each other and become one pulse at the detection-line, because both memory-cells share the detection-line. This situation may be regard as representing that a pulse generated by the memory-cell disappears by colliding with another pulse.

If none of current-pulses overlaps, the possible maximum number of current-pulses are transmitted through detection-line.

By contrast, in the case of a memory-cell that stores a data of value "0", the number of current-pulses generated is zero.

Regarding the above relations, the following formula is understood for the memory-cell, 10[i,0], as that:

$$D[0] \circledast S[i] \times M[i,0].$$

Here, the expression of "D[0]" is the number of independent current-pulses passing through a detection-line, 70[0], in the predetermined time period, and S[i] is the number of pulse-signals in the predetermined time period through the activation-signal-input-line (90) that the memory-cell, 10[i,0], is connected. Note again that M(i,0) is the data stored in the memory-cell 10[i,0].

This formula is applicable for all memory-cells coupled to the detection-line (70[0]).

Therefore, in the case that each of the activation-signal-input-lines, 90[i], where i is any of integer from 0 to (m−1), is sending pulse-signals, the possible number of current-pulses passing through the corresponding detection line 70[0], D[0], is evaluated as:

$$D[0] \circledast \circledast \{S[i] \times M[i,0]\}.$$

Where, $\circledast$ is the summation by increasing i from 0 to (m−1).

The condition on which the equality is satisfied in the above formula is that the pulse-signals transmitted through the activation-signal-input-lines, 90[i], i=0 to (m−1), do not overlap each other.

Note that each pulse-signal transmitted through the activation-signal-input-lines, 90[i], where i is any integer from 0 to (m−1), is referred to as being an upward pulse, i.e., value "1" is for activation and value "0" is for inactivation, in order to simplify the description. Even in the following descriptions, pulses will be always upward, without losing generality.

Right side expression of above formula is having a form of inner-product of a vector "S" and a vector "M[0]". Here, "S" is a m-dimensional vector, and each of the components of the vector is the number of pulses passing in the predetermined time period through one of the activation-signal-input-lines 90[i], where i is any integer of 0 to (m−1)). And, "M[0]" is a m-dimensional vector as well, i-th component of which is data of the i-th memory-cell 10[i] in the detection-line 70[0].

The formula expresses that by using the output value of the counting-circuit (207), the inner-product value between vector values is able to be evaluate. An increase in the output value of the counting-circuit is noticed when the inner-product value is increase; the increase of the counting-circuit output is showing an increase of similarity between two vector values, one is represented by the activation-signal-input-lines and the other is by the memory-cells.

In the followings, an event in which a matching-degree-determination-circuit evaluates a high degree of similarity to the activation-signal-inputs through 90[i] will be called an "ignition".

Operation of Matching-Degree-Determination-Circuit #2

The following describes operations of the matching-degree-determination-circuit #2 according to the second embodiment with reference to FIG. 6.

About the matching-degree-determination-circuit #1, each component of the vector "M" is just a one-digit binary number, 0 or 1, stored in a memory-cell, because the unit-storage-circuit (55) consists of memory-cells (10). And, the i-th component of the vector "M" is denoted as the expression M[i,0].

But, in the case of the matching-degree-determination-circuit #2 of the second embodiment, the i-th unit-storage-circuit, 55[i], consists of k pieces of memory-cells, 10[i,j], where j is a representative integer from 0 to (k−1), sharing an activation-signal-input-line, 90[i], commonly, so that each component of the vector "M" becomes a larger integer; e.g., when 3 memory-cells are provided in the unit-storage-circuit, the unit-storage-circuit may express an integer from 0 to 7.

The generated current-pulses from the unit-storage-circuit (55) are sent to the counting-circuit (207) by using k sets of the detection-lines, 70[j], where j is a representative integer from 0 to (k−1); i.e.; each of the memory-cells in the unit-storage-circuit (55) sends their current-pulses to a different detection-line which is connected to the memory-cell.

As the detection-line, denoted by 70[0], transmits current-pulses as is evaluated by a formula $D[0] \circledast \circledast \{S[i] \times M[i,0]\}$, the j-th detection-line which is denoted by 70[j] transmits as many current-pulses as evaluated by a following formula:

$$D[j] \circledast \circledast \{S[i] \times M[i,j]\}.$$

Here, $\circledast$ is a summation by increasing i from 0 to (m−1).

Here, again, the i-th unit-storage-circuit, 55[i], where is an integer from 0 to (m−1), is regarded as storing data of value M[i,j] for the detection-line, 70[j], by using the memory-cell (10[i,j], i=0 to (m−1), j=0 to (k−1)).

Here, the counting-circuit is supposed to perform the multiply-sum operation for each D[j] to generate an output denoted as "p", by multiplying each D[j] by 2 to the power of j; i.e., 2j. Then, the output, P, of the counting-circuit is evaluated in the following formula:

$$P \circledast \circledast \circledast \{S[i] \times M[i,j] \times 2j\}.$$

Here, $\circledast \circledast$ is a double summation by increasing i from 0 to (m−1), and by increasing j from 0 to (k−1).

The above noted "2 to the power of j; 2j" is an example for the "predetermined weight coefficient" that is referred in the claim 1, and that is for the (j−1)-th row. The present disclosure, however, does not exclude the other weight coefficients.

In this connection, by multiplying each component of the vector "M" by the coefficient "2 to the power of j; 2j", the data of the unit-storage-circuits (55) represents a binary number, again. Therefore, it is useful in using the framework of well-known digital computation.

As described above, the counting-circuit in the matching-degree-determination-circuit #2 illustrated in FIG. 6 has a function of calculating the inner-product of two vectors represented by the input pulse-signals from the activation-signal-input-lines (90) and the vector value represented by the data stored in the memory-cells of the first-storage-circuit (40).

Operation of Determination Circuit

In both cases of the matching-degree-determination-circuit #1 and of the matching-degree-determination-circuit #2, an output of the counting-circuit (207) is compared with the threshold-value stored in the second-storage-circuit (200) by the determination-circuit (290).

By storing an expected value for the inner-product in the second-storage-circuit in advance, the determination-circuit is able to put out a signal that means that the inner-product has exceeded the threshold-value.

In the present description, an output value of "1" from the determination-circuit is referred to as corresponding to a signal which indicates that the output of the counting-circuit has exceeded the threshold-value, without losing generality.

In addition, the state in which the "matching-degree-determination-circuit #1, #2" outputs value "1" is referred to as an "ignition".

Matching-Degree-Determination-Circuit #3 According to Third Embodiment

FIG. 7 is a schematic block diagram of a matching-degree-determination-circuit #3 according to a third embodiment.

In the present embodiment, Flash EEPROM is used as the memory-cells in the first-storage-circuit. Alternatively, as the memory-cells of the present embodiment, other memory-cells are usable, as long as they "have a function of conducting current from a bit-line according to selection of a word-line," including DRAM or SRAM.

In the present embodiment, the activation-signal-input-lines (90) correspond to the word-lines of Flash EEPROM memory-cells, and the detection-lines (70) correspond to bit-lines thereof.

Each of the word-lines is coupled to the gate electrodes of memory-cells, and each of the bit-lines is coupled to the drain electrodes of the memory-cells.

Circuits to control read/write operations on to the memory-cells and their controls are well-known techniques, and are therefore not illustrated in the drawings to avoid complexity of illustration.

Matching-Degree-Determination-Circuit #4 According to Fourth Embodiment

FIG. 8 is a schematic block diagram illustrating a matching-degree-determination-circuit #4 according to a fourth embodiment.

In the matching-degree-determination-circuit #4, an output-data-storage-circuit receives a signal (260) indicating that the counting-circuit has exceeded the threshold-value, and successively outputs the stored data of the output-data-storage-circuit.

Approximate-Search-Circuit #1 According to Fifth Embodiment

FIG. 9 is a schematic block diagram illustrating an approximate-search-circuit #1 according to a fifth embodiment.

The approximate-search-circuit #1 (11) includes n sets of matching-degree-determination-circuits, each of which has any feature of matching-degree-determination-circuit #1, matching-degree-determination-circuit #2, and matching-degree-determination-circuit #3, and further includes such common circuits such as an activation-line-driving-circuit (155), first-threshold-generation-circuit (111), first-control-circuit (120), and read/write-circuit-for-second-storage-circuit (570).

The matching-degree-determination-circuit (9) in FIG. 9 is any of the matching-degree-determination-circuit #1, matching-degree-determination-circuit #2, and matching-degree-determination-circuit #3.

The activation-line-driving-circuit (155) generates a signal for each activation-signal-input-line (90) on the basis of input-signals (80) received from the outside, and sends the signals as input-signals to the matching-degree-determination-circuits.

The first-threshold-generation-circuit (111) sets a threshold (112) for the detection-line-current-read-circuit (101) of each matching-degree-determination-circuit.

The read/write-circuit-for-second-storage-circuit (570) receives a signal from the first-control-circuit (120) and performs data read and write on the second-storage-circuit (200) of each matching-degree-determination-circuit.

The first-control-circuit (120) also controls the counting operation of the counting-circuit (207). In addition, the first-control-circuit (120) controls the counting-circuit (207), second-storage-circuit (200), and read/write-circuit-for-second-storage-circuit (570) for second-storage-circuit in order to set and control the operational mode of the whole approximate-search-circuit #1 (11).

In FIG. 9, the block diagram is from the matching-degree-determination-circuit #2, as an example, but that is able to be replaced with another type of the matching-degree-determination-circuits disclosed here.

In addition, well-known circuits like read/write operation circuits to the first-storage-circuit (40), bit-lines, and word-lines are not illustrated in the drawings to avoid complexity of illustration, because they are not the essence of the present disclosure.

Each matching-degree-determination-circuit receives signals from each activation-signal-input-line (90[i], i=0 to (m−1)). And each matching-degree-determination-circuit performs ignition when it detects that a degree of similarity has exceeded the threshold-value sent from the second-storage-circuit.

Each of the matching-degree-determination-circuits produces an inner-product differently depending on their first-storage-circuit data and their second-storage-circuit data. Thus, each of the matching-degree-determination-circuits performs ignition in different manner.

From such differences, especially in ignition timing, it is able to be confirmed from the determination-result-outputs (260[0] to 260[n−1]) which of the matching-degree-determination-circuits provides the highest degree of similarity to the data represented by the input-signals (80[0] to 80[m−1]).

Setting Mode (Setting Value to Second-Storage-Circuit)

Both the matching-degree-determination-circuit and the approximate-search-circuit have at least a setting-mode, a counting-mode, and a maintenance-mode, all of which are controlled by the first-control-circuit (120) that operates according to a control-signal-input (153) from the outside.

During the counting-mode, each of the matching-degree-determination-circuits produces an inner-product by receiving the activation-signal-inputs through the activation-signal-input-lines and determines whether to put out an ignition-signal or not, as were described previously.

In the maintenance-mode, data is read from and written to the first-storage-circuits (40), second-storage-circuits (200), and ignition-cells (530).

In the setting-mode, operations of the counting-circuits (207) and second-storage-circuits (200) are very different from their operations during the counting-mode, which will be described below.

The setting-mode is to set data in the storage circuits of the second-storage-circuits (200). There are two ways at least for the setting operation.

The first way is to write data from a second-read/write-signal (210) to the second-storage-circuit (200) under the control of the first-control-circuit (120). In this write operation, the write data is sent to the second-read/write-signal (210) via the read/write-circuit-for-second-storage-circuit (570).

To describe this way of setting more specifically, the first-control-circuit (120) selects the second-storage-circuit (200) of the matching-degree-determination-circuits, and makes the second-storage-circuit (200) store the input data from the second-read/write-signal (210) by sending control signals to the selected circuit and to the read/write-circuit-for-second-storage-circuit (570). The first-control-circuit (120) may also make the second-storage-circuit (200) put out the data stored therein from the second-read/write-signal (210) by sending other signals to the second-storage-circuit (200) and the read/write-circuit-for-second-storage-circuit (570).

In the second way, the following operation is performed;

At the first stage, pulse-signals are sequentially applied from the outside to the activation-signal-input-lines (90) of the first-storage-circuit (40) such that the pulse-signals do not overlap each other, and generated current-pulses to the detection-lines are counted by each counting-circuit (207) in the matching-degree-determination-circuits (90).

At the second stage, the counting result of each counting-circuit (207) is written to the corresponding second-storage-circuit (200) by sending control signals to the counting-circuit (207) and the second-storage-circuit (200).

The above first to second stages may not necessarily be operated in divided different operation cycles. The term of "stage" merely expresses the operation flow in the above expressions.

In the course of the second way operations, the number of memory-cells which have value "1" is stored in each of the second-storage-circuits (200) in the first-storage-circuit (40).

Counting operation by the counting-circuit (207) is obtained by incrementing when each of the m activation-signal-input-lines (90) is activated only once. Therefore, the counted value by each counting-circuit (207) is equal to the number of memory-cells (10) which tore the value "1".

Counting Mode

In the counting-mode, each degree of similarity is evaluated for stored data in each matching-degree-determination-circuits with the input data though the activation-signal-input-lines (90), and when the degree of similarity exceeds data from the second-storage-circuit, an ignition-signal is put out through the determination-result-output (260) of the matching-degree-determination-circuit.

Then, the counting-circuit (207) counts current-pulses generated by memory-cells (10) or by unit-storage-circuits (55), and the determination-circuit (290) compares the value generated from the count with the value stored in the second-memory-circuit (200).

The determination-circuit (290) should better be designed to make the above determination using the stored value itself of the second-storage-circuit (200) or a value generated based on the stored value as a threshold.

Configuration of Counting-Circuit

FIG. 16 is a block diagram illustrating the internal configuration of the counting-circuit (207), which is a principal component of the matching-degree-determination-circuit of the present disclosure, and the connection relationships between the counting-circuit and the other circuits for the counting operations.

In FIG. 16, it is assumed that the "k value" representing the number of detection-unit-circuits (50) in a matching-degree-determination-circuit, is "3".

It is also assumed that, with respect to a value corresponding to the "predetermined weight coefficient for the detection-line" of claim 1, a value of "1" is set for the detection-line (70[0]), a value of "2" for the detection-line (70[1]), and a value of "4" for the detection-line (70[2]).

The counting-circuit (207) is made up of a counting-circuit-former-circuit (208) and a counting-circuit-latter-circuit (209), and has the following functions:

[1] The counting-circuit-former-circuit (208) receives three outputs from the detection-line-current-read-circuits (101) each of which amplifies current-pulses from detection-lines, and treat them as each digit of a 3-digit binary number so that the amplified signal of 70[0] is treated as the lowest-digit, that of 70[1] as the middle-digit, and that of 70[2] as the highest-digit of the 3-digit binary number.

[2] The counting-circuit-former-unit (208) accumulates the input 3-digit binary number one by one, and when a signal which represents the highest-digit toggles, the counting-circuit-former-unit transmits the signal to the shift-register-control-circuit (203) in a counting-circuit-latter-unit (209).

[3] In the counting-circuit-latter-unit (209), the shift-register-circuit (202) shifts the value of each segment register to a connected higher segment one each time when the highest-digit is toggled, to thereby increase the count-value.

In the course of stage [2], with respect to the accumulation of each digit of the 3-digit binary number, each digit of the 3-digit binary number is accumulated respectively, and the second digit of the pulse-count obtained from 70[0] is added to the pulse-count obtained from 70[1], and the second digit of the pulse-count obtained from 70[1] and third digit of the pulse-count obtained from 70[0] are added to the pulse-count obtained from 70[2].

Therefore, in the above-described counting-circuit-former-circuit (208), the pulse-count from 70[2] is multiplied by a coefficient of 4, the pulse-count from 70[1] is multiplied by a coefficient of 2, and the pulse-count from 70[0] is multiplied by a coefficient of 1, and these three counted numbers are added.

In addition, in the course of stage [2], the highest-digit is applied as a one-bit signal to the shift-register-circuit (202). By doing so, the digits other than the highest digit are truncated in the operation of the counting-circuit-latter-circuit (209) and remain in the counting-circuit-former-circuit (208); That is for the effect to reduce the circuit scale of the counting-circuit-latter-circuit (209).

Configurations of Counting-Circuit, Second-Storage-Circuit and Determination Circuit FIGS. 17 and 18 are block diagrams illustrating the internal configurations of the counting circuit (207), the second-storage-circuit (200), and the determination-circuit (290), which are principal circuits for forming the matching-degree-determination-circuit of the present disclosure.

Counting-Input (201) which is put in to a shift-register-control-circuit (203) from the left part of FIGS. 17A and 17B is an output from the counting-circuit-former-circuit (208). In the case where Shift-Forward (598) has value "1" and Shift-Reversely (599) has value "0", data of the flip-flops (FFs) in SRU made up of SRU[0] to SRU[x−1] is shifted from the left to the right, and value "1" is newly set in the FF of the left-end SRU.

For example, consider a flip-flop (FF in SRU[0]) made up of G213 and G214. The value "1" in this FF indicates the situation where the right-side-node (212) is set to a high-voltage-level and the left-side-node (211) is set to a low-voltage-level.

In addition, in the case where Shift-Forward (598) has Value "0" and Shift-Reversely (599) has value "0", data of the FFs in the SRU made up of SRU[0] to SRU[x−1] is shifted from the right to the left, and value "0" is set in the FF of the right-end SRU[X−1].

Note that a value of the second-storage-circuit (200) may be written in the flip-flops (FFs) in the shift-register-circuit (202).

For example, assuming that the second-storage-circuit (200) is reset and the data value stored therein is thereby "all zeros", the right-side nodes of all flip-flops go to a low-voltage-level. When the data value is written in the shift-register (202), all FFs in the shift-register-circuit are set to value "0".

When the second-storage-circuit (200) is reset and all the stored data has "all zeros" and the data is written in the shift-register (202), all the FFs in the shift-register are set to value "0". When toggling of Counting-Input (201) starts in this state with Shift-Forward (598) having value "1" and Shift-Reversely (599) having value "0", value "1" is set in as many FFs of SRU[0] to SRU[x−1] as the count-value, in order from the left end FF, and value "0" is set in the remaining FFs of SRU[0] to SRU[x−1] on the right side of the FFs having value "1".

That is, the shift-register (202) is incremented to thereby indicate the count-value.

The determination-circuit (290) includes a delay circuit made up of two-input NANDs and inverters. In a section corresponding to value "1" in the shift-register, two-input NANDs function as inverters. In a section corresponding to the border between value "1" and value "0", a signal of a low-voltage-level is received via a two-input NAND from the shift-register (202), and a signal of a high-voltage-level is received in the other region. Therefore, the determination-result-output (260) has a low-voltage-level.

Therefore, a pulse-count counted in the setting-mode is stored in the second-storage-circuit (200) of FIG. 18, and the data is also written in the FFs of the shift-register. After that, the toggling of Counting-Input (201) starts with Shift-Forward (598) having value "0" and Shift-Reversely (599) having value "1". When the toggling is repeated as many times as the number of write times in the second-storage-circuit (200), all the FFs in the shift-register (202) have value "0" again, and the determination-result-output (260) has a high-voltage-level.

This state is regarded as an ignition to be put out from the matching-degree-determination-circuit, which indicates that the degree of similarity has reached the value set in the second-storage-circuit.

Configuration of Counting-Circuit Using Counter-Circuit

FIG. 19 illustrates an example in which the counting-circuit-latter-circuit of the counting-circuit (207) is used in the matching-degree-determination-circuit of the present disclosure.

The counting-circuit-former-circuit (208) has the same configuration as in the example configuration represented by FIG. 16, but the counting-circuit-latter-circuit (209) is different from the one in the FIG. 16.

The second-storage-circuit partly has the same configuration as the one in FIG. 16, too.

FIG. 20 illustrates an example of the configuration of a counter-circuit.

The following describes the operations of the counter-circuit in the setting-mode and the counting-mode with reference to FIGS. 20 and 21.

As in the case of FIG. 16, assume here that the "k value" representing the number of detection-unit-circuits (50) is "3".

The counter-circuit consist of Y sets of counter-units, denoted by CU[0] to CU[Y−1], to represent a number up to "2 to the power of (Y)" that is a Y-digit binary number. However, to enable the counter-circuit to do both counting-up and counting-down increases the number of elements.

In the setting-mode, first, the first-control-circuit (120) sends a reset-control-signal, RC-Global (307), to write a reset-value to the second-storage-circuit-for-counter-circuit (610).

The operation is simple in the case where the reset-value is all zeros (0000 . . . 0 in binary number) or all ones (1111 . . . 1 in binary number). However, basically, a certain number may be used. For simplifying the description here, assume that the reset-value is all zeros (0000 . . . 0 in binary number) in the following.

Then, the first-control-circuit (120) sends a write-signal, Write-TIM-to-SR (308), to the second-storage-circuit-for-counter-circuit (610) to write values in TIMBU[0:(Y−1]] to the flip-flops (FFs) in the counter-circuits, CU[0:(Y−1]].

Therefore, a value represented by the FFs in the counter-circuits, CU[0:(Y−1]], becomes zeros (0000 . . . 0 in binary number).

Then, a Shift-Forward signal (598) is sent from the first-control-circuit (120) to the counter-circuit (560) for enabling the counter-circuit to count the signal from the input (524), and such pulse-signals are sequentially applied to the activation-signal-input-lines (90) one by one such that the pulse-signals do not overlap each other.

The counting-circuit-former-circuit (208) accumulates the numbers, by multiplying a pulse-count from 70[2] by a coefficient of 4, by multiplying a pulse-count from 70[1] by a coefficient of 2, and by multiplying a pulse-count from 70[0] by a coefficient 1.

Then, in the next stage of the processing of the counting-circuit-former-circuit (208), the highest digit (524) is sent to the Counting-Input (201) as an input-signal to the counter-circuit (560). Therefore, the digits other the highest digit are truncated and they remain in the counting-circuit-former-circuit (208).

Since being supplied with the Shift-Forward (598) signal from the first-control-circuit (120), the counter-circuit (560) counts up its own value each time when the Counting-Input (201) toggles.

When all the activation-signal-input-lines (90) have been sequentially selected and all the generated current-pulses from the memory-cells which store value "1" have been counted completely and respectively by the counter-circuit (560), the first-control-circuit (120) sends a signal, Write- SR-to-TIM (309), and transports register values in the counter-circuit (560) to the second-storage-circuit (560).

Then, the setting-mode is completed.

Counting Mode

The following describes operations in the counting-mode with reference to FIGS. 19 and 20.

Note that, unlike in the setting-mode, during operations in the counting mode, the first-control-circuit (120) sends a Shift-Reversely (599) signal instructing count-down, so that the counter starts reverse rotation.

Input signals are applied from the outside and put in to the input-lines (80) as input data, and the pulse-signals are sent through the activation-signal-input-lines (90) to memory-cells, which generates current-pulses and send them through the detection-lines (70) and the detection-line-current-read-circuits (101) to the corresponding counting-circuit-former-circuit (208) that then counts up to produce a binary number, as described previously.

Since the counter rotates reversely from that does in the setting-mode, the counter decrements the value, starting with the value written from the second-storage-circuit-for-counter-circuit (610).

When as many pulse-signals as set up by using the second-storage-circuit-for-counter-circuit (610) have been counted up, the value in the counter-circuit (560) returns to the initial-value with all zeros (0000 . . . 0 in binary number).

When the value of the counter-circuit is returned to the initial-value with all zeros (0000 . . . 0 in binary number), the determination-circuit (543) switches its output from low-voltage-level to high-voltage-level, and outputs a signal indicating a high degree of similarity between the input data represented by the time series of activation-signals input from the outside and the stored data in the matching-degree-determination-circuit from the determination-result-output terminal (260).

In the above description, the counting-circuit-former-circuit (208) ignores digits less than the third digit in the value obtained by performing a product operation by a coefficient and a sum operation of the products. Therefore, a difference up to value 7 may occur between the counting values of the setting-mode and counting-mode. However, this difference is regarded as an allowable error in this embodiment.

Approximate-Search-Circuit #2 According to Sixth Embodiment

FIG. 10 is a schematic block diagram illustrating an approximate-search-circuit #2 according to a sixth embodiment.

The approximate-search-circuit #2 further includes a vertically-output-detection-circuit (534) and a timer-circuit (116) in addition to the configuration of the approximate-search-circuit #1, and is provided with a second-control-circuit (119) in place of the first-control-circuit (120).

A circuit to control read and write operations on the first-storage-circuit (40), and bit-lines and word lines used for the operations are well-known, and are therefore not illustrated to avoid complexity of illustration.

As for the matching-degree-determination-circuits, the matching-degree-determination-circuits #2 are illustrated here by way of example. Alternatively, the matching-degree-determination-circuits #1 or the matching-degree-determination-circuits #3 may be used.

Operation of Control-Circuit Based on Signal of Vertical-Output-Detection-Circuit The vertical-output-detection-circuit (534) receives, as inputs, each of the determination-result-outputs (260), which are outputs of the matching-degree-determination-circuits #2, via ignition-cells (530), and puts out an integrated-ignition-signal (533), when any of the matching-degree-determination-circuits puts out its ignition signal. That is possible when the vertical-output-detection-circuit (534) provides a similar connection with each ignition-cells to a matching-determination-circuit providing connection with memory-cells therein.

The vertical-detection-line (531) of the vertical-output-detection-circuit (534) plays the role of the detection-line for the matching-determination-circuit. Here a high-voltage-level of the integrated-ignition-signal is assumed as meaning that any of the matching-degree-determination-circuits has put out its ignition signal.

When no ignition-cell does perform ignition, the integrated-ignition-signal (533) has a low-voltage-level.

Receiving the integrated-ignition-signal (533) from the vertical-output-detection-circuit (534), signals from timer-circuit (116), and a control-signal-input (153), the second-control-circuit (119) has ability to control the read/write-circuit-for-second-storage-circuit (570), the second-storage-circuits (200), and counting-circuits (207), as will be described below.

Receiving the integrated-ignition-signal (533) from the vertically-output-detection-circuit (534), signals from timer-circuit (116), and a control-signal-input (153), the second-control-circuit (119) provide such controlling abilities to the read/write-circuit-for-second-storage-circuit (570), to the second-storage-circuits (200), and to counting-circuits (207), as is explained in followings.

[1] When the second-control-circuit (119) receives an integrated-ignition-signal (533) with its high-voltage-level or a signal indicating timeout from the timer-circuit (116), it rewrites the stored values of the FFs in the shift-register-circuits (202) of the matching-degree-determination-circuits with the respective stored values of the corresponding second-storage-circuits to reset the count-values of the counting-circuits, thereby restarting the predetermined period of time.

[2] When the second-control-circuit (119) receives an integrated-ignition-signal (533) with its high-voltage-level or a signal indicating timeout from the timer-circuit (116), it instructs to forcibly decrease the count-values in all matching-degree-determination-circuits by one step.

[3] The second-control-circuit (119) controls the predetermined time period using a signal of control-signal-input (153) from the outside, without the need of the vertically-output-detection-circuit or timer-circuit.

The signal of control-signal-input (153) from the outside may be a signal with a plurality of bits or may be an ignition-signal of another approximate-search-circuit.

This is because the vertically-output-detection-circuit (534) has the configuration of a matching-degree-determination-circuit.

The ignition-cell (530) has a similar type of configuration to the memory-cell (10), and it is possible to forcibly keep the "non-ignition" state according to the data stored in the ignition-cell.

Circuits or connections relating to read and write operations on the ignition-cells (530) are not illustrated in any drawings for simplifying the illustrations, because such read/write circuits are well-known.

The vertical-detection-line-read-circuit (532) is a typical sense amplifier circuit as exemplified in FIGS. 4A to 4C, as with the detection-line read circuit. A circuit to set a threshold (114) for it is a third threshold circuit (113).

Approximate-Search-Circuit #3 According to Seventh Embodiment

FIG. 11 is a schematic block diagram illustrating an approximate-search-circuit #3 according to a seventh embodiment.

The approximate-search-circuit #3 of the present embodiment is provided with activation-line-signal-generation-circuit (156) and activation-control-signals (85[0:(Z−1)]), in the place of the activation-line-driving-circuit (155) and the input-signals (80[0:(m−1)]) which are provided in the approximate-search-circuit #2 (FIG. 9), respectively, and is additionally provided with pulse generation-circuits (535) between the output of each matching-degree-determination-circuit (2) and an ignition-cell (530).

Receiving control-signals (152) from the third-control-circuit (118) and activation-control-signals, 85[0:(Z−1)], the activation-line-signal-generation-circuit (156) generates time-series pulse-signals for the activation-signal-input-lines, 90[0:(m−1)], such as not to make the output pulse-signals overlap each other, but to make the activation-signal-input-lines keep original information delivered from the activation-control-signals, 85[0:(Z−1)].

Circuits to control read and write operations to the first-storage-circuit (40) and bit-lines and word-lines used for such operations are well-known, and are therefore not illustrated to avoid complexity of illustration.

In the approximate-search-circuit #3 of the present embodiment, configured with the above modifications, signals input from the outside need not be pulse-signals, because they are generated by the activation-line-signal-generation-circuit (156).

Each pulse generation-circuit (535) is formed by combining a delay-circuit with a well-known simple logic circuit for generating a small pulse signal. In the activation-line-signal-generation-circuit (156), a similar pulse generation circuit may be used for generating the pulse-shaped activation-line-signals, 9 90[0:(m−1)].

Each signal of the activation-signal-input-lines (90) qualitatively has the following three types of information:
  pulse-signal density per a predetermined time period; and
  timing to change the pulse-signal density "from sparse to dense;" or
  timing to change the pulse-signal density "from dense to sparse."

In general, the number of activation-control-signals, 85[0:(Z−1)], is greater than the number of activation-signal-input-lines, 90[0:(m−1)], usually.

Approximate-Search-Circuit #4 According to Eighth Embodiment

FIG. 12 is a schematic block diagram illustrating an approximate-search-circuit #4 according to an eighth embodiment.

FIG. 12 schematically illustrates connections of the control-signals from the second-control-circuit (119) to the counting-circuits (207) in each matching-degree-determination-circuit, and signal-lines, named "TIM-GBL", used for transferring data between the read/write-circuit-for-second-storage-circuit and each second-storage-circuit (200) in the matching-degree-determination-circuits. Local signal connections for transmitting the TIM-GBL in each matching-degree-determination-circuit, named "TIM-LBL", are shown in FIGS. 16, 17, and 18.

The present embodiment uses a cross-point type memory-cell for each of the memory-cells of the first-storage-circuits (40).

The cross-point type memory-cells enable bidirectional operations between an activation-signal-input-line (90) and a detection-line (70), so that data of the memory-cell is able to be read from both vertical direction and horizontal direction.

The control-signal-lines sent from the second-control-circuit (119) include the following at least;
  TIMA-Global (305) for access control of the second-storage-circuit (200 or 610).
  SRA-Global (306) for access control access of the shift-register-circuit (202) or counter-circuit (560).
  RC-Global (307) to reset stored data of the second-storage-circuit.
  Write-TIM-to-SR (308) for instructing write-operations onto stored data of the second-storage-circuit to the shift-register-circuit (or counter-circuit).
  Write-SR-to-TIM (309) for instructing write-operations onto data stored in the shift-register-circuit (or counter-circuit) to the second-storage-circuit.
  Read-Control-Signal (288) for instructing read-operations onto data stored in the second-storage-circuit (200 or 610) to the read/write-circuit-for-second-storage-circuit (570).
  Write-Control-Signal (289) for instructing write-operations onto data in the read/write-circuit-for-second-storage-circuit (570) to the second-storage-circuit (200 or 610).
  Shift-Forward (598) for instructing the shift-register-circuit (or counter-circuit) to do its count-up operation.
  Shift-Reversely (599) for instructing the shift-register-circuit (or counter-circuit) to do its count-down operation.

Approximate-Search-Circuit #5 According to Ninth Embodiment

FIG. 13 is a schematic block diagram illustrating an approximate-search-circuit #5 according to a ninth embodiment, which is based on a matching-degree-detection-circuit #5 (5).

As compared with the approximate-search-circuit #3 illustrated in FIG. 11, the approximate-search-circuit #5 of this embodiment does not include the first-threshold-generation-circuit (111), but instead, additionally includes third-storage-circuits (45), activation-signal-lines (91) to the third-storage-circuits, an activation-line-driving-circuit-2 (155[1]), and input-signals, 81[0:(m2−1)].

Many of the control-signal-lines from the second-control-circuit (119) are neglected in the FIG. 13, for simplifying the illustration.

By providing the third-storage-circuit (45), each of the matching-degree-detection-circuits has additional unit-storage-circuits, 55[0:(m2−1)], and related detection-lines (71) in it.

Circuits relating to read and write operations on memory-cells of the first-storage-circuit (40) and third-storage-circuit (45) are well-known and are therefore not illustrated.

When activation pulses are applied to some of the activation-signal-input-lines, 90[0:(m2−1)], current-pulses are conducted to the detection-lines (71) of the third-storage-circuit (45) according to the stored data of the memory-cells of the third-storage-circuit (45). These current-pulses restrain the detection of current-pulses from the first-storage-circuit by the detection-line-current-read-circuits (101), and therefore have a function of forcibly restraining the similarity detection of the matching-degree-detection-circuits #5 (5).

This function is effective in imitating the operation of a neuron circuit.

The detection-line-current-read-circuit (101) of each matching-degree-detection-circuit #5 (5) needs to have a circuit configuration to detect a difference in current between the detection-line (70) and the detection-line (71), and for example, the differential type current sense amplifier exemplified in FIG. 4B is used as the detection-line-current-read-circuit (101).

The effect of restraining the detection of current-pulses from the first-storage-circuit by the current of the second detection-line (71) depends greatly on the transistor size ratio of Q41 and Q42 of the read circuit of FIG. 4B. In the case of imitating the operation of a neuron circuit, the gate width of the transistor of Q42 is less than that of Q41.

Approximate-Search-Circuit #6 According to Tenth Embodiment

FIG. 14 is a schematic block diagram illustrating an approximate-search-circuit #6 according to a tenth embodiment.

In addition to the components of the approximate-search-circuit #5 illustrated in FIG. 13, the approximate-search-circuit #6 of this embodiment additionally includes
second-detection-line-current-read-circuits (102) each corresponding to a detection-line (71) to amplify input current-pulses from a detection-line (71),
second-counting-circuit-former-circuits (206) that each count the number of current-pulses output from a second-detection-line-current-read-circuit (102),
an address-encoder-circuit (591) that encodes the physical addresses of the matching-degree-detection-circuits on the basis of outputs (260) from the pulse generation-circuits (535), and an output circuit (593) that outputs the physical-addresses, and
an I/O-circuit-for-second-storage-circuit (258) coupled to the read/write-circuit-for-second-storage-circuit.

In this connection, each matching-degree-detection-circuit that forms this approximate-search-circuit #6 additionally includes the second-detection-line-current-read-circuits (102) for detecting current-pulses from the corresponding detection-line (71) in the memory-matrix of the third-storage-circuit (45). Therefore, it is called a matching-degree-detection-circuit #6 (6).

Circuits relating to read and write operations to the memory-cells of the first-storage-circuit (40) and third-storage-circuit (45) are well-known and are therefore not illustrated.

The matching-degree-detection-circuit #6 additionally includes the second-detection-line-current-read-circuits (102) for detecting current-pulses from the detection-lines (71), and the counting operation in the shift-register-circuit is performed as the pulse-counts from the detection-line-current-read-circuits (101) contribute to the count up or Shift-Forward, and the pulse-counts from the second-detection-line-current-read-circuits (102) contribute to the count down or Shift-Reversely.

In addition, in the approximate-search-circuit #6, the physical-address of a matching-degree-detection-circuit #6 that provides the highest degree of similarity is encoded, and is output from the address-output-circuit (593).

Approximate-Search-Circuit #7 According to Eleventh Embodiment

FIG. 15 is a schematic block diagram illustrating an approximate-search-circuit #7 according to an eleventh embodiment.

As compared with the approximate-search-circuit #6 illustrated in FIG. 14, the present embodiment has the following changes:
The number of sets each including a first-storage-circuit (40) and an activation-line-driving-circuit 1 (155[0])) is increased to three sets, a set of 40[0] and 155[0], a set of 40[1] and 155[1], and a set of 40[2] and 155[2]. Due to this change, the name of an activation-line-driving-circuit coupled to the third-storage-circuit (45) is changed from the activation-line-driving-circuit 2 (155[1]) of FIG. 14 to an activation-line-driving-circuit D (155[3]) of FIG. 15.
The vertically-output-detection-circuit (534) provided in the approximate-search-circuit #6 is replaced with an additional approximate-search-circuit #4 (14), which consists of activation-line-driving-circuit-E, a first-storage-circuit-E (40[4]), detection-line-current-read-circuits-E, counting-circuits-E, second-storage-circuits-E, determination-circuits-E, and a vertically-output-detection-circuit-E.
Functions of the output-data-storage-circuit (46) are replaced with an additional memory-circuit consisting of a fourth-storage-circuit (47), a word-selection-circuit (48), and a read-circuit (49).
Some of the inputs to the activation-line-driving-circuits (155[0], 155[1], and 155[2]) and to the control-circuit (120) are applied from the outputs of the additional approximate-search-circuit #4. And, Outputs from the approximate-search-circuit #7 are taken from the outputs from the read-circuit (49).

The illustration of in-word peripheral circuits of the matching degree determination group forming the approximate-search-circuit including the first-storage-circuit-A (40[0]), first-storage-circuit-B (40[1]), first-storage-circuit-C (40[2]), and third-storage-circuit (45) is simplified to avoid complexity of the illustration.

The main components include null-control-bits (813), counting-circuits-A (207), second-storage-circuits-A (200), determination-circuits-A (290), the first-control-circuit (120), the read/write-circuit-for-second-storage-circuit (570), and the I/O-circuit-for-second-storage-circuit (258).

Here, the first-control-circuit (120) generates control-signals for the counting-circuits-A (207) and second-storage-circuits-A (200) on the basis of an output signal of the approximate-search-circuit #4 (14) and control-signal-input (153) from the outside.

During the approximate search operation, the approximate-search-circuit #4 (14) in the approximate-search-circuit #7 (17), which evaluates the output-signal-pattern from the determination-circuit-E (290) with reference to the first-storage-circuit-E (40[4]), generates a physical-address of the first-storage-circuit-E (40[4]) as the data of the address having the highest similarity to the input to the activation-line-driving-circuit-E (155[4]), and the memory-circuit, which consists of the fourth-storage-circuit (47), the word-selection-circuit (48), and the read-circuit (49) puts out data stored in the fourth-storage-circuit (47) as outputs of the approximate-search-circuit #7 (17).

In these connections and configurations, common circuits including the second-control-circuit for the approximate-search-circuit #4 (14), the read/write-circuit for each storage-circuits (40), are not illustrated to avoid complexity of illustration.

Receiving data from the input-signal [system A] and input-signal [system B], and having feedback information, 92[0:(m3−1)], as inputs to the activation-line-driving-circuit-C (155[2]) and D (155[3]), the approximate search repeats its operations autonomously and puts out data from the fourth-storage-circuit (47). That will be explained in next.

Conceptual Diagram of Approximate-Search-Circuit that Outputs Time-Series Information The generation of a time-series signal by an approximate-search-circuit will be described with reference to FIGS. 22A, 22B, 23, and 24.

FIGS. 22A and 22B are conceptual diagrams of core circuit parts of an approximate-search-circuit and its symbol diagram.

To simplify the description, the approximate-search-circuit described in FIGS. 22A and 22B does not include the third-storage-circuit for restraining operations, but includes only three blocks as for the first-storage-circuits (40); Two of three blocks consist of 16 rows by 6 columns, and remaining one consists of 16 rows by 16 columns.

The unit (55) is a previously explained unit-storage-circuit, which stores a binary number. Each of DL[j:0 to 15]] does not indicate a detection-line but indicates a group of detection-lines in a matching-degree-determination-circuit conceptually.

Therefore, the total number of detection-lines represented in FIGS. 22A and 22B has to be expressed by 16×k, actually, but in this case the number of k is assumed to be 1, for simplifying the explanation.

The total number of outputs is 16; i.e., 99[0] to [15].

Note that, since FIGS. 22A and 22B are conceptual diagrams, many components in a matching-degree-determination-circuit, such as the detection-line-current-read-circuits, the counting-circuit, the second-storage-circuit, and the determination-circuit are not illustrated, here. And, many peripheral components in an approximate-search-circuit are not illustrated, neither.

But instead, the read/write-circuit-for-second-storage-circuit, and a word-selection-circuit (812) for accessing memory-cells for having read and write operations are illustrated. The number of word-lines is 16, because of k=1.

The memory-cell is assumed to be a kind of cross-point cell, as is illustrated in FIG. 12, so that a detection-line and the word-line share and use a common wiring running horizontally through three first-storage-circuits.

Various modifications are possible as for circuit layout and arrangement about FIGS. 22A and 22B, so that the FIGS. 22A and 22B are described as representing all such modifications.

In general, a composite memory circuit having the structure allowing a feedback input as illustrated in the conceptual diagrams of FIGS. 22A and 22B has the functions and ability of outputting time series signals, because outputs become new inputs that are different from previous ones. Therefore, once data are set in the activation-driving-circuit A or B, that outputs of the approximate-search-circuit and inputs to the activation-driving-circuit FB are further updated, and the approximate-search-circuit repeats such output updates.

FIG. 23 illustrates an example of reproduction of time series data according to the structure of feedback input.

In FIG. 23, three first-storage-circuits are shown in the left side as they are in the FIG. 22A. They are a matrix of 16 rows by 6 columns, 16 rows by 6 columns, and 16 rows by 16 columns, respectively.

As for the unit-storage-circuits, when a unit-storage-circuit is assumed to store a somewhat large number among the data in the matrices, then such a unit-storage-circuit is indicated by symbols like "M", "N", "A", "B", . . . , "H". The other unit-storage-circuits that are assumed to store relatively small number in it are described by a symbol "•".

Above the matrices of first-storage-circuits, pulse-counts per a predetermined time period each of which represent data given by a time series of pulse signals being put in through an activation-signal-input-line are indicated.

"P" and "Q" indicate somewhat large numbers, and "•" denotes a small number.

In this case, inner-product calculated for the detection-line group (DL[2]) becomes higher than that for the other detection-line groups. So that, the output signal of a row DL[2] at step=1 takes a value "1", that means "ignition".

In next, 16 pieces of numbers in the column of the Step=1 are used as feedback data, and the number noted as "Feedback-Input-of-Output-Signal" above the matrices of third first-storage-circuit, System-FB, is updated. This results in an "ignition" of the row of DL[9], because "A" is a large number, and an output signal of Step=2 is generated.

Then, the ignition of the row of DL[9] updates the "Feedback input of the output signal" to have a large number input at 99[9], which results in an "ignition" of the row of DL[14], because "B" is a large number.

Like this way, each column data as shown in the right side is put out from the step=1, one after another.

The sequence is generated, because the third first-storage-circuit, System-FB, stores large numbers at the positions of "M", "N", "A", "B", . . . , "H".

When series of ignitions reach the step=9, the row of DL[2] performs "ignition", again, as in the case at Step=1. Then the situation of Step=1 reappears, and the sequences from Step=1 to Step=9 are replayed again.

In the above case, replaying the sequences from Step=1 to Step=9 is made, because the unit-storage-circuit (55) of "H" stores a large number.

If the value at "H" is small or zero, replaying of ignitions will not be caused at least by the reason of the unit-storage-circuits of "H". Whether to actually perform ignition, and whether to actually replay sequential ignitions depend on the values stored in the unit-storage-circuits of three first-storage-circuits.

Feedback-input-of-output-signals of 99, which are noted above the third first-storage-circuit of FIG. 23, are similar to the output signals of the approximate-search-circuit #7 shown in FIG. 22A; 92[0:(m3−1)]. That is, these conceptual explanations show that outputs of the approximate-search-circuit are able to alter, or progress autonomically, based on the data in the three first-storage-circuits, by having a trigger of the input-signals from the outside; 80[0:5] and 81[0:5] in case of FIG. 22A, and 80[0:(m1−1)] and 81[0:(m2−1)] in case of FIG. 15.

In above expressions, please note that the signals denoted as 90[0:5] and 91[0:5] in FIG. 23 are conceptually exemplifying the signals running through the activation-signal-input-lines driven by the activation-deriving-circuit (155), and that signals denoted as 80[0:5] and 80[0:5] in FIG. 22A are conceptually exemplifying the input-signals to the activation-deriving-circuit (155).

Such an application, in which the signals of 99 or 92[0:(m3−1)] choose a particular sequence of subroutine operations, and progress the sequence of the operations will be described as a twelfth embodiment in the followings.

FIG. 24 is another conceptual diagram for explaining operations of the approximate-search-circuit, which has the same configuration and the stored data as in FIGS. 22A and 23.

DL[0] to DL[15] arranged on the outer circumference is 16 "nodes", which represent detection-line groups denoted in the FIG. 22A and FIG. 23. Each "nodes" puts out an output signal, which corresponds to a 99[j; j=0 to 15] in FIG. 22A to two directions; to the outside of the circumference, and to the dotted-lines running from the "nodes" position into the inside of the circumference.

In this connection, inputs from the outside, 90[0:5] and 91[0:5], are input to each "node" commonly.

Note that the inputs, 90[0:5] and 91[0:5], to each "node" are not different but the same and common, though they are not drawn as being connected to each other.

Each dotted-line or a thick real line connecting two "nodes" inside the circumference indicates the unit-storage-circuits (55) of 16 rows by 16 columns of the third first-storage-circuit [system FB]. Though each of the dotted-lines and thick real lines has directionality, and actually it is needed to be represented by two opposite lines, but each line is represented by only one line to avoid complexity of the illustration.

Thick real lines, which are indicated with "A", "B", . . . , "H" in circles, represent unit-storage-circuits in the third first-storage-circuit [system FB], and are assumed as storing somewhat-large-number in it. Storing somewhat-large-number may generate "ignition" in a destination "node", if "ignition" is brought out in its starting "node".

FIG. 24 is a convenient drawing to understand how a single ignition influences the operations of DL in the third first-storage-circuit denoted as system FB.

The same data configuration and the external inputs as in the case of FIG. 23, is assumed, which bring out the first ignition in the detection-line group of DL[2] at Step-1. That causes second ignition in DL[9] at step-2 because "A" is a large, and that in next may cause third ignition in DL[14] at step-3 because of "B", and that may cause fourth ignition in DL[3] at step-4, . . . , and after possible ignition in DL[15], DL[2] is able to ignite again because of the data in "H", looping sequentially as are the thick real lines of "A", "B", . . . , and "H".

Both two conceptual diagrams in the above show that an approximate-search-circuit is able to operate like an all-to-all-coupled neural-network.

Twelfth Embodiment

FIG. 25 is a schematic block diagram illustrating an autonomous-response-circuit #1 according to a twelfth embodiment. The approximate-search-circuit in the block diagram of FIG. 25 refers to the symbol diagram defined in FIG. 22B.

The autonomous-response-circuit #1 (801) includes an approximate-search-circuit A (701) accompanied with a memory-circuit A (735), a data-processing-circuit (725), a first-compression-circuit (745), and a second-compression-circuit (755).

The approximate-search-circuit is accompanied with a memory-circuit very often to send necessitated data or codes in the next stage circuit, though the approximate-search-circuit is providing the fourth-storage-circuit.

Note that such an accompanied memory may not be needed, if the fourth-storage-circuit has memory capacity enough, but in this case a smaller memory capacity is assumed for the fourth-storage-circuit, and an accompanied memory is provided. In the case of the approximate-search-circuit A (701) applied in large scale circuits which are described in the following, the fourth storage circuit stores address codes for the next stage circuit, the memory-circuit in this case, and the memory-circuit stores necessitated control signal codes.

The approximate-search-circuit A (701) is any of the approximate-search-circuit of #1 to #7 that are the embodiments of the present disclosure, an approximate-search-circuit configured based on the matching-degree-determination-circuit of #1 to #6 that are the embodiments of the present disclosure, or a search-circuit. Which to employ depends on the scale and type of data that the autonomous-response-circuit #1 (801) treats and a demanded accuracy of response.

The memory-circuit A (735) is a kind of memory-circuits such as SRAMs, DRAMs, or Flash-memories, any of which has an ability to receive address-inputs and put out data and which are well-known concepts and well-known techniques.

The data-processing-circuit (725) is a logical circuit based on well-known techniques for data processing, including CPUs, MPUs, PLAs, FPGAs, and ASICs, any of which processes input data in accordance with a program stored in the built-in memory-circuit A and puts out data.

The first-compression-circuit (745) and second-compression-circuit (755) are for encoding input data and generating output data, respectively, and refer to any of the embodiments exemplifying the approximate-search-circuit #1 to approximate-search-circuit #8, an approximate-search-circuit configured based on the embodiments exemplifying the matching-degree-determination-circuit of #1 to #5, a well-known search circuit, or a data compression circuit.

Which to employ depends to the scale and type of data that the autonomous-response-circuit #1 (801) treats and a demanded accuracy of response.

The approximate-search-circuit A (701) mounted in the autonomous-response-circuit #1 (801) receives inputs from three systems.

The input from the first-system is an input-signal (720) which is put out from the first-data-compression-circuit (745). The first-data-compression-circuit (745) receives converted data of the original input-data (710) by an input-signal-conversion-circuit (715), or the original input-data (710), or a mixture of the original input-data (710) and converted data by the input-signal-conversion-circuit (715); FIG. 25 shows the case where the input-signal-conversion-circuit (715) is provided.

The input from the second-system is response-signal-2 (780) which is put out from the second-compression-circuit (755). The second-compression-circuit (755) receives two types of outputs from a data-processing-circuit (725); a data-output (740) and/or a status-signal-output (750).

In most of applications, it is expected that the Status-signal-output (750) provides enough information for the second-compression-circuit operations. FIG. 25 shows the case in which both the output-data (740) and the status-signal (750) are used for generating response-signal-2 (780).

The input of the third system is a control-signal (785) input from the outside.

The control-signal (785) is substantially a control-signal-input (153) from the outside to the approximate-search-circuit A (701), which is shown in FIG. 15, and is a signal to perform data-write/read, setting/reset-operations to the storage-circuits, and to control the counting-circuits provided in the approximate-search-circuit A (701).

Though not illustrated in FIG. 25, in the case where the first-compression-circuit and second-compression-circuit are configured with using any approximate-search-circuit of the present disclosure, a signal from the outside corresponding to the control-signal-input (153) from the outside, or a signal which has a similar function needs to be supplied to the approximate-search-circuit.

The approximate-search-circuit A (701) includes therein at least one or a plurality of first-storage-circuits of the approximate-search-circuit of the present disclosure, and compares a data-group that is a combination of contents generated by the first-data-compression-circuit on the basis of input-information (720) being put in from the outside and contents generated by the second-data-compression-circuit on the basis of a response-signal-2 (780) with each content stored in the approximate-search-circuit A (701), and puts out information indicating which content is the most similar to the data-group, as a response-output (760) to the memory-circuit A (735).

That is, the autonomous-response-circuit #1 (801) carries out an approximate search to find, from the first-storage-circuit provided in the approximate-search-circuit A (701), a past situation that is the most similar to a combination of the input-signal (710) indicating an external situation and the response-signal-2 represented by the output of the time from the autonomous-response-circuit #1 (801), and outputs the past-state that is determined to be the most similar, as a response-output (760) to make an instruction to the data-processing-circuit (725) via the memory-circuit A (735).

For transmitting data or signals from the approximate-search-circuit A (701) to the memory-circuit A (735), the physical-address of a matching-degree-determination-apparatus in the approximate-search-circuit A (701) may be encoded and then given to the memory-circuit A (735). Alternatively, the output-data-storage-circuit (46) may be provided for each matching-degree-determination-apparatus without the need of encoding the physical-addresses of the matching-degree-determination-apparatuses.

Thirteenth Embodiment

FIG. 26 is a schematic block diagram illustrating an autonomous-response-circuit #2 according to a thirteenth embodiment.

The approximate-search-circuits in the block diagram of FIG. 26 refer to the symbol-diagram defined in FIG. 22B.

The autonomous-response-circuit #2 (802) includes a synthesis-circuit (704), an approximate-search-circuit A (701), an approximate-search-circuit B (702), an approximate-search-circuit C (703) and associated memories of A (735), B (736), and C (737).

The approximate-search-circuit A (701), approximate-search-circuit B (702), and approximate-search-circuit C (703) are each any of the approximate-search-circuit #1 to #8 that are the embodiments of the present disclosure, an approximate-search-circuit exemplified in the matching-degree-determination-circuit #1 to #5 that are the embodiments of the present disclosure, a search-circuit, or a content-addressable-memory-circuit. Which to employ depends on the scale and type of data that the autonomous-response-circuit #2 (802) treats and a demanded accuracy of response.

The memory-circuit A (735), memory-circuit B (736), and memory-circuit C (737) are kinds of memory-circuits such as SRAMs, DRAMs, or Flash-memories, any of which has an ability to receive address-inputs and put out data and which are well-known concepts and well-known techniques.

The data-processing-circuits (745, and 755) are logical circuits based on well-known techniques for data processing, including CPUs, MPUs, PLAs, FPGAs, and ASICs, and processes input-data in accordance with a program stored in a built-in memory and outputs output data.

The approximate-search-circuit A (701), approximate-search-circuit B (702), and approximate-search-circuit C (703) each include therein at least one or a plurality of approximate-search-circuits of the present disclosure, and compare a combination of information from the outside with locally stored contents, and put out information indicating which content is the most similar.

The synthesis-circuit (704) in FIG. 26 receives a plurality of inputs, and synthesizes data indicating control-signals for the data-processing-circuit (725). More specifically, such data includes program-initiation-signals and control-code.

Data that Needs to be Written Previously to an Approximate-Search-Circuit and Memory-Circuit The approximate-search-circuit A (701) needs to previously store therein possible combinations of response-signal-2 (780), input-signal (720), and response-output (760). In addition, the accompanied memory-circuit A (735) needs to previously store therein control signal codes or data that need to be sent to the next data synthesis-circuit (704).

The approximate-search-circuit B (702) needs to previously store therein possible combinations of input-signal (720), output of approximate-search-circuit A (701), and responding output (795) that corresponds with the data stored in the accompanied memory-circuit B (736).

The approximate-search-circuit C (703) needs to previously store therein possible combinations of input-signal (720), output of memory-circuit B (738), and responding output (770) named "differential handling control signal" which corresponds with the data or codes stored in the accompanied memory-circuit C (737).

Operation of Autonomous-Response-Circuit #2

By storing setting data in advance is approximate-search-circuits and accompanied memory-circuits, the following operations are performed.

First, at step #1, an approximate search is carried out on the approximate-search-circuit A on the basis of the current-response-signal-2 (780) and the input-signal (720) as external information. Then, corresponding data to the ignited matching-degree-determination-circuit in the approximate-search-circuit A is put out, which is converted by the memory-circuit A (735) and goes to the synthesis circuit (704).

At step #2, performed operations in the approximate-search-circuit B (702) and memory-circuit B (736) put out an output of memory-circuit B (738) as an input-signal at the next step to the approximate-search-circuit C (703) being based on past combinations of input-signal (720) and response-output (760).

At step #3, the approximate-search-circuit C (703) and memory-circuit C (737) obtain and analyze a differential between the output of memory-circuit B (738) which put out an expected value at the next step and the actual input-signal (720), and generate the output of memory-circuit C as a differential handling control information, accordingly.

At step #4, the synthesis-circuit (704) synthesizes the control-signal that needs to be sent to the data-processing-circuit (725), detected by the approximate-search-circuit A (701), and the differential-handling-control-signal (770) determined by the approximate-search-circuit C (703) to thereby obtain a control-signal-input to be sent to the data-processing-circuit (725).

Abstracted Model of Approximate-Search-Circuit-Complex

FIG. 27A illustrates a simplified block diagram representing an abstracted model that will be used in describing an approximate-search-circuit-complex as an embodiment of the present disclosure. FIG. 27A illustrates the case where there are two system inputs; inputs for system-A and inputs for system-B. A symbol diagram corresponding to the block diagram is illustrated in FIG. 27B.

The approximate-search-circuit-complex is formed of connecting many approximate-search-circuits with multiple signal buses and additional controlling circuits. As an example, a ring-formed bus-connected expansion method will be described. To form the approximate-search-circuit-complex, a great number of circuit blocks are to be combined and wired.

Using this method, how to expand an approximate-search-circuit in an embodiment of the present disclosure and a maintenance operation of stored data in the expanded approximate-search-circuit, which are about the approximate-search-circuit-complex, will be described, as well.

The simplified block diagram, an abstracted model, and symbol diagram of FIG. 27A and FIG. 27B will be used, both of which represent the configuration of an approximate-search-circuit with input-signals of two systems illustrated in FIGS. 22A and 22B, and also include the configuration of the approximate-search-circuit #7 of FIG. 15 with the fourth-storage-circuit (47).

A feedback-storage-circuit (System-FB) in the model of FIG. 27A corresponds to the third-storage-circuit (45) and first-storage-circuit-c (40[2]) of FIG. 15.

The function of the approximate-search-circuit #4 (14) of FIG. 15 corresponds to that of the vertically-output-detection-circuit (534) of FIG. 27A and FIG. 27B.

In the case where the operational mode is counting-mode, signals for approximate search are input from input-signal (system-A) and input-signal (system-B), and an ignition-signal as a result of the approximate search is output from the output-signal (99) of approximate-search-circuit, a word in the fourth-storage-circuit (47) is selected on the basis of the signal, and a read output of the word is put out as an output-signal (580).

Signals conveying these input-signal (system-A), input-signal (system-B), and output-signal (580) that are valid in the counting-mode are connected to an approximate-search-buses (891), which are going to be referred in FIG. 28, FIG. 29A, FIG. 29B.

In the maintenance-mode, the read operation to stored data or write operation to a storage circuit corresponding to each signal is performed via the read/write-signal (system-A: 821), read/write-signal (system-B: 822), signal-for-second-storage-circuit (210), read/write-signal (system-FB: 831), or read/write-signal (841) for fourth-storage-circuit on the basis of an address-selection-signal (811).

Signals conveying these address-selection-signal (811), read/write-signal (system-A: 821), read/write-signal (system-B: 822), signal-for-second-storage-circuit (210), read/write-signal (system-FB: 831), and read/write-signal-for-fourth-storage-circuit (841) that are valid in the maintenance-mode are connected to a maintenance-bus (892), which are going to be referred in FIG. 28, FIG. 29A, FIG. 29B.

The operational mode and the read/write operations are controlled by the control-circuit (120), and a control-signal (153) is input to the control-circuit for the control.

As described above, different input/output signals of different systems are used for operations in the counting-mode and operations in the maintenance-mode.

Fourteenth Embodiment

FIGS. 28, 29A, and 29B illustrate the way to connect multiple "s" sets of approximate-search-circuits to form the approximate-search-circuit-complex by using the symbol diagram represented in FIG. 27B. Here, "s" is an integer bigger than or equal to 2.

To have such expansion, additional controlling circuits and memories are needed, those of which have to be connected to the multiple approximate-search-circuits by providing a common bus connection technology between all of them.

Whole feature of the approximate-search-circuit-complex is illustrated in FIG. 29B, and also, that is an example of block diagrams for describing the outline of an autonomous-response-circuit #3 according to a fourteenth embodiment of the present disclosure.

The autonomous-response-circuit #3 further includes a data-processing-circuit (725) in FIG. 29B that is provided with an ability to process required operations for counting-mode, the maintenance-mode, and the setting-mode, a CPU (871) and a backup-memory (872) in FIG. 28 that mainly performs maintenance-mode operations on each storage circuit in the autonomous-response-circuit #3 (803).

The autonomous-response-circuit #3 includes cascaded-connection-of-approximate-search-circuits (880) consisting of "s" sets of approximate-search-circuits in FIGS. 28, as its core circuit.

In the maintenance-mode, each of read/write-signals for System A, B, FB, and for fourth-storage-circuit of the approximate-search-circuits in FIG. 27A are transferred through the maintenance-bus (892).

The maintenance operations are instructed by CPU (871) in FIG. 28. Data in each of the storage-circuits in each approximate-search-circuit [0:(S−1]] is read to the backup-memory (872), the association between the physical-address and data is optimized by CPU (871), and then the data is written back to the storage-circuits of the approximate-search-circuits.

The backup-memory (872) and CPU (871) are components in the CPU-Backup-memory-synthesis-I/O-circuit (881), in FIG. 29B.

In the counting-mode, the data-processing-circuit (725) in FIG. 29B sends search-data to each approximate-search-circuit [0: (S−1)] through the approximate-search-bus (891) and receives "ignition" information therefrom. In the case where a plurality of ignition information is returned, the earliest response is recognized as having the highest degree of similarity.

Connection Method Between Approximate-Search-Circuit and Buses

FIGS. 29A and 29B illustrate the connections between the approximate-search-circuits by the maintenance-bus and the approximate-search-bus. FIG. 29A shows only how an appropriate-search-circuit is connected to the approximate-search-bus and the maintenance-bus, but FIG. 29B shows total feature of the autonomous-response-circuit (803).

Through registers and FIFOs, each approximate-search-circuit is connected and puts out data to the maintenance-bus during maintenance mode, and each approximate-search-circuit is connected and puts out data to the approximate-search-bus during counting mode. Please note that FIFOs are not illustrated in FIG. 29B, and both FIFOs and resistors are not illustrated in FIG. 28, for simplifying the illustrations.

The maintenance-bus and approximate-search-bus both form a ring-bus that transfers data only in one direction, which enables registers to operate at high speed.

Fifteenth Embodiment

FIG. 30 illustrates an example of schematically illustrated algorithms, which define the operation of autonomous-response-circuit #3 according to the fifteenth embodiment.

In counting mode, by having each connection as like the cascaded connection of approximate search circuits to the maintenance-bus and approximate-search-bus as in FIG. 28, FIG. 29A, FIG. 29B, it is possible for each approximate-search-circuit to send data about an ignition and data about a destination-addresses, both of which are stored in its fourth-storage-circuit and sent them to the resister-circuit (882), via FIFO (883).

Then, the resister-circuit (882) chooses one or both of the data from the approximate-search-circuit and the data from the approximate-search-bus and transfers them to the next register-circuit (882).

Therefore, each data from the approximate-search-circuits goes to another approximate-search-circuit autonomously, according to the destination address designated by the fourth-storage-circuit of the source side approximate-search-circuit.

In FIG. 30, the symbol diagram defined in FIG. 22B is used for representing each approximate-search-circuit.

FIG. 30 exemplifies operations of the autonomous-response-circuit #3 according to the fifteenth embodiment, which is performed as follows.

Each input-data, 710[0:(b−1)], is converted to an internal data format by an input-signal-conversion-circuit, 715[0:(b−1)], and is encoded by each first-data-compression-circuit, 745[0:(b−1)], and goes to the approximate-search-circuit A (701), approximate-search-circuit B (702), and approximate-search-circuit C (703).

These operations correspond to operations in which data from the data-processing-circuit (725) is put into the approximate-search-circuit A/B/C (701, 702, 703), after having a conversion and encoding operations during passing through the CPU-Backup-memory-synthesis-I/O-circuit (881) and through the ring-bus.

When the memory-circuit A or B or C (735, 736, 737) receives a read instruction code with a particular address, the memory-circuit puts out next data to the next node of the approximate-search-circuit A or B or C (701, 702, 703). The input data includes the destination addresses of the next node and information related to the next operations. And, the destination addresses include the node address of next approximate-search-circuit A or B or C or the node address of the CPU-Backup-memory-synthesis-I/O-circuit (881).

When the CPU-backup-memory-synthesis-and-I/O-circuit determines that the approximate search is completed, and the result from the approximate-search-circuit is sent to the data-processing-circuit (725).

The present disclosure provides very different features from conventional electronic circuit techniques, in that data is sent to a memory-matrix in the form of time series of pulse-signals and the memory-matrix is used as a data-conversion-circuit. Therefore, for practical use, some related techniques need to be established.

The serial communication has an advantage of a fewer number of interconnections between circuits. However, the latency for data transmission increases, so that there is a disadvantage of delay in the entire processing speed of circuits.

The disclosed techniques have disadvantages in terms of latency and processing speed since data is sent in the form of time series of pulse-signals. However, the disadvantages are compensated by through parallelism in which inner-products between stored data and input data are calculated in highly parallel fashion in a memory chip and integration of storage circuit and computing circuit. By doing so, the advantages take precedence over the disadvantages. It is a matter of course that the balance between the advantages and disadvantages depends on application. In applications that always uses every stored data, like artificial intelligence, such advantages are considered very appealing.

Conventionally, in electronic circuits, logical cause and effect relationship between input data and output data is very clear. However, the approximate search of the present disclosure, which may be considered as approximate data processing, is fundamentally challenging in the industry-based cultural aspect. In view of this, some related techniques need to be established. Thus, there might be a wall for conservative applications.

However, electronic circuits are always challenging for the abilities of human brains. In addition, considering the situations that stochastic processing is more often used in many applications that are recently making a remarkable development and that there are more cases that demand indefinite prediction and assumptions, the challenging for the implementation of the present disclosure is a hurdle that is unavoidable and needs to get over for future development and deepening of the overall electronic circuit technology.

The disclosed techniques are on the path to future electronic circuit technology.

The present disclosure provides a breakthrough for the developing electronic circuit suitable for approximate search. The technique of quantifying the definition of a degree of similarity and detecting content that has the highest degree of similarity to input information input from the outside, from registered information is a technique needed for searching for information that is approximate and probable using the degree of similarity and making stochastically correct determination, and has a very high impact on data processing hardware in the future.

For the first-storage-circuit in the drawings, there are a variety of currently recognizable cases. An activation-signal is sent as an input-signal from the outside to the memory-cell array of the first-storage-circuit, and "ignition" is performed in decreasing order of degree of similarity, staring with ignition for the most similar data among the registered data. A response program is initiated according to the "ignition" pattern.

The disclosed techniques are expected to be applicable for apparatuses that autonomously recognize a situation and make a response, like the human brain.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

The invention claimed is:

1. An approximate search circuit comprising:
a plurality of matching degree determination circuits, wherein each of the matching degree determination circuits includes,
   a first storage circuit including a plurality of memory cells arranged in a matrix with at least m columns by k rows, where m is an integer of two or greater and k is an integer of two or greater,
   m or m pairs of activation signal input lines for carrying pulse signals from the outside to the memory cells,
   k detection lines that conduct the signals from the memory cells to a following counting circuit, when any of the memory cells generates current as a signal,
   the counting circuit that has a plurality of multiplying circuits each of which makes a product operation of the number of signals that conducted through the detection line by a predetermined weight coefficient for the detection line, and an adding-up circuit of accumulating the results of all the product operations in the counting circuit,
   a second storage circuit that stores therein a threshold value for use in evaluating an output of the counting circuit, and
   a determination circuit that evaluates the output of the counting circuit by comparing with the threshold value, wherein
   when the determination circuit in a predetermined time period receives the output of the counting circuit which indicate the output of the counting circuit exceeded the threshold value, the determination circuit puts out an ignition signal as an output of the matching degree determination circuit,
   each of the matching degree determination circuits shares the activation signal input lines commonly as their input connections, and
   the approximate search circuit puts out,
      information indicating which of the matching degree determination circuits has exceeded the threshold value stored in the second storage circuit, or
      information indicating which of the matching degree determination circuits has most similar data to data delivered by the signals sent through the activation signal input lines.

2. The approximate search circuit according to claim 1, wherein each of the matching degree determination circuits further includes an output data storage circuit, wherein
   when the determination circuit puts out the ignition signal, stored data of the output data storage circuit is put out as an output of the matching degree determination circuit.

3. The approximate search circuit according to claim 1, further comprising:
   a vertically-connected output detection circuit; and
   a control circuit, wherein when the vertically-connected output detection circuit detects that any of the matching degree determination circuits has put out the ignition signal, the control circuit resets the count value of the counting circuit in the matching degree determination circuit or reduces the count value by a predetermined amount.

4. The approximate search circuit according to claim 1, further comprising:
   timer circuit; and
   a control circuit, wherein
   when the timer circuit puts out a signal indicating that the approximate search circuit has operated for a predetermined time period, the control circuit resets the count value of the counting circuit in the matching degree determination circuit or reduces the count value by a predetermined amount.

5. The approximate search circuit according to claim 1, wherein an initial value of the counting circuit is controlled by data generated in the second storage circuit.

6. The approximate search circuit according to claim 1, further comprising:
   a pulse generation circuit for each of the matching degree determination circuits, wherein
   when the determination circuit of any of the matching degree determination circuits puts out an ignition signal, the pulse generation circuit generates and puts out a pulse signal as an output of the matching degree determination circuit, in place of the ignition signal.

7. The approximate search circuit according to claim 1, further comprising a pulse generation circuit for each of the matching degree determination circuits, wherein
   the pulse generation circuit generates pulse signals so that the number of the pulse signals has a meaning of the stored value in the second storage circuit when the determination circuit of any of the matching degree determination circuits puts out an ignition signal, and puts out the generated pulse signals as the outputs of the approximate search circuit.

8. The approximate search circuit according to claim 1, further comprising:
   a pulse generation circuit for each of the matching degree determination circuits to generate pulse signals so that the number of the pulse signals has a meaning of the stored value in the second storage circuit;
   a vertically-connected output detection circuit; and
   a control circuit, wherein
   when the vertically-connected output detection circuit detects that any of the matching degree determination circuits has put out an ignition signal which asserts similarity of the circuit has exceeded the threshold value of the circuit, the control circuit reduces the count value of the counting circuit in the matching degree determination circuit by a predetermined amount, and the pulse generation circuit puts out the number of the pulse signals that have a meaning of the stored value stored in the second storage circuit.

9. The approximate search circuit according to claim 1, further comprising an activation line signal generation circuit that has a plurality of input signals from the outside, and generates time series pulse signals to each of m or m pairs of the activation signal input lines so that each pulse does not overlap each other.

10. The approximate search circuit according to claim 1, further comprising:
    a control circuit that has a function of switching an operational mode of each of the matching degree determination circuits among a setting mode, a counting mode, and a read/write mode according to a control signal input from the outside, wherein
    in the setting mode, pulse signals passing through the activation signal input lines are sequentially applied to the first storage circuit, the number of memory cells which store a value "1" or a value "0" in the first-storage-circuit is counted based on the number of pulse signals passing through the detection lines by the counting circuit, and a value generated based on the counting circuit is written in the second memory circuit, in the counting mode, pulse signals passing through the activation signal input lines are sequentially applied to the first storage circuit, and the number of pulse signals passing through the detection lines is counted by the counting circuit, and a value generated based on the count value is compared with the value sent from the second memory circuit by the determination circuit, then the ignition signal is put out from the determination circuit when the input data to the first storage circuit through the activation signal input lines are similar enough to stored data in the first storage circuit, and in the read/write mode, read or write operations are performed on the memory cells in the first storage circuit and/or the second storage circuit.

11. The approximate search circuit according to claim 10, wherein each of the counting circuits is provided with a shift register circuit or a counter circuit therein, and in the setting mode, according to the control signals from the control circuit, the shift register circuit or the counter circuit first resets its own value to a predetermined reset value, then that is made to operate to count the number of memory cells with a value "1" or a value "0" in the first storage circuit based on the number of pulse signals being passed through the detection lines by the counting circuit, and a value generated based on the counted number of the cells is written in the second memory circuit, and in the counting mode, according to the control signals from the control circuit, a value generated based on data stored in the second-storage-circuit is first written in the shift register circuit or the counter circuit, and the counting circuit is made to operate to count in the decreasing order or the increasing order, whichever is opposite to that in the setting mode.

12. The approximate search circuit according to claim 1, wherein the matching degree determination circuits further comprises:

a third storage circuit including a plurality of second activation signal lines, a plurality of second detection lines, and a plurality of unit storage circuits, a plurality of detection line current read circuits, and an activation line driving circuit for driving the second activation signal lines, wherein when counting the number of pulses from the detection lines generated based on data of the memory cells in the first storage circuit and signals through the activation signal input lines, the counting circuit uses signals generated by the corresponding detection line current read circuit whose reference current is given through the corresponding second detection line generated based on the data of the memory cells in the second storage circuits and signals through the second activation signal lines.

13. The approximate search circuit according to claim 1, wherein each matching degree determination circuit further comprises a second detection line read circuit paired with the detection line current read circuits, and a second counting circuit, the counting circuit counts the number of pulses transmitted through the detection lines which are generated by the data of the memory cells in the first storage circuit and signals through the activation signal input lines, the second counting circuit former circuit counts the number of pulses transmitted through the second detection lines which are generated by the data of the memory cells in the second storage circuit and signals through the second activation signal lines, and each of the matching degree determination circuits uses a difference between an accumulated value of the counting circuit and an accumulated value of the second counting circuit former circuit, as input values to the shift register circuit or input values to the counter circuit.

14. The approximate search circuit according to claim 1, further comprising a physical address encoder circuit, wherein when any of the matching degree determination circuits puts out a signal indicating a similarity degree exceeds the threshold value, the physical address encoder circuit puts out the physical address of the matching degree determination circuit.

15. The approximate search circuit according to claim 1, further comprising:

a plurality of the search circuits, wherein the approximate search circuits are connected each other in series in such a manner that a part or whole of the outputs of one approximate search circuit are connected to a part or whole of the inputs of another approximate search circuit.

16. The approximate search circuit according to claim 11, wherein the reset value is all zeros or all ones in binary number.

17. The approximate search circuit according to claim 10, wherein the setting-mode is activated in a predetermined time period.

18. The approximate search circuit according to claim 1, wherein each of the matching degree detection circuits further comprises a storage circuit having at least one bit to memorize information for null setting, wherein when there is a matching degree detection circuit which need not be used, the at least one bit in the storage circuit is set to forcibly deactivate the matching degree detection circuit or forcibly stop the matching degree detection circuit in order not to put out the ignition signal.

19. A data-processing-circuit for controlling operation of a program with the approximate search circuit of claim 1.

* * * * *